(12) United States Patent
Matsunaga

(10) Patent No.: US 7,566,926 B2
(45) Date of Patent: Jul. 28, 2009

(54) NONVOLATILE SEMICONDUCTOR MEMORY

(75) Inventor: Yasuhiko Matsunaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 11/454,990

(22) Filed: Jun. 19, 2006

(65) Prior Publication Data

US 2007/0040210 A1     Feb. 22, 2007

(30) Foreign Application Priority Data

Jun. 24, 2005     (JP) ............................. 2005-185616

(51) Int. Cl.
*H01L 27/108*     (2006.01)
(52) U.S. Cl. ...................... 257/298; 438/257
(58) Field of Classification Search .................. 257/298, 257/E21.662, E21.679
See application file for complete search history.

(56) References Cited

U.S. PATENT DOCUMENTS

| | | | |
|---|---|---|---|
| 7,268,401 B2* | 9/2007 | Shukuri et al. | 257/392 |
| 7,390,718 B2* | 6/2008 | Roizin et al. | 438/275 |
| 2003/0020119 A1 | 1/2003 | Arai et al. | |
| 2004/0061169 A1 | 4/2004 | Leam et al. | |
| 2004/0140510 A1 | 7/2004 | Hazama | |
| 2004/0212019 A1* | 10/2004 | Shinohara et al. | 257/368 |
| 2005/0082602 A1 | 4/2005 | Okajima | |
| 2005/0083744 A1 | 4/2005 | Arai et al. | |
| 2005/0093047 A1* | 5/2005 | Goda et al. | 257/300 |
| 2005/0093079 A1* | 5/2005 | Lee et al. | 257/390 |
| 2005/0224864 A1 | 10/2005 | Hashimoto et al. | |
| 2006/0017092 A1* | 1/2006 | Dong et al. | 257/314 |
| 2006/0091470 A1* | 5/2006 | Noguchi et al. | 257/369 |
| 2006/0134864 A1* | 6/2006 | Higashitani et al. | 438/257 |
| 2006/0160311 A1* | 7/2006 | Rao et al. | 438/275 |
| 2006/0228860 A1* | 10/2006 | Shinohara et al. | 438/257 |
| 2007/0040210 A1 | 2/2007 | Matsunaga | |
| 2007/0109848 A1 | 5/2007 | Sugimae et al. | |
| 2007/0290275 A1* | 12/2007 | Shukuri et al. | 257/392 |

FOREIGN PATENT DOCUMENTS

JP     2002-246486     8/2002

(Continued)

*Primary Examiner*—Thao P. Le
(74) *Attorney, Agent, or Firm*—Oblon, Spivak, McClelland, Maier & Neustadt, P.C.

(57) ABSTRACT

The present invention provides a nonvolatile semiconductor memory that allows simultaneous implementation of high performance transistors in a low-voltage circuit region and transistors with high withstand voltages in a high-voltage circuit region. The nonvolatile semiconductor memory includes a cell array region that comprises aligned memory cell transistors, each including a control gate electrode, which includes a metal silicide film, an inter-gate insulating film below the control gate electrode, a floating gate electrode below the inter-gate insulating film, and a tunnel insulating film under the floating gate electrode; a high-voltage circuit region arranged in a periphery of the cell array region and including a high voltage transistor, which includes a first gate insulating film thicker than the tunnel insulating film; and a low-voltage circuit region that is arranged in a different position than the high-voltage circuit region arranged in the periphery of the cell array region and that includes a low-voltage transistor, which includes a gate electrode and a second gate insulating film thinner than the first gate insulating film below the gate electrode.

13 Claims, 62 Drawing Sheets

| | FOREIGN PATENT DOCUMENTS | |
|---|---|---|
| JP | 2003-37251 | 2/2003 |
| JP | 2004-128505 | 4/2004 |
| JP | 2004-158626 | 6/2004 |
| JP | 2005-116970 | 4/2005 |
| JP | 2005-123524 | 5/2005 |
| JP | 2005-197308 | 7/2005 |
| WO | WO 2004/084314 A1 | 9/2004 |

* cited by examiner

NONVOLATILE SEMICONDUCTOR MEMORY

CROSS REFERENCE TO RELATED APPLICATIONS AND INCORPORATION BY REFERENCE

This application is based upon and claims the benefit of priority from prior Japanese Patent Application P2005-185616 filed on Jun. 24, 2005; the entire contents of which are incorporated by reference herein.

BACKGROUND OF THE INVENTION

1. Field of the Invention

The present invention relates to nonvolatile semiconductor memory and a fabrication method for the same. More specifically, it relates to a nonvolatile semiconductor memory used for a flash memory and a fabrication method for the same.

2. Description of the Related Art

An electronically erasable programmable read-only memory (EEPROM), for example, is well-known as a conventional nonvolatile semiconductor memory. In an EEPROM, particularly in the case of a NAND type, memory cells are deployed at respective intersections where word lines extending in a row and bit lines extending in a column cross each other, constituting a memory cell array. A MOS transistor having a stacked gate structure made up of a stacked floating gate electrode and a control gate electrode is typically used as the memory cell.

NAND flash memory is structured to include multiple memory cell transistors, which are connected in series to form a NAND string, and select transistors deployed on the respective sides of that NAND string. In addition, element isolation regions are arranged parallel to active regions of the memory cells, constituting a memory cell array. The gate length of the select transistors is typically longer than that of the memory cell transistors. This structure impairs cutoff characteristics of the transistors due to a short channel effect. Furthermore, the select transistors are typically constituted by enhancement mode MOS transistors.

A nonvolatile semiconductor memory, which uses memory transistors and memory cells made up of two select transistors and which is structured with the memory cell transistors and the select transistors differing in gate insulating film thickness has been disclosed (see Japanese Patent Application Laid-open No. 2000-269361).

In addition, a structure where a gate insulating film of a selection MOS transistor formed of a gate electrode and that of a MOS transistor of a peripheral circuit, respectively differing in thickness, has also been disclosed (see Japanese Patent Application Laid-open No. Hei 04-165670).

Furthermore, a nonvolatile semiconductor memory including low resistance peripheral transistors and reduced cell size areas, in which a metal silicide layer is formed on the diffusion layers of the memory cell transistors and the peripheral transistors, and in which the gate electrodes of the peripheral transistors and the memory cell transistors have a self-aligned contact structure, has been proposed (see Japanese Patent Application Laid-open No. 2002-217319).

A conventional nonvolatile semiconductor memory, such as flash EEPROM, requires a high-voltage circuit region for supplying high-voltage pulses such as a write-in voltage, an intermediate voltage, or an erase voltage to a cell array region. A low-voltage circuit region requiring normal low-voltage and high-speed performance is also needed.

In the low-voltage circuit region, it is preferable to use transistors having improved transistor drive capability and higher-speed performance due to that capability. Particularly, providing transistor driving capability in the low-voltage circuit region of the flash EEPROM, capable of low power supply voltage operation, is an objective to be attained.

SUMMARY OF THE INVENTION

An aspect of the present invention inheres in a nonvolatile semiconductor memory comprising a cell array region that includes aligned memory cell transistors, each including a control gate electrode. The control gate electrode includes a first metal silicide film, an inter-gate insulating film under the control gate electrode, a floating gate electrode under the inter-gate insulating film, and a tunnel insulating film under the floating gate electrode. A high-voltage circuit region is arranged in a periphery of the cell array region and includes a high voltage transistor, which includes a gate electrode and a first gate insulating film, thicker than the tunnel insulating film, below the gate electrode. A low-voltage circuit region is arranged in a different position than the high-voltage circuit region arranged in the periphery of the cell array region and includes a low-voltage transistor, which includes a gate electrode and a second gate insulating film, thinner than the first gate insulating film, below the gate electrode. A tunnel insulating film is directly provided on source regions and drain regions of the respective memory cell transistors, and a liner insulating film is directly provided on source regions and drain regions of the high-voltage transistors and the low-voltage transistors.

Another aspect of the present invention inheres in a fabrication method for a nonvolatile semiconductor memory, which includes a cell array region, a high-voltage circuit region, and a low-voltage circuit region. The fabrication method comprises depositing a tunnel insulating film on a semiconductor substrate, a floating gate electrode layer on the tunnel insulating film, and a stopper film on the floating gate electrode layer; forming a device isolating region on the semiconductor substrate and removing the stopper film; depositing an inter-gate insulating film on the entirety of the semiconductor substrate, removing the floating gate electrode layer, the inter-gate insulating film, and the tunnel insulating film from the low-voltage circuit region and the high-voltage circuit region, and forming a first gate insulating film only in the high-voltage circuit region and a second gate insulating film, which is thinner than the first gate insulating film, only in the low-voltage circuit region; depositing a first gate electrode layer across the entirety of the semiconductor substrate, a second gate electrode layer on the first gate electrode layer, and a masking material on the second gate electrode layer; forming gate electrodes of low-voltage transistors in the low-voltage circuit region, forming gate electrodes of high-voltage transistors in the high-voltage circuit region, and forming select gate electrodes, each constructed by a floating gate electrode layer and a control gate electrode layer electrically connected to each other, and memory cells, each including the floating gate electrode layer and the control gate electrode layer being adjacent to one another via the inter-gate insulating film; and depositing an inter-gate embedding insulator film across the entirety of the semiconductor substrate, and embedding the inter-gate embedding insulator film between control gate electrode layers of the memory cells, and forming etched back gate sidewall insulating films on sidewalls of the gate electrodes of the low-voltage transistors and the gate electrodes of the high-voltage transistors and sidewalls of the select gate electrodes.

BRIEF DESCRIPTION OF THE DRAWINGS

FIG. 8D is a process cross-section of elements in the cell array region fabricated in a processing step of the nonvolatile semiconductor memory fabrication method, according to the first embodiment of the present invention, subsequent to that shown in FIG. 7D;

FIG. 38A is a process cross-section of elements in the low-voltage circuit region fabricated in a processing step of the nonvolatile semiconductor memory fabrication method, according to the third embodiment of the present invention, subsequent to that shown in FIG. 37A;

FIG. 38B is a process cross-section of elements in the high-voltage circuit region fabricated in a processing step of the nonvolatile semiconductor memory fabrication method, according to the third embodiment of the present invention, subsequent to that shown in FIG. 37B;

FIG. 38C is a process cross-section of elements in the cell array region fabricated in a processing step of the nonvolatile semiconductor memory fabrication method, according to the third embodiment of the present invention, subsequent to that shown in FIG. 37C;

FIG. 39A is a schematic cross-section of elements in a low-voltage circuit region of a nonvolatile semiconductor memory, according to a fourth embodiment of the present invention;

FIG. 39B is a schematic cross-section of elements in a high-voltage circuit region of the nonvolatile semiconductor memory, according to the fourth embodiment of the present invention;

Figure 15A:
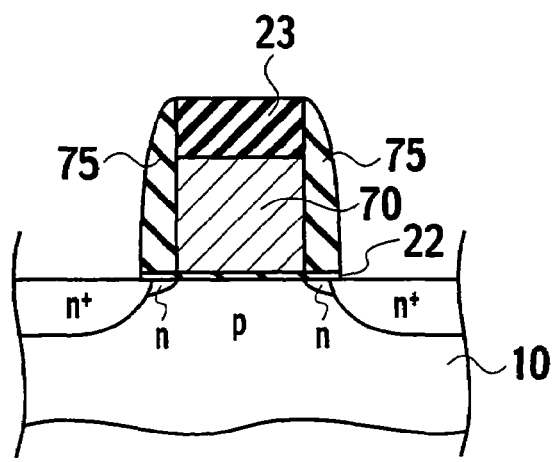
FIG. 15A is a process cross-section of elements in the low-voltage circuit region fabricated in a processing step of the nonvolatile semiconductor memory fabrication method, according to the first embodiment of the present invention, subsequent to that shown in FIG. 14A.
Figure 15B:
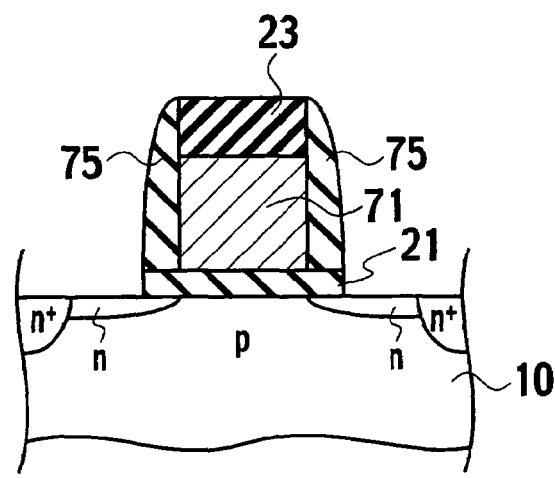
FIG. 15B is a process cross-section of elements in the high-voltage circuit region fabricated in a processing step of the nonvolatile semiconductor memory fabrication method, according to the first embodiment of the present invention, subsequent to that shown in FIG. 14B.
Figure 15C:
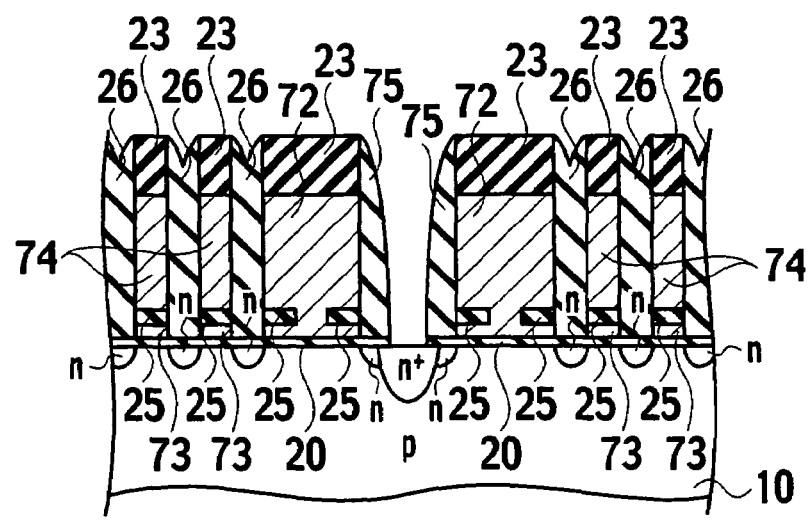
FIG. 15C is a process cross-section of elements in the cell array region fabricated in a processing step of the nonvolatile semiconductor memory fabrication method, according to the first embodiment of the present invention, subsequent to that shown in FIG. 14C.
Figure 39A:
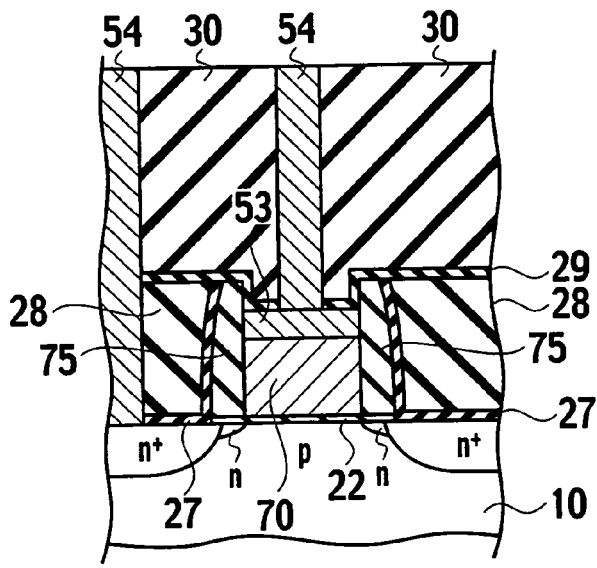
Figure 39B:
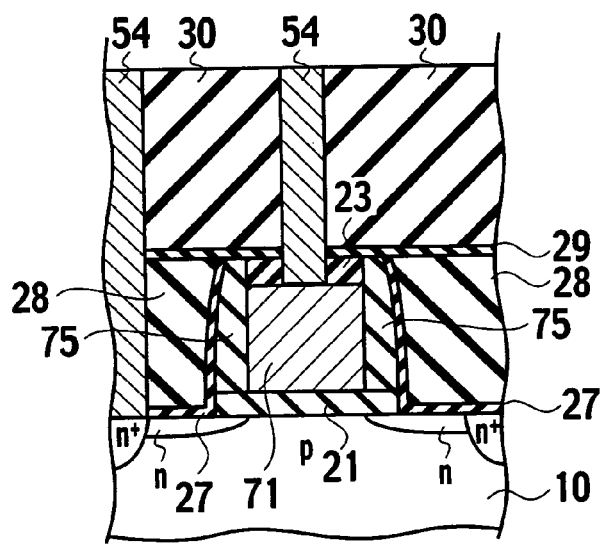
Figure 39C:
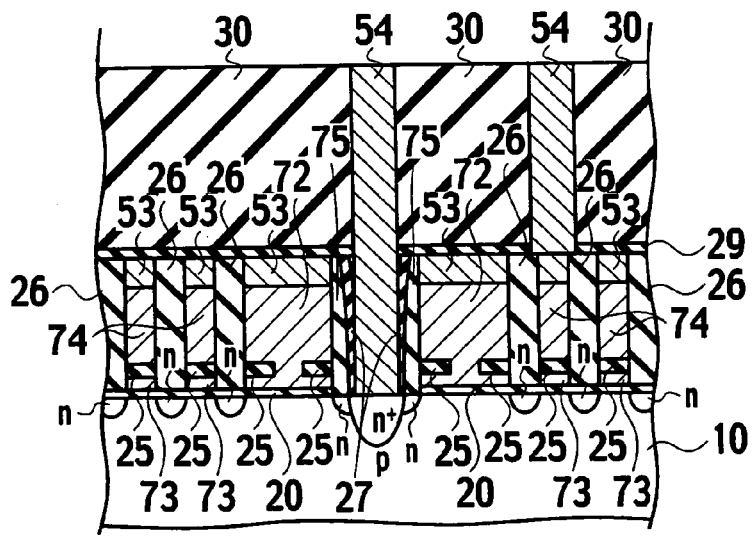
Figure 40A:
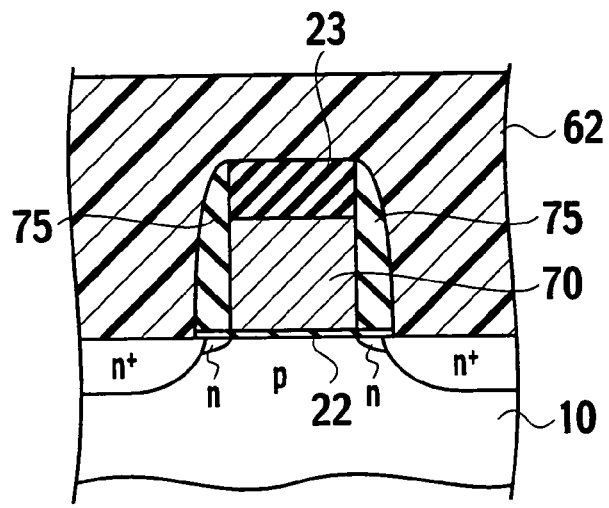
Figure 40B:
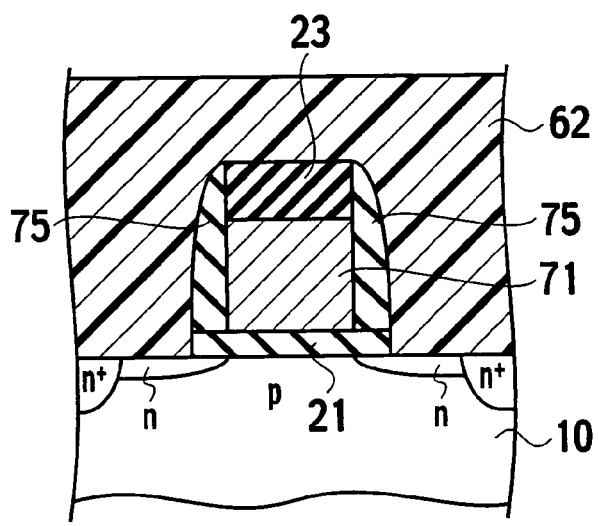
Figure 40C:
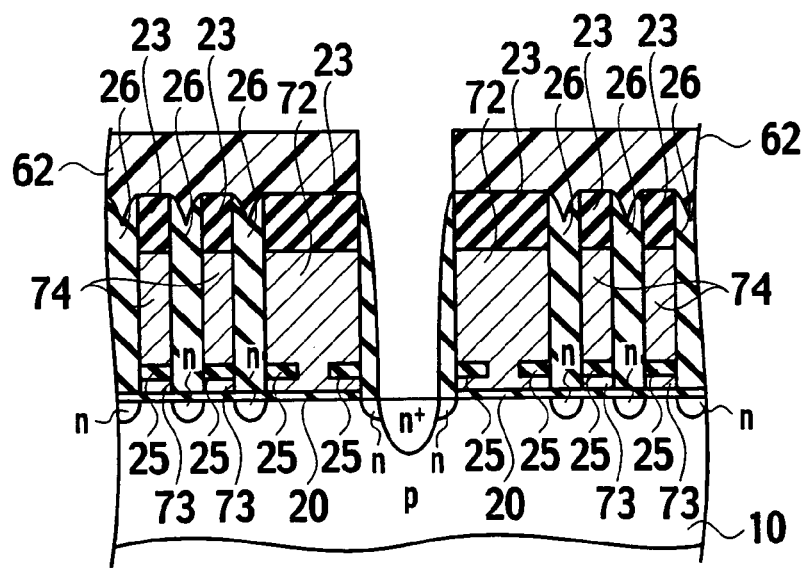
Figure 41A:
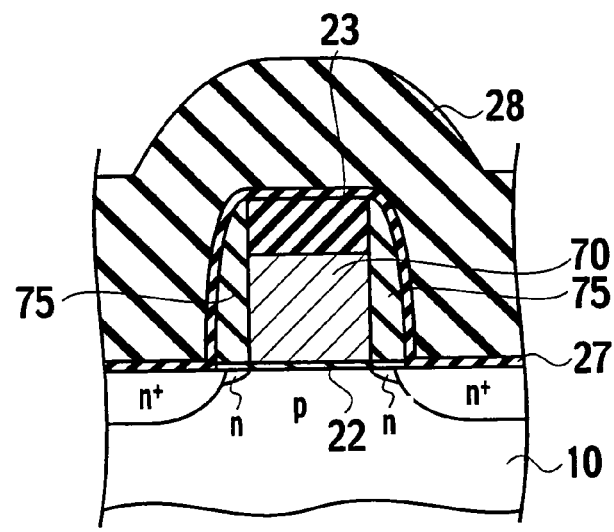
Figure 41B:
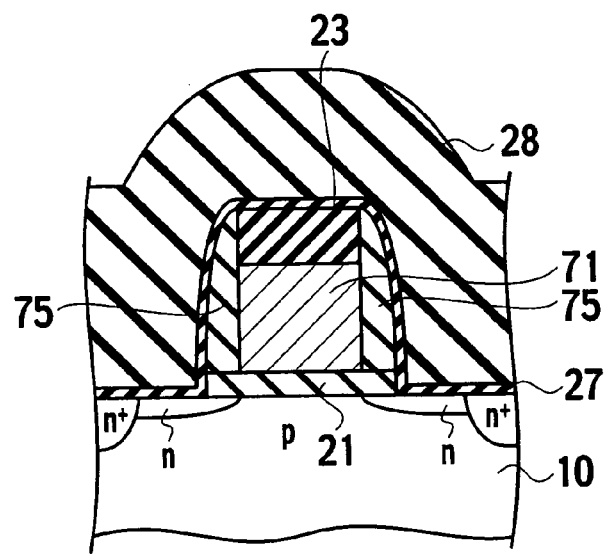
Figure 41C:
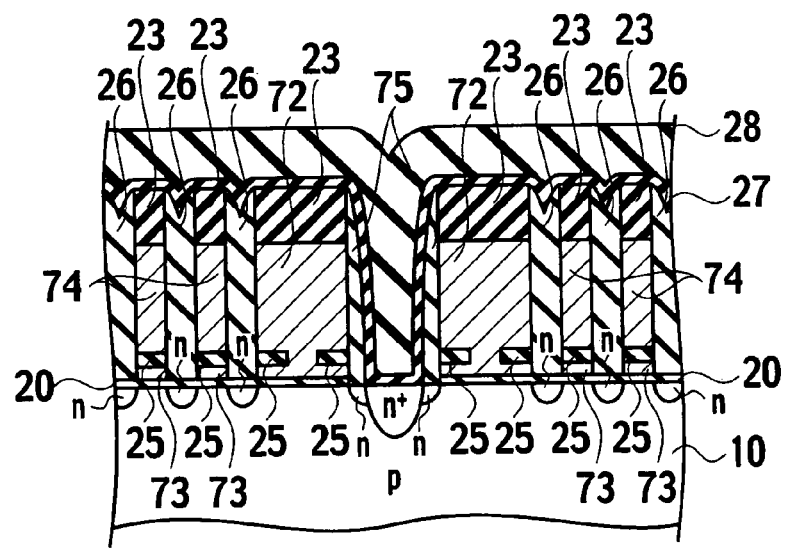
Figure 42A:
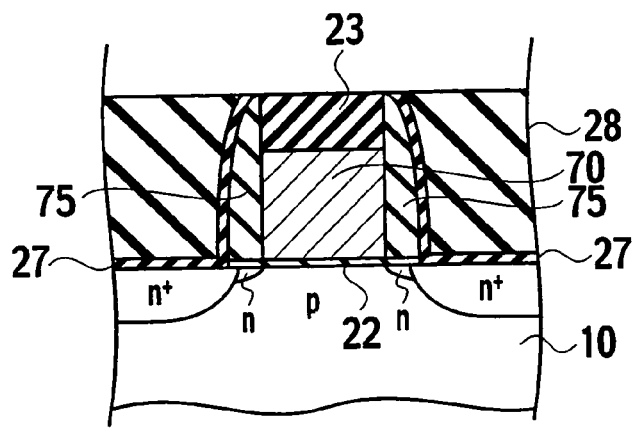
Figure 42B:
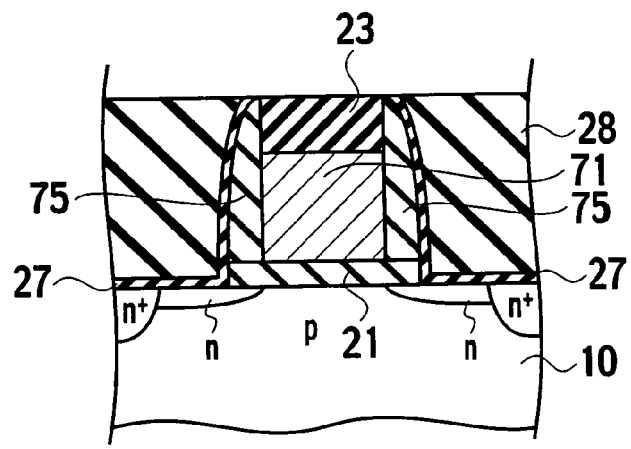
Figure 42C:
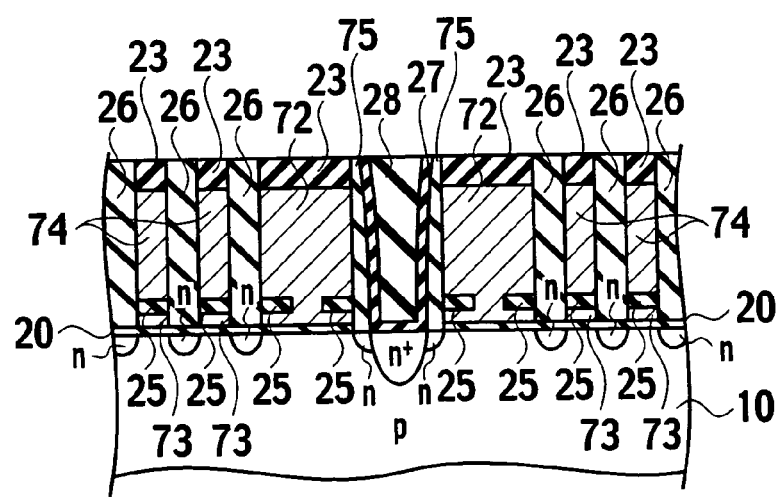
Figure 43A:
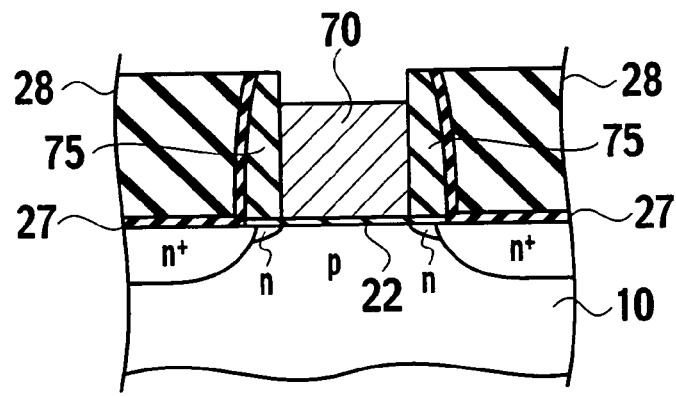
Figure 43B:
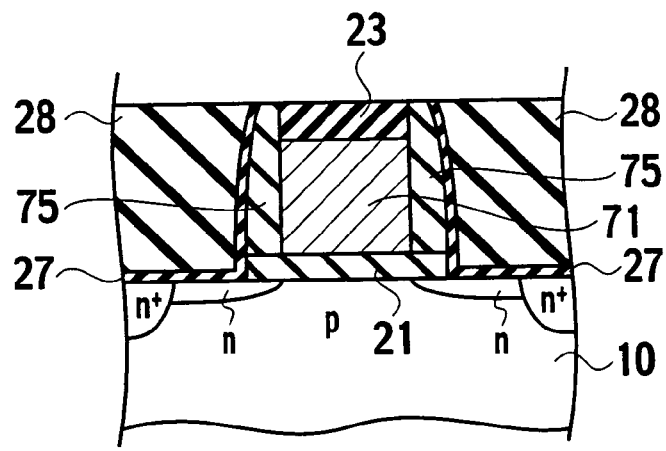
Figure 43C:
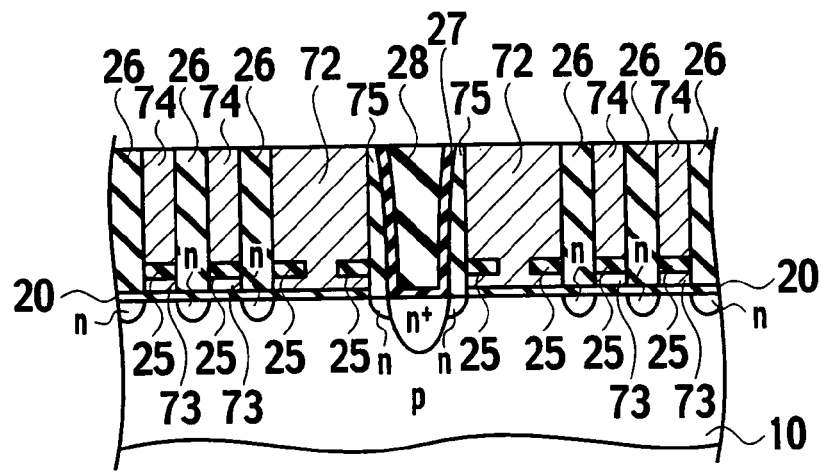
Figure 44A:
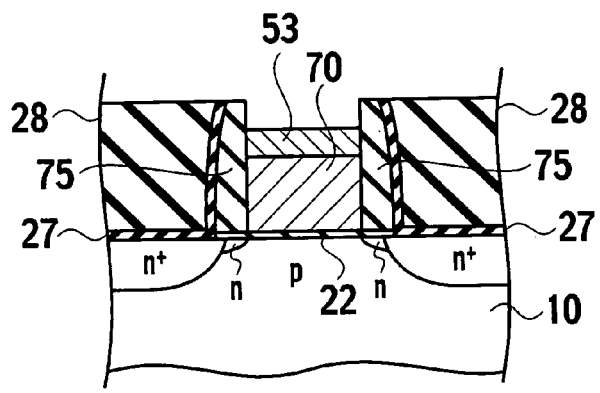
Figure 44B:
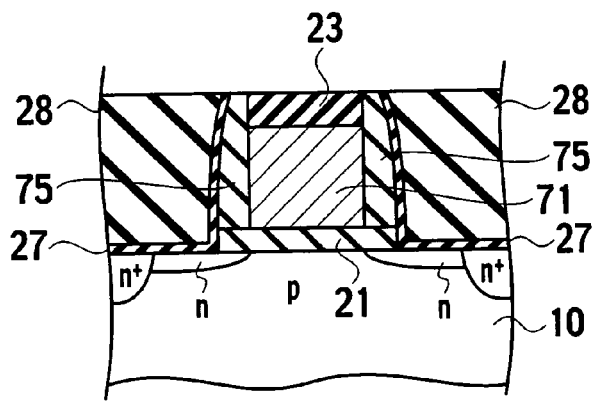
Figure 44C:
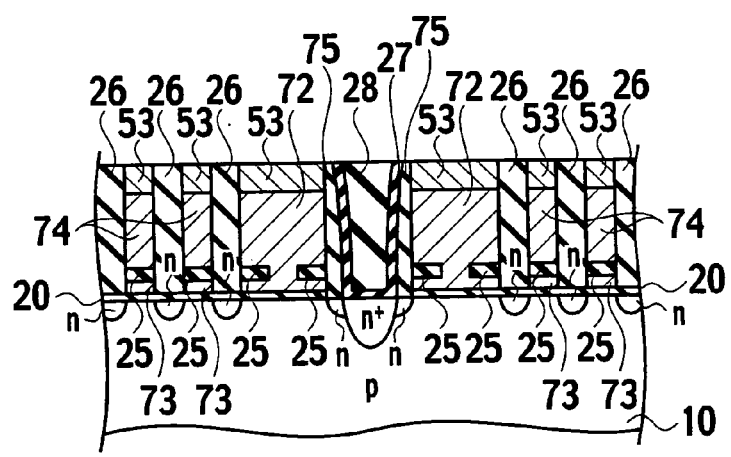
Figure 45A:
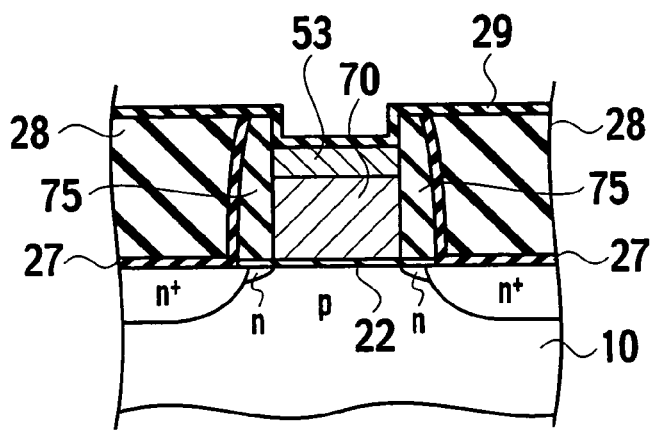
Figure 45B:
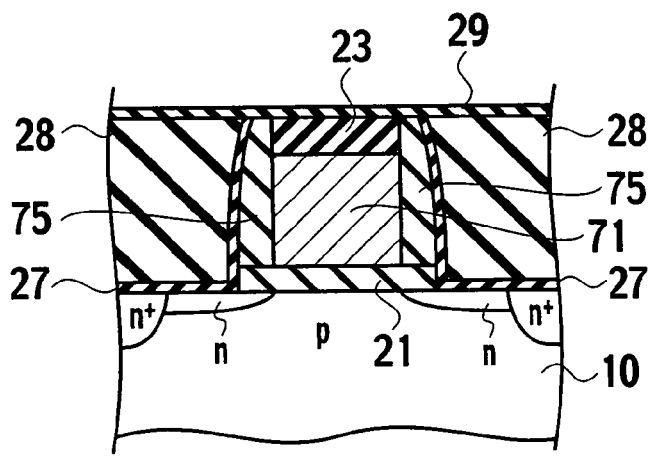
Figure 45C:
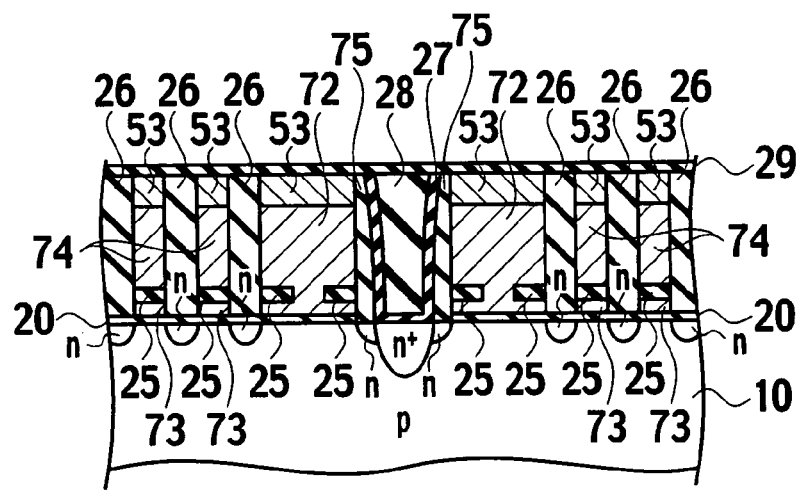
Figure 46A:
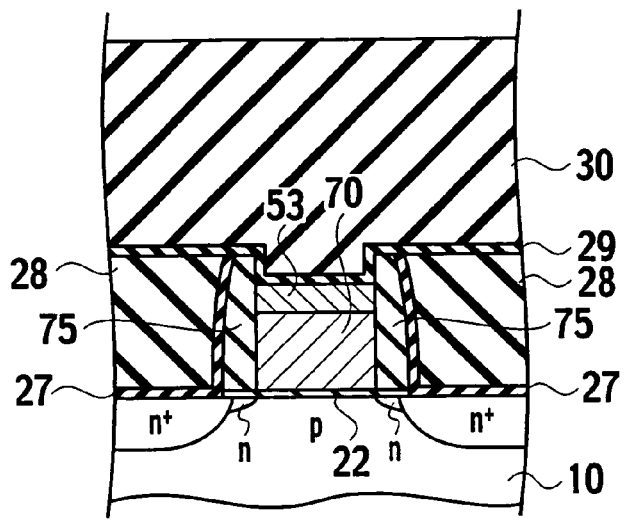
Figure 46B:
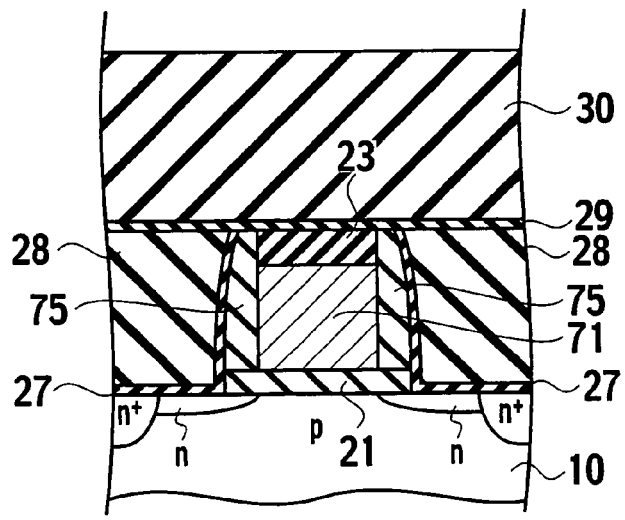
Figure 46C:
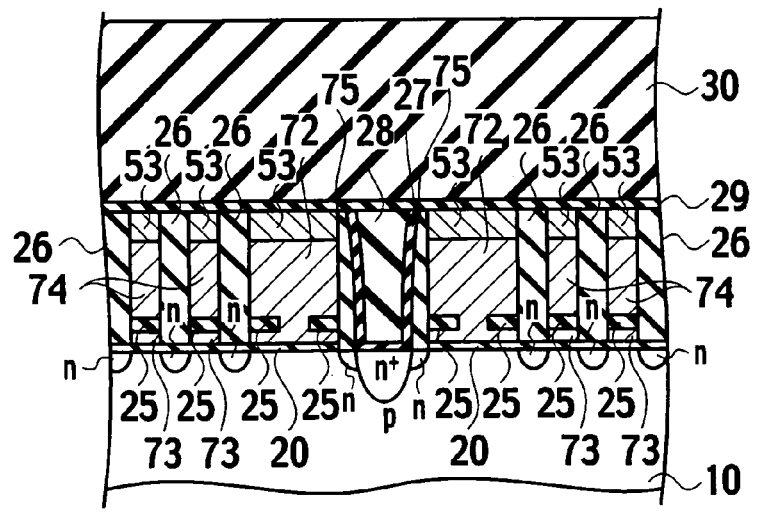
Figure 47A:
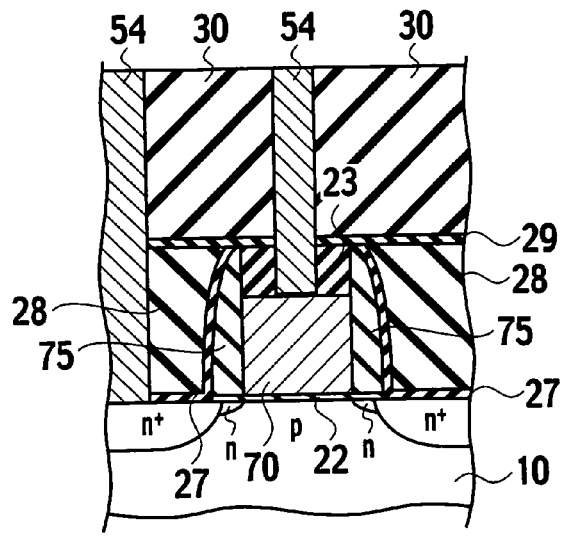
Figure 47B:
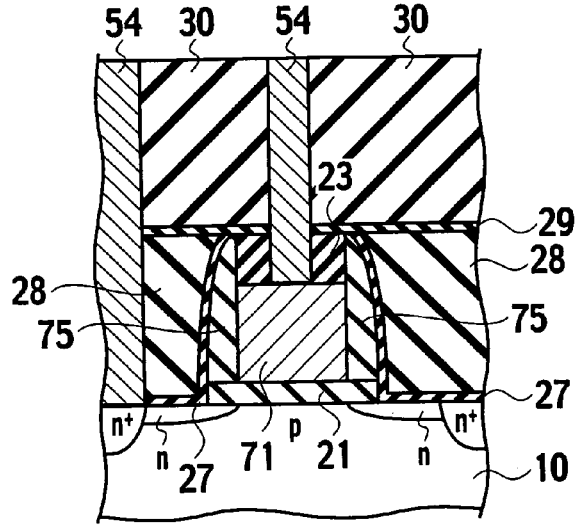
Figure 47C:
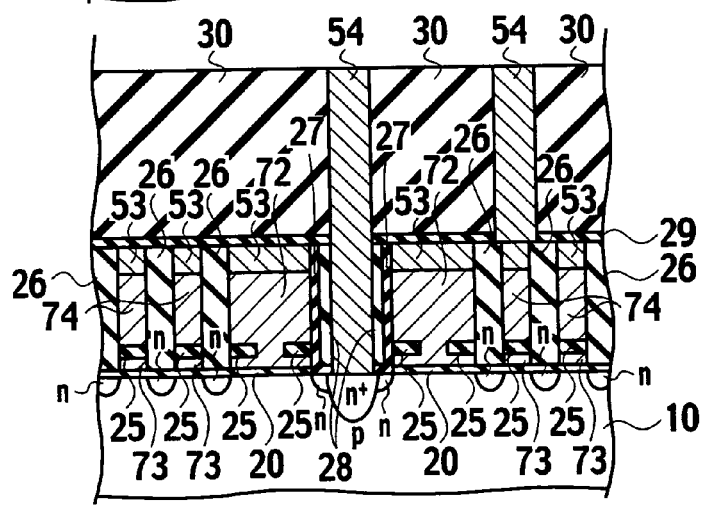
Figure 48A:
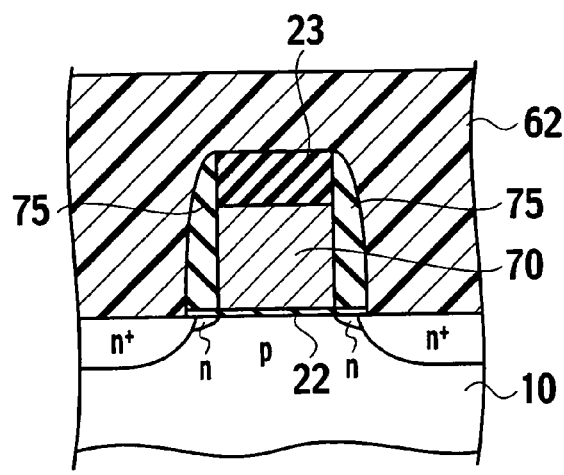
Figure 48B:
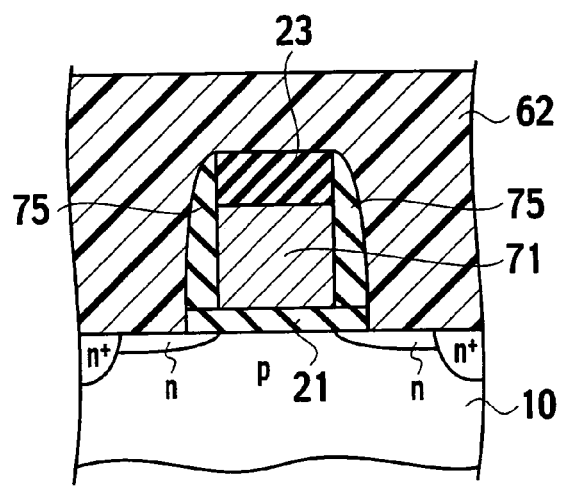
Figure 48C:
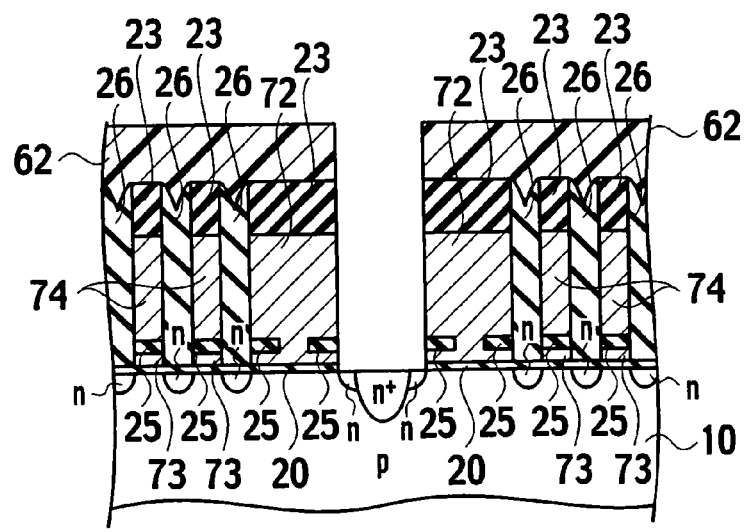
Figure 49A:
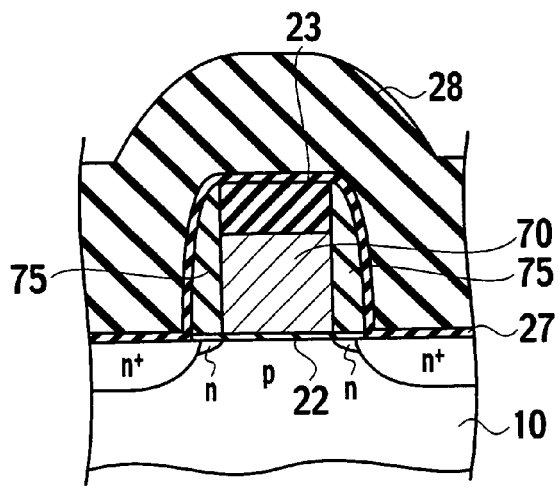
Figure 49B:
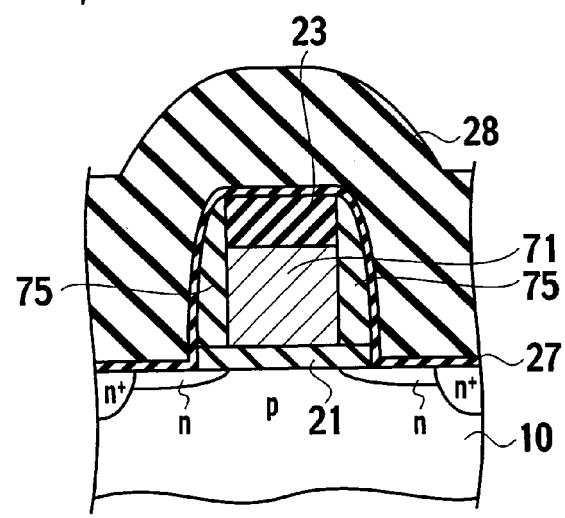
Figure 49C:
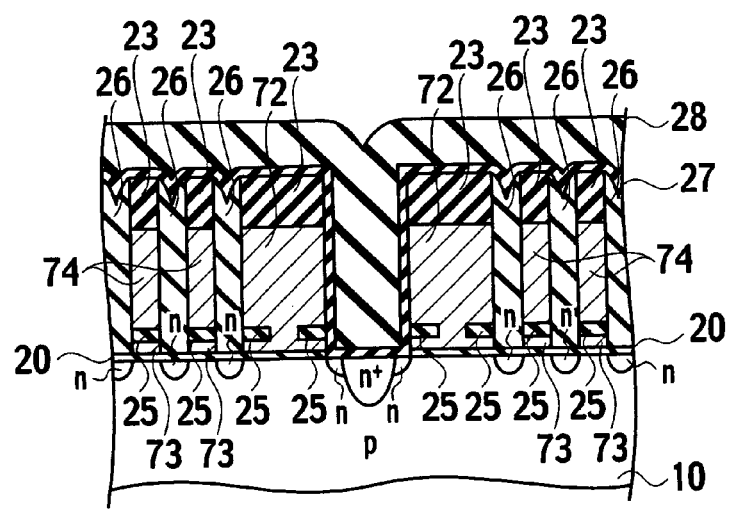
Figure 50A:
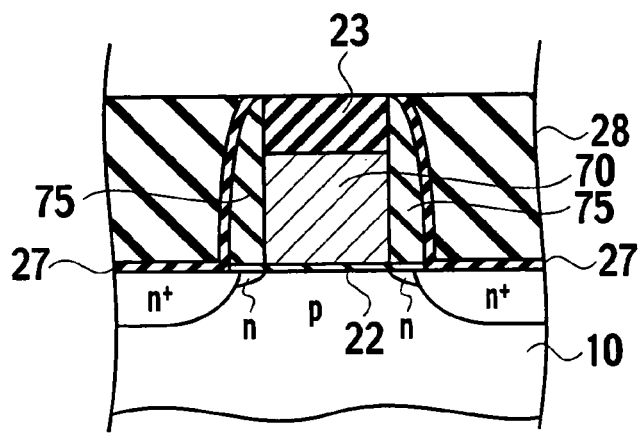
Figure 50B:
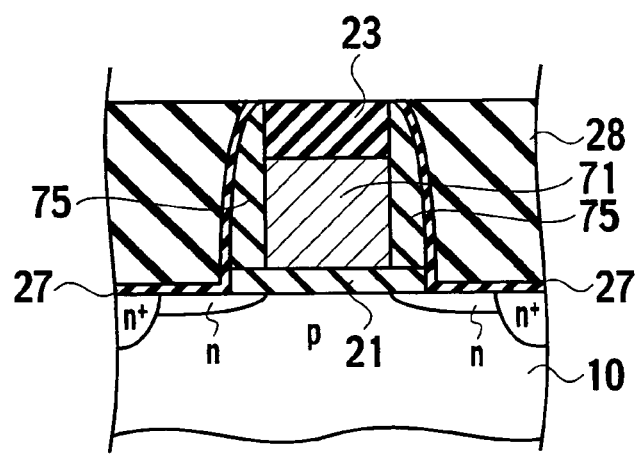
Figure 50C:
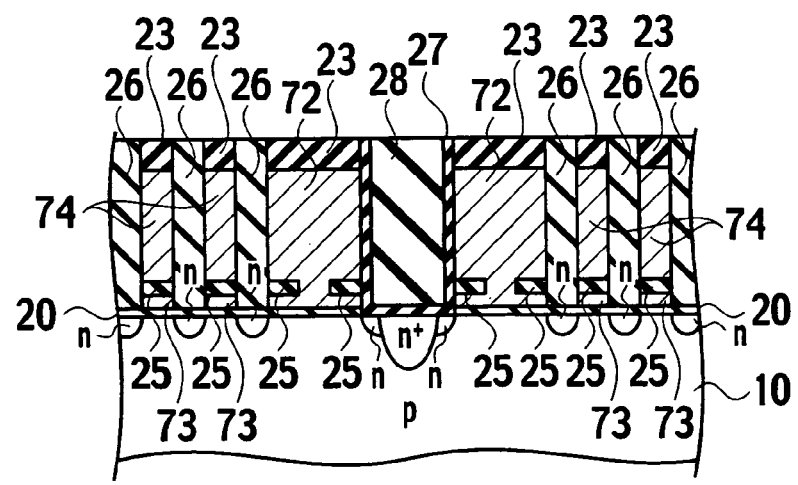
Figure 51A:
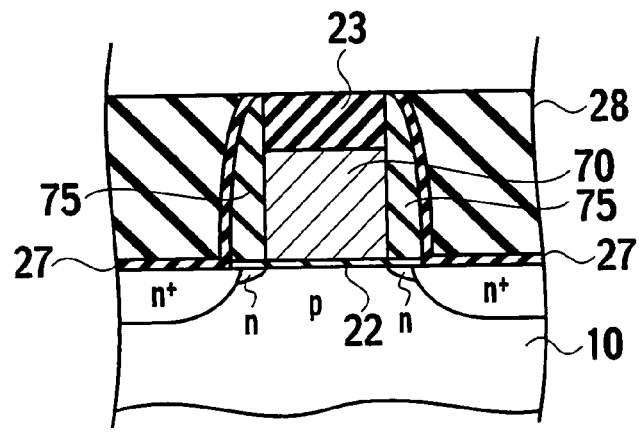
Figure 51B:
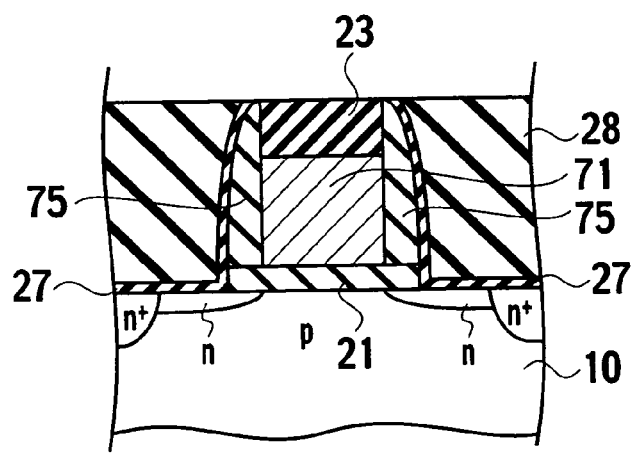
Figure 51C:
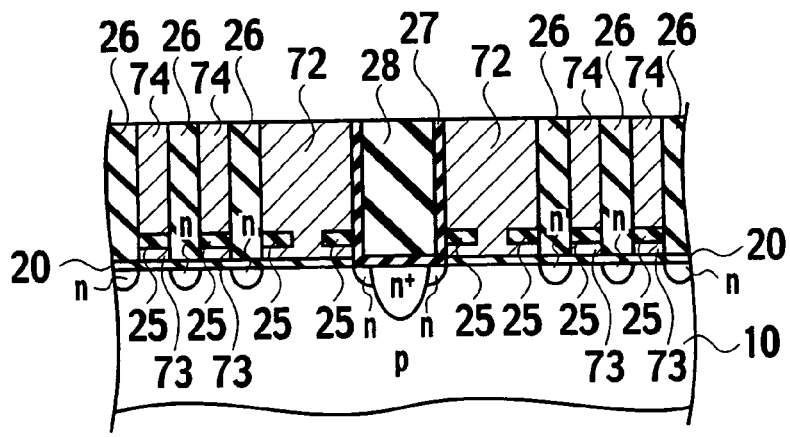
Figure 52A:
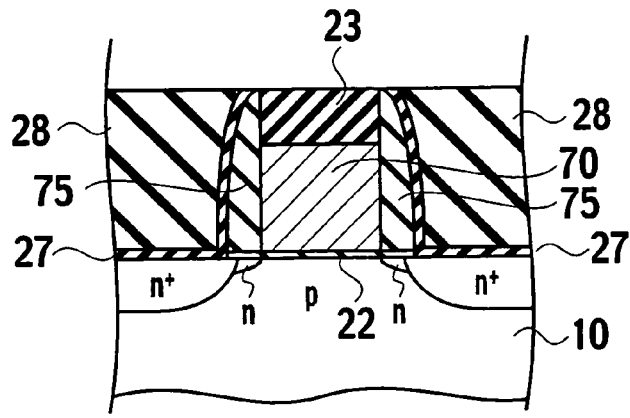
Figure 52B:
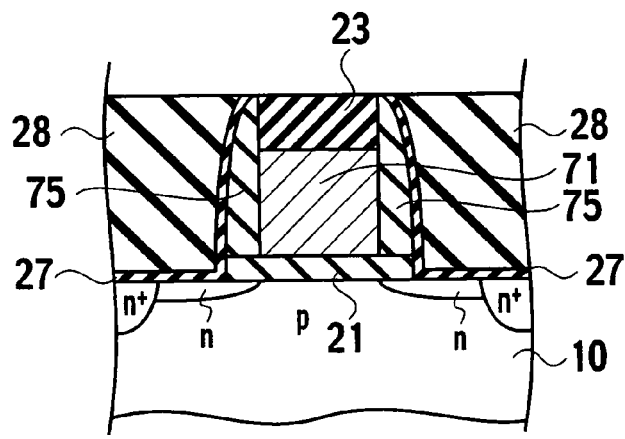
Figure 52C:
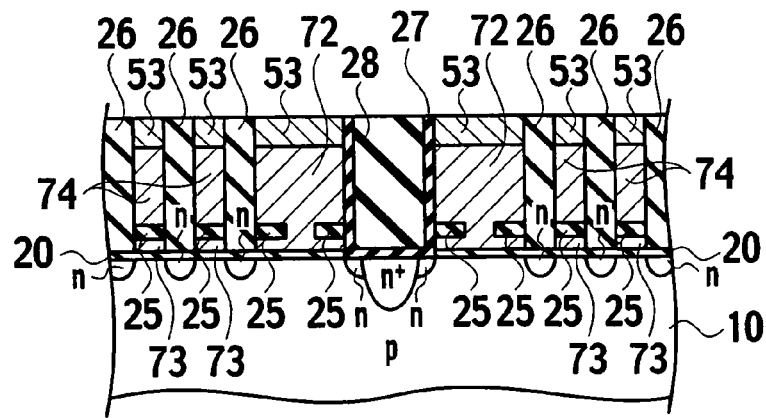
Figure 53A:
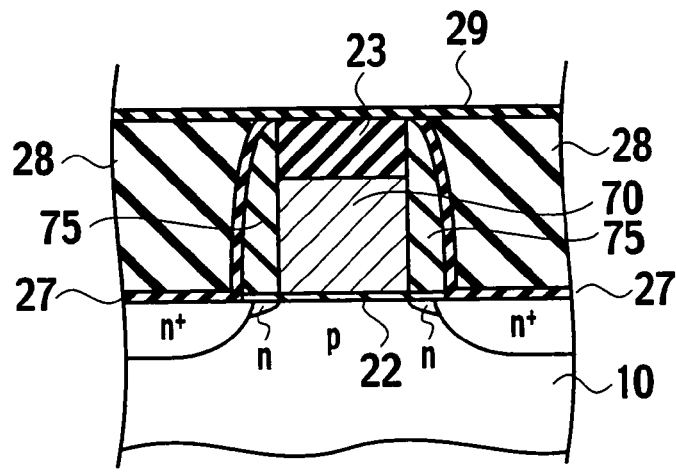
Figure 53B:
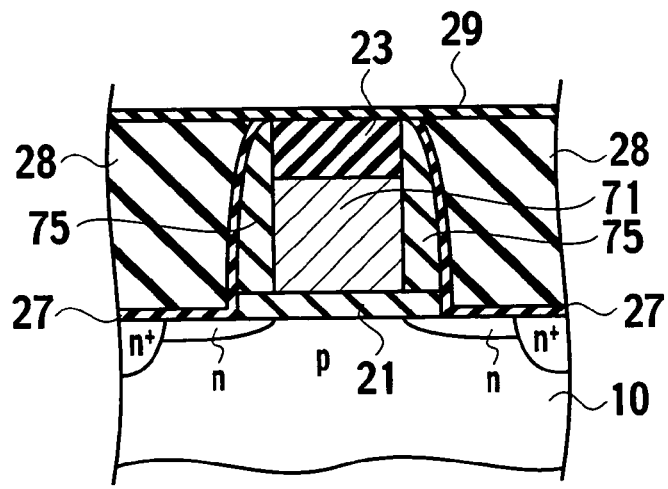
Figure 53C:
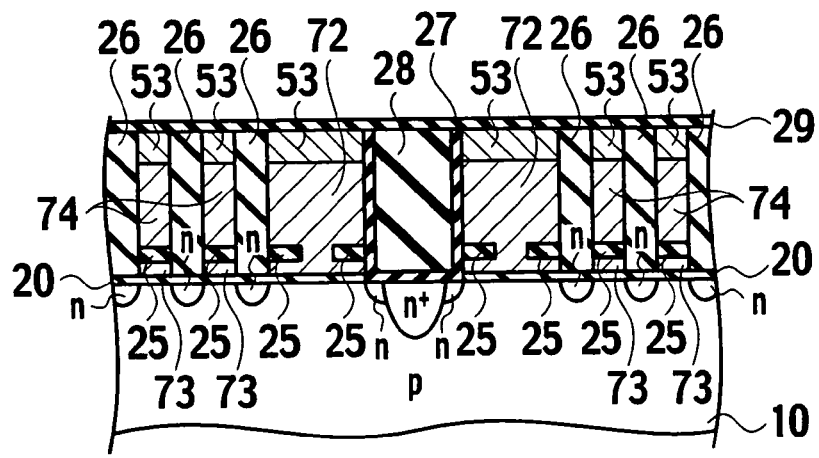
Figure 54A:
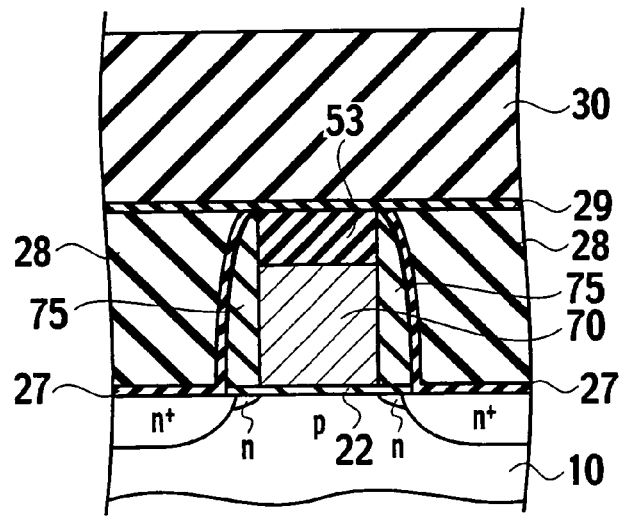
Figure 54B:
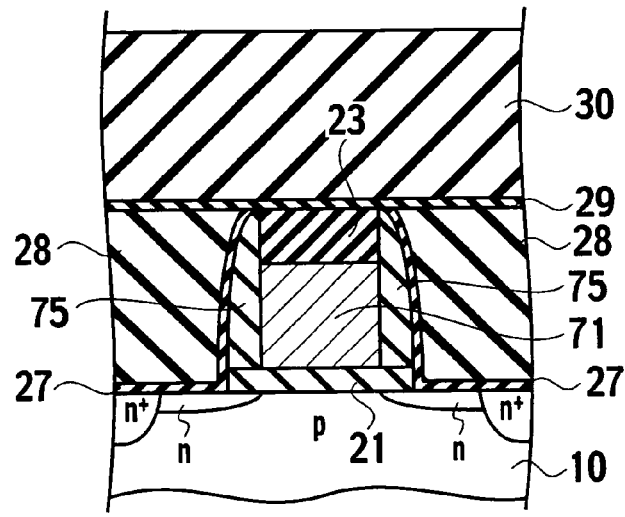
Figure 54C:
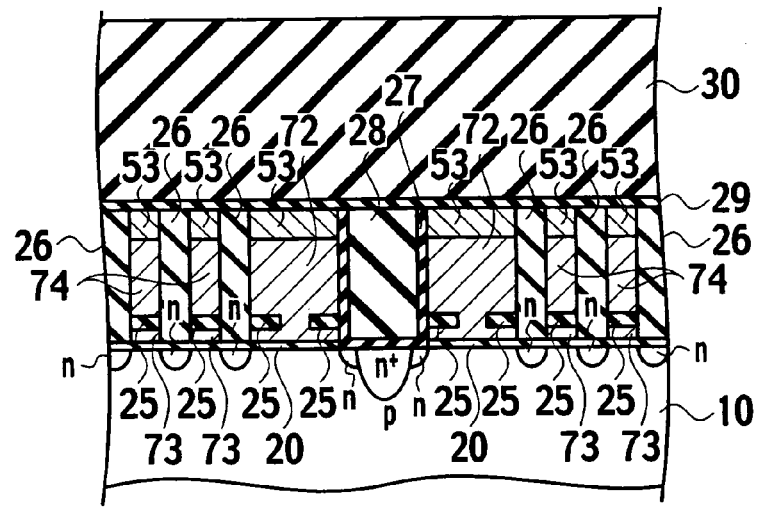
Figure 55A:
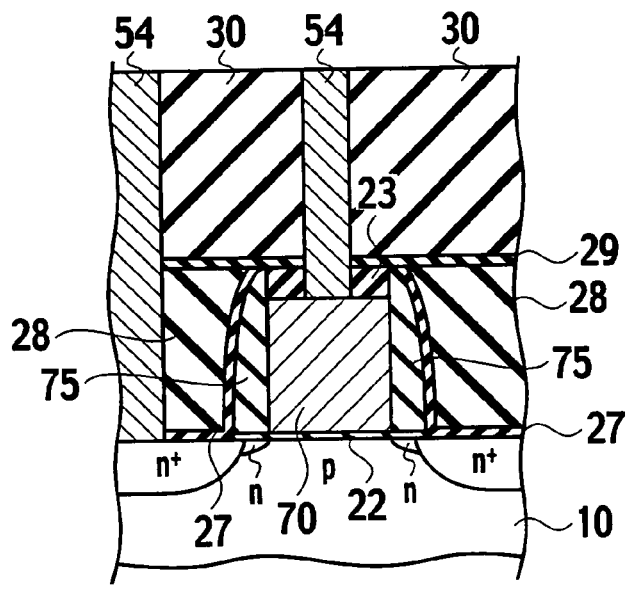
Figure 55B:
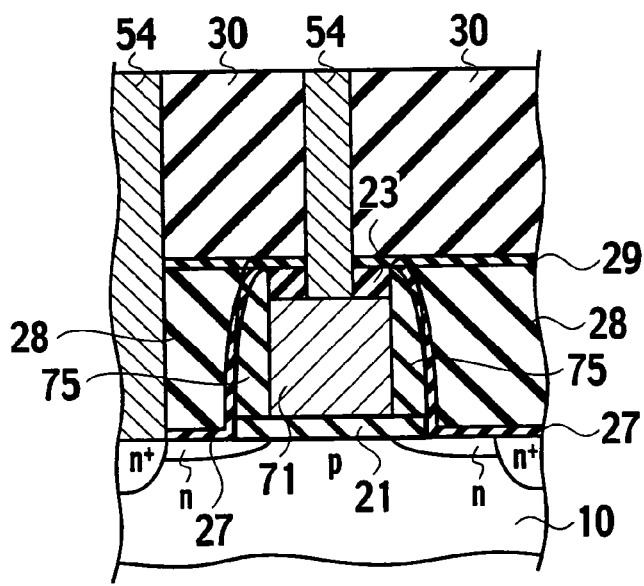
Figure 55C:
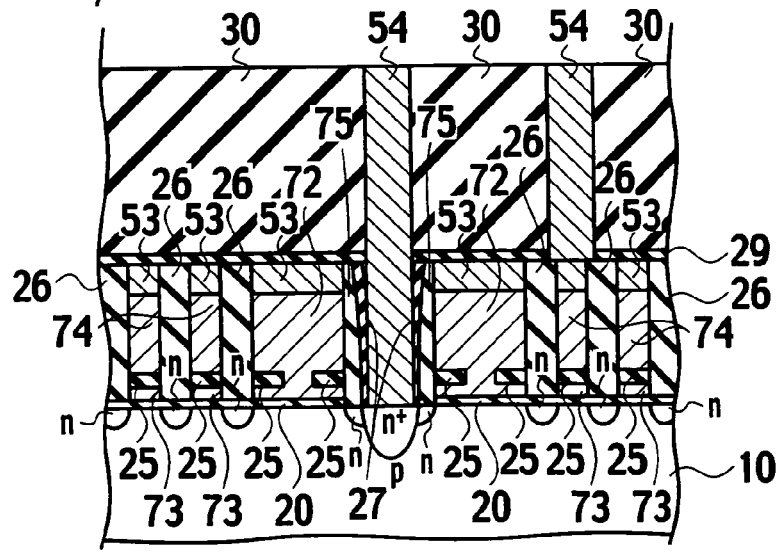
Figure 56A:
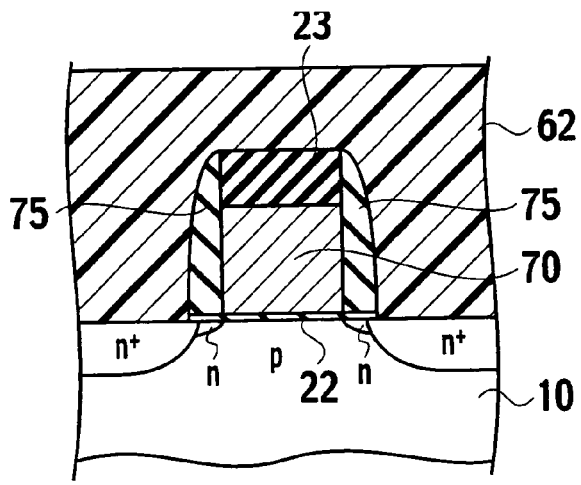
Figure 56B:
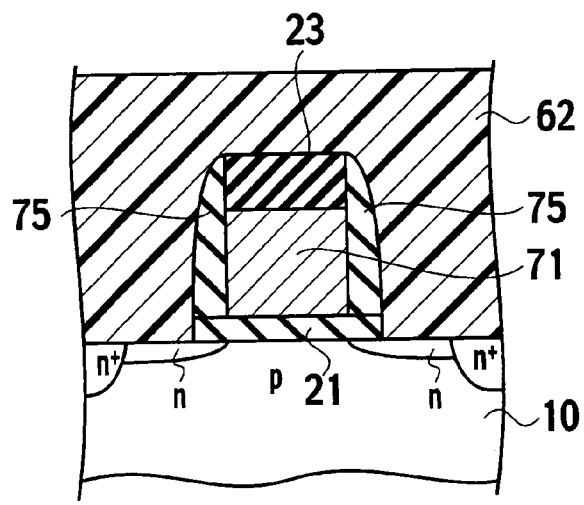
Figure 56C:
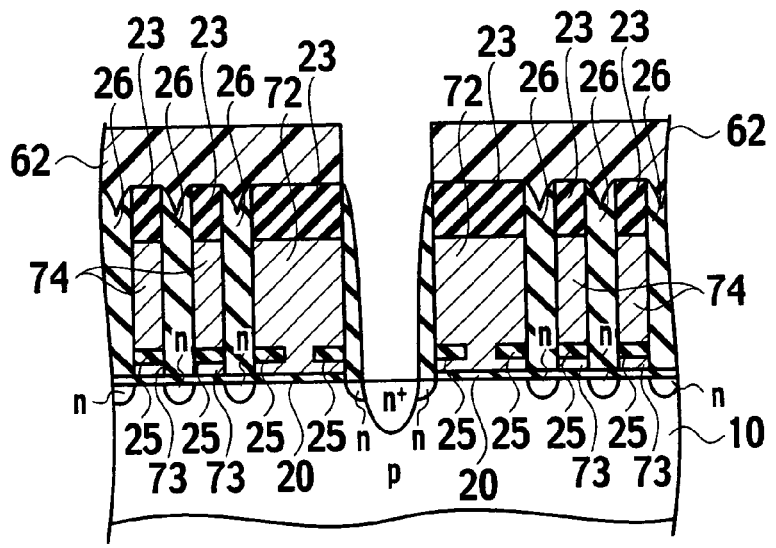
Figure 57A:
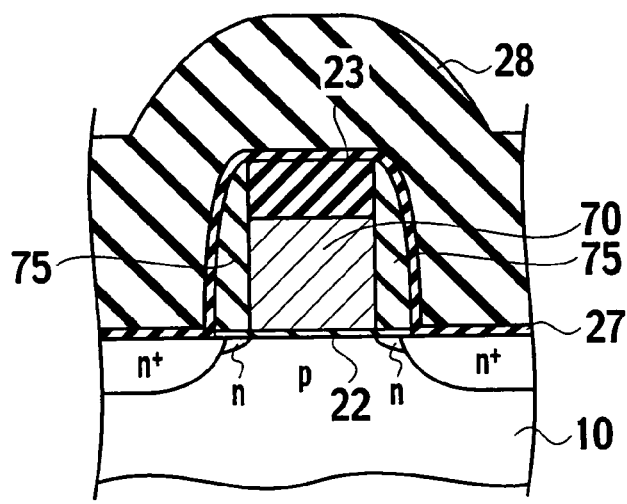
Figure 57B:
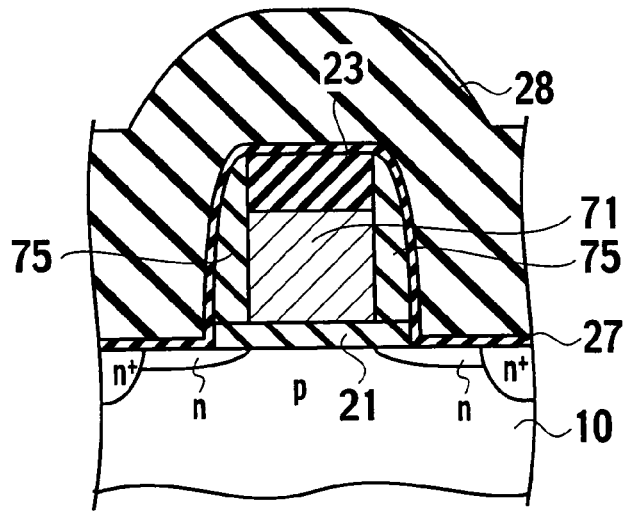
Figure 57C:
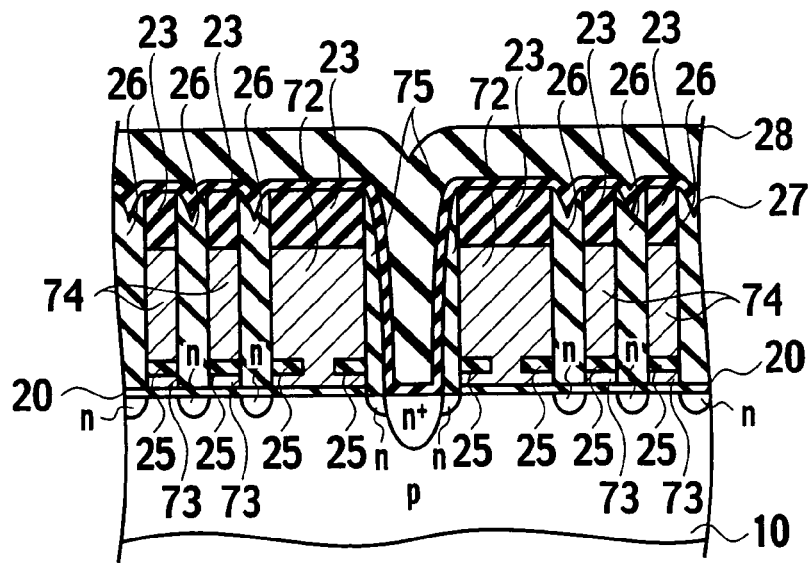
Figure 58A:
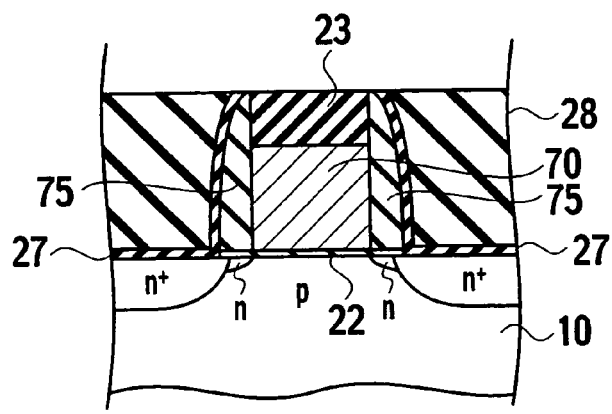
Figure 58B:
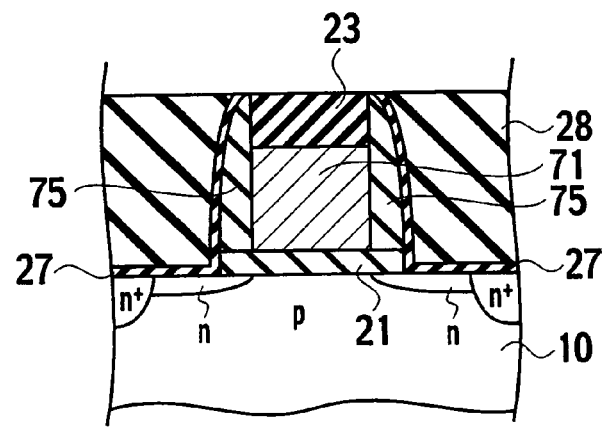
Figure 58C:
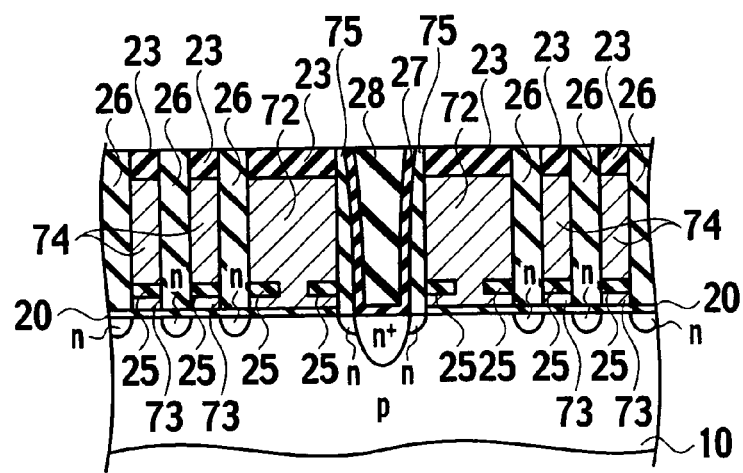
Figure 59A:
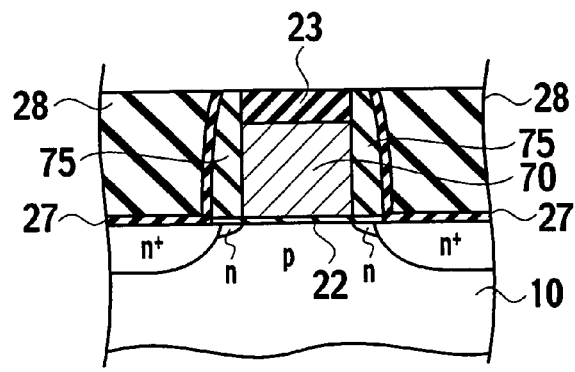
Figure 59B:
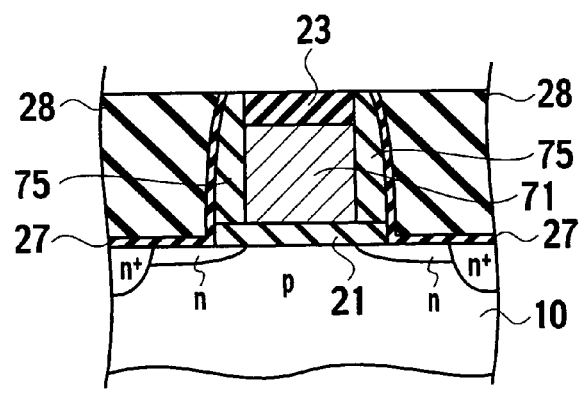
Figure 59C:
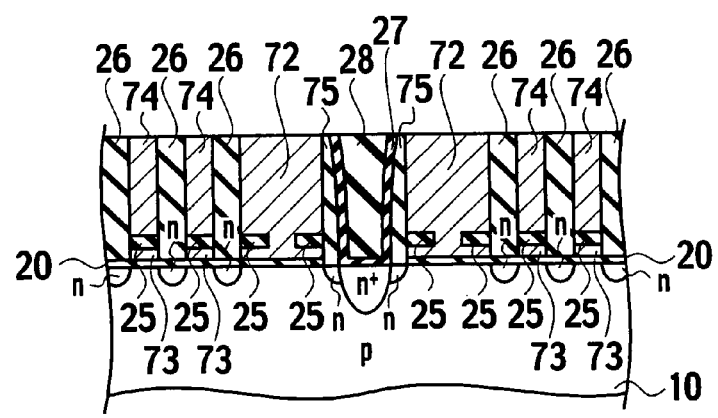
Figure 60A:
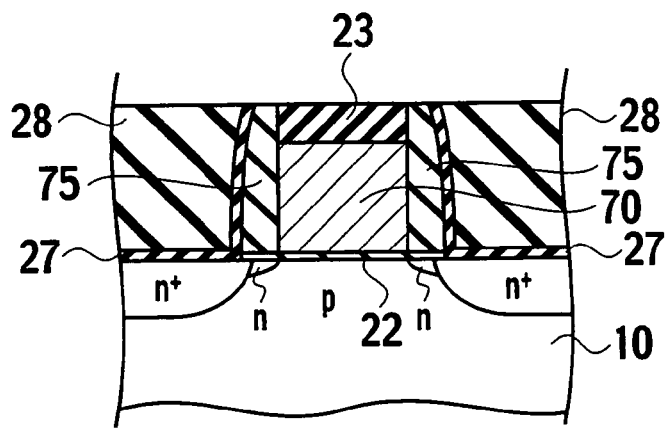
Figure 60B:
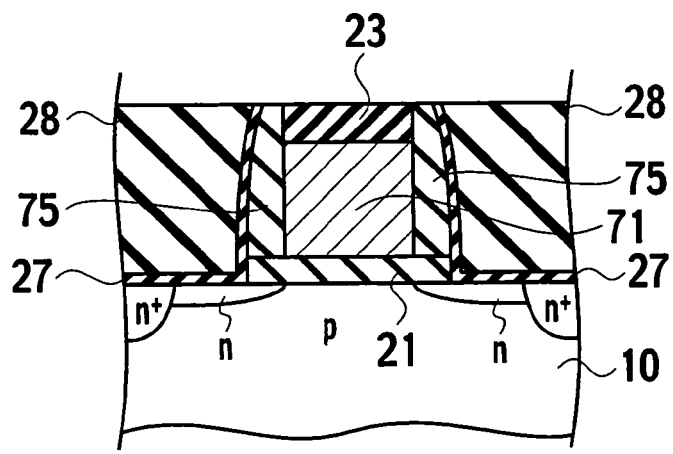
Figure 60C:
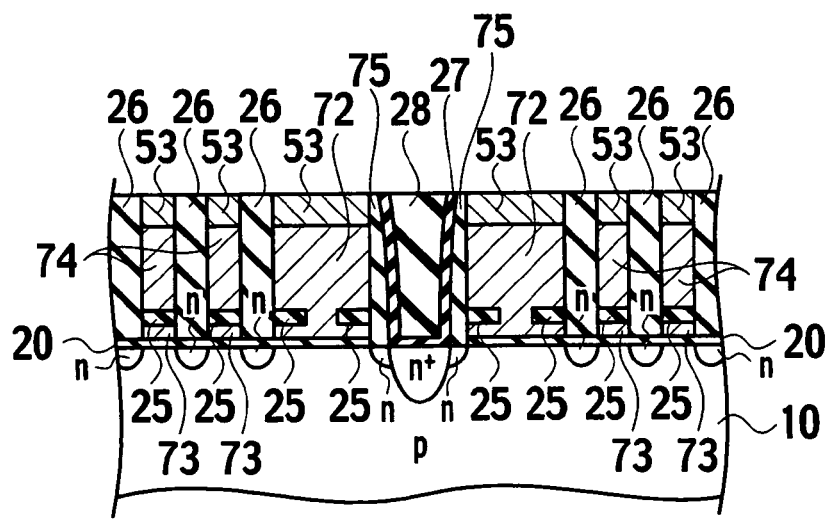
Figure 61A:
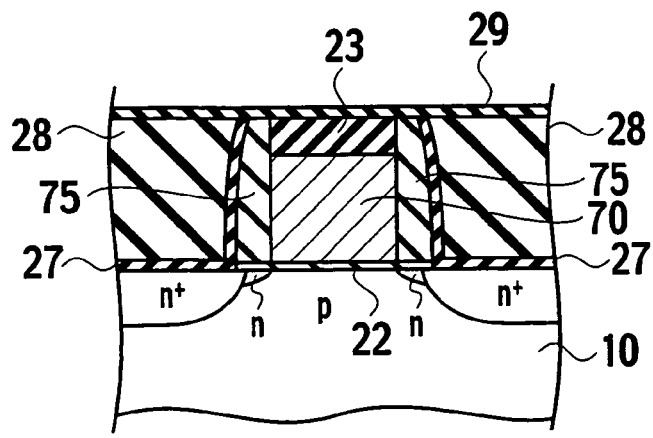
Figure 61B:
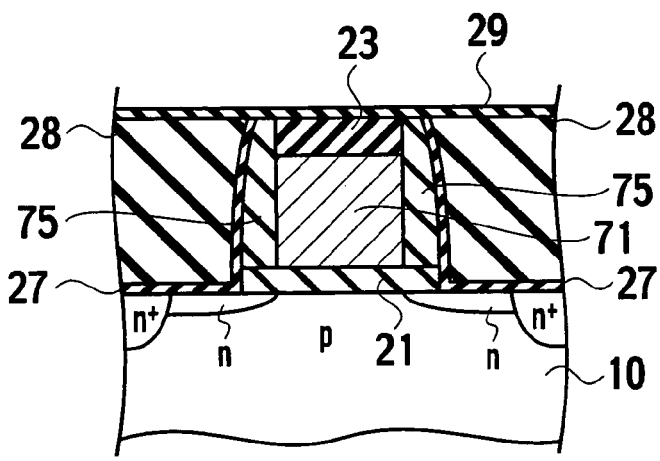
Figure 61C:
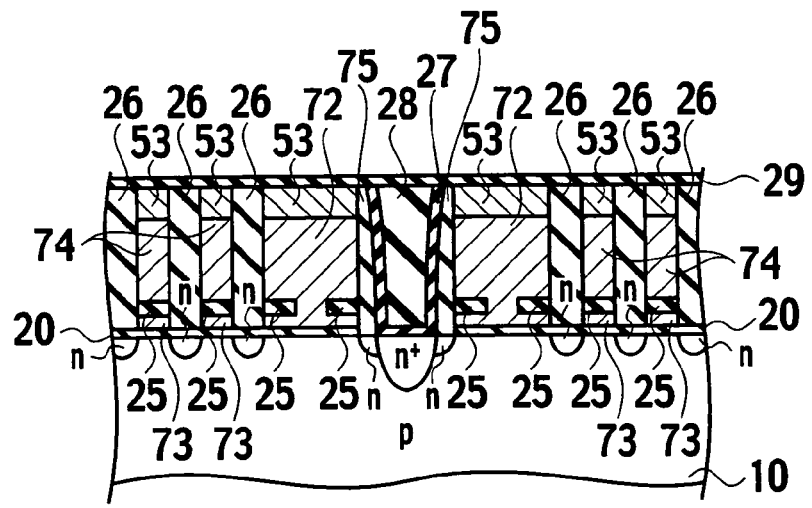
Figure 62A:
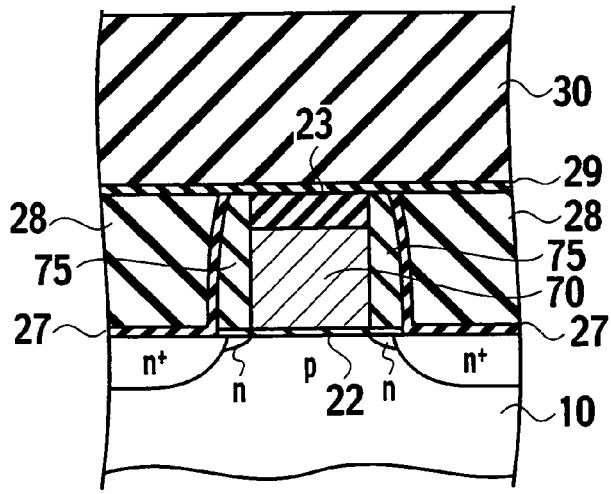
Figure 62B:
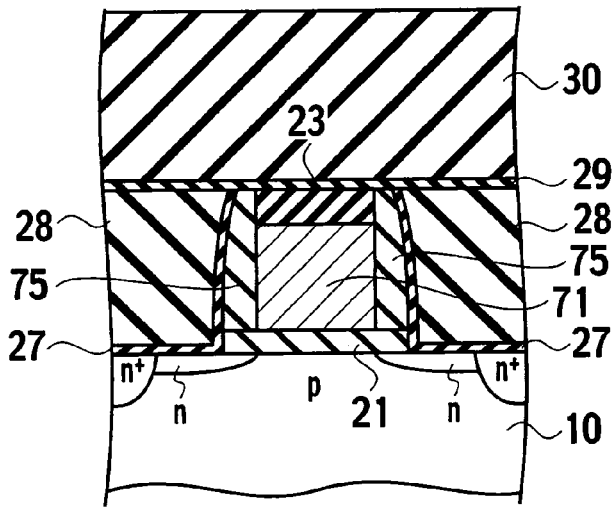
Figure 62C:
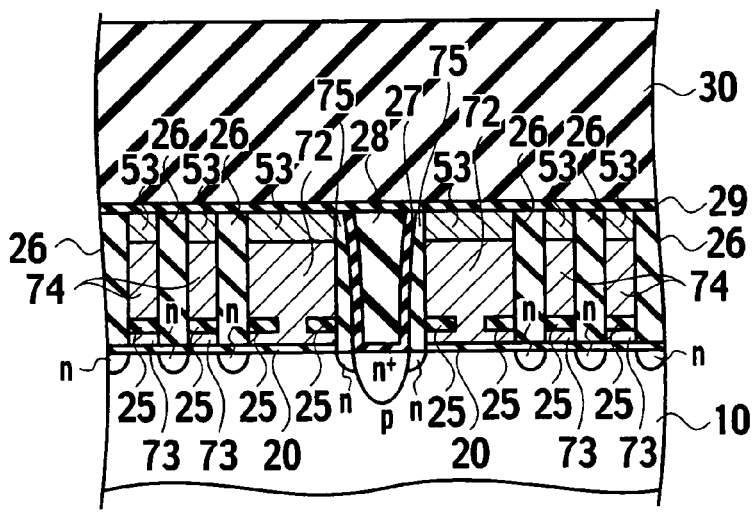

FIG. 39C a schematic cross-section of elements in a cell array region of the nonvolatile semiconductor memory cut along a line perpendicular to the word line length, according to the fourth embodiment of the present invention;

FIG. 40A is a process cross-section of elements in the low-voltage circuit region fabricated in a processing step of the nonvolatile semiconductor memory fabrication method, according to the fourth embodiment of the present invention, subsequent to that shown in FIG. 15A;

FIG. 40B is a process cross-section of elements in the high-voltage circuit region fabricated in a processing step of the nonvolatile semiconductor memory fabrication method, according to the fourth embodiment of the present invention, subsequent to that shown in FIG. 15B;

FIG. 40C is a process cross-section of elements in the cell array region fabricated in a processing step of the nonvolatile semiconductor memory fabrication method, according to the fourth embodiment of the present invention, subsequent to that shown in FIG. 15C;

FIG. 41A is a process cross-section of elements in the low-voltage circuit region fabricated in a processing step of the nonvolatile semiconductor memory fabrication method, according to the fourth embodiment of the present invention, subsequent to that shown in FIG. 40A;

FIG. 41B is a process cross-section of elements in the high-voltage circuit region fabricated in a processing step of the nonvolatile semiconductor memory fabrication method, according to the fourth embodiment of the present invention, subsequent to that shown in FIG. 40B;

FIG. 41C is a process cross-section of elements in the cell array region fabricated in a processing step of the nonvolatile semiconductor memory fabrication method, according to the fourth embodiment of the present invention, subsequent to that shown in FIG. 40C;

FIG. 42A is a process cross-section of elements in the low-voltage circuit region fabricated in a processing step of the nonvolatile semiconductor memory fabrication method, according to the fourth embodiment of the present invention, subsequent to that shown in FIG. 41A;

FIG. 42B is a process cross-section of elements in the high-voltage circuit region fabricated in a processing step of the nonvolatile semiconductor memory fabrication method, according to the fourth embodiment of the present invention, subsequent to that shown in FIG. 41B;

FIG. 42C is a process cross-section of elements in the cell array region fabricated in a processing step of the nonvolatile semiconductor memory fabrication method, according to the fourth embodiment of the present invention, subsequent to that shown in FIG. 41C;

FIG. 43A is a process cross-section of elements in the low-voltage circuit region fabricated in a processing step of the nonvolatile semiconductor memory fabrication method, according to the fourth embodiment of the present invention, subsequent to that shown in FIG. 42A;

FIG. 43B is a process cross-section of elements in the high-voltage circuit region fabricated in a processing step of the nonvolatile semiconductor memory fabrication method, according to the fourth embodiment of the present invention, subsequent to that shown in FIG. 42B;

FIG. 43C is a process cross-section of elements in the cell array region fabricated in a processing step of the nonvolatile semiconductor memory fabrication method, according to the fourth embodiment of the present invention, subsequent to that shown in FIG. 42C;

FIG. 44A is a process cross-section of elements in the low-voltage circuit region fabricated in a processing step of the nonvolatile semiconductor memory fabrication method, according to the fourth embodiment of the present invention, subsequent to that shown in FIG. 43A;

FIG. 44B is a process cross-section of elements in the high-voltage circuit region fabricated in a processing step of the nonvolatile semiconductor memory fabrication method, according to the fourth embodiment of the present invention, subsequent to that shown in FIG. 43B;

FIG. 44C is a process cross-section of elements in the cell array region fabricated in a processing step of the nonvolatile semiconductor memory fabrication method, according to the fourth embodiment of the present invention, subsequent to that shown in FIG. 43C;

FIG. 45A is a process cross-section of elements in the low-voltage circuit region fabricated in a processing step of the nonvolatile semiconductor memory fabrication method, according to the fourth embodiment of the present invention, subsequent to that shown in FIG. 44A;

FIG. 45B is a process cross-section of elements in the high-voltage circuit region fabricated in a processing step of the nonvolatile semiconductor memory fabrication method, according to the fourth embodiment of the present invention, subsequent to that shown in FIG. 44B;

FIG. 45C is a process cross-section of elements in the cell array region fabricated in a processing step of the nonvolatile semiconductor memory fabrication method, according to the fourth embodiment of the present invention, subsequent to that shown in FIG. 44C;

FIG. 46A is a process cross-section of elements in the low-voltage circuit region fabricated in a processing step of the nonvolatile semiconductor memory fabrication method, according to the fourth embodiment of the present invention, subsequent to that shown in FIG. 45A;

FIG. 46B is a process cross-section of elements in the high-voltage circuit region fabricated in a processing step of the nonvolatile semiconductor memory fabrication method, according to the fourth embodiment of the present invention, subsequent to that shown in FIG. 45B;

FIG. 46C is a process cross-section of elements in the cell array region fabricated in a processing step of the nonvolatile semiconductor memory fabrication method, according to the fourth embodiment of the present invention, subsequent to that shown in FIG. 45C;

FIG. 47A is a schematic cross-section of elements in a low-voltage circuit region of a nonvolatile semiconductor memory, according to a fifth embodiment of the present invention;

FIG. 47B is a schematic cross-section of elements in a high-voltage circuit region of the nonvolatile semiconductor memory, according to the fifth embodiment of the present invention;

FIG. 47C is a schematic cross-section of elements in a cell array region of the nonvolatile semiconductor memory cut along a line perpendicular to the word line length, according to the fifth embodiment of the present invention;

FIG. 48A is a process cross-section of elements in the low-voltage circuit region fabricated in a processing step of the nonvolatile semiconductor memory fabrication method, according to the fifth embodiment of the present invention, subsequent to that shown in FIG. 15A;

FIG. 48B is a process cross-section of elements in the high-voltage circuit region fabricated in a processing step of the nonvolatile semiconductor memory fabrication method, according to the fifth embodiment of the present invention, subsequent to that shown in FIG. 15B;

FIG. 48C is a process cross-section of elements in the cell array region fabricated in a processing step of the nonvolatile semiconductor memory fabrication method, according to the fifth embodiment of the present invention, subsequent to that shown in FIG. 15C;

FIG. 49A is a process cross-section of elements in the low-voltage circuit region fabricated in a processing step of the nonvolatile semiconductor memory fabrication method, according to the fifth embodiment of the present invention, subsequent to that shown in FIG. 48A;

FIG. 49B is a process cross-section of elements in the high-voltage circuit region fabricated in a processing step of the nonvolatile semiconductor memory fabrication method, according to the fifth embodiment of the present invention, subsequent to that shown in FIG. 48B;

FIG. 49C is a process cross-section of elements in the cell array region fabricated in a processing step of the nonvolatile semiconductor memory fabrication method, according to the fifth embodiment of the present invention, subsequent to that shown in FIG. 48C;

FIG. 50A is a process cross-section of elements in the low-voltage circuit region fabricated in a processing step of the nonvolatile semiconductor memory fabrication method, according to the fifth embodiment of the present invention, subsequent to that shown in FIG. 49A;

FIG. 50B is a process cross-section of elements in the high-voltage circuit region fabricated in a processing step of the nonvolatile semiconductor memory fabrication method, according to the fifth embodiment of the present invention, subsequent to that shown in FIG. 49B;

FIG. 50C is a process cross-section of elements in the cell array region fabricated in a processing step of the nonvolatile semiconductor memory fabrication method, according to the fifth embodiment of the present invention, subsequent to that shown in FIG. 49C;

FIG. 51A is a process cross-section of elements in the low-voltage circuit region fabricated in a processing step of the nonvolatile semiconductor memory fabrication method, according to the fifth embodiment of the present invention, subsequent to that shown in FIG. 50A;

FIG. 51B is a process cross-section of elements in the high-voltage circuit region fabricated in a processing step of the nonvolatile semiconductor memory fabrication method, according to the fifth embodiment of the present invention, subsequent to that shown in FIG. 50B;

FIG. 51C is a process cross-section of elements in the cell array region fabricated in a processing step of the nonvolatile semiconductor memory fabrication method, according to the fifth embodiment of the present invention, subsequent to that shown in FIG. 50C;

FIG. 52A is a process cross-section of elements in the low-voltage circuit region fabricated in a processing step of the nonvolatile semiconductor memory fabrication method, according to the fifth embodiment of the present invention, subsequent to that shown in FIG. 51A;

FIG. 52B is a process cross-section of elements in the high-voltage circuit region fabricated in a processing step of the nonvolatile semiconductor memory fabrication method, according to the fifth embodiment of the present invention, subsequent to that shown in FIG. 51B;

FIG. 52C is a process cross-section of elements in the cell array region fabricated in a processing step of the nonvolatile semiconductor memory fabrication method, according to the fifth embodiment of the present invention, subsequent to that shown in FIG. 51C;

FIG. 53A is a process cross-section of elements in the low-voltage circuit region fabricated in a processing step of the nonvolatile semiconductor memory fabrication method, according to the fifth embodiment of the present invention, subsequent to that shown in FIG. 52A;

FIG. 53B is a process cross-section of elements in the high-voltage circuit region fabricated in a processing step of the nonvolatile semiconductor memory fabrication method, according to the fifth embodiment of the present invention, subsequent to that shown in FIG. 52B;

FIG. 53C is a process cross-section of elements in the cell array region fabricated in a processing step of the nonvolatile semiconductor memory fabrication method, according to the fifth embodiment of the present invention, subsequent to that shown in FIG. 52C;

FIG. 54A is a process cross-section of elements in the low-voltage circuit region fabricated in a processing step of the nonvolatile semiconductor memory fabrication method, according to the fifth embodiment of the present invention, subsequent to that shown in FIG. 53A;

FIG. 54B is a process cross-section of elements in the high-voltage circuit region fabricated in a processing step of the nonvolatile semiconductor memory fabrication method, according to the fifth embodiment of the present invention, subsequent to that shown in FIG. 53B;

FIG. 54C is a process cross-section of elements in the cell array region fabricated in a processing step of the nonvolatile semiconductor memory fabrication method, according to the fifth embodiment of the present invention, subsequent to that shown in FIG. 53C;

FIG. 55A is a schematic cross-section of elements in a low-voltage circuit region of a nonvolatile semiconductor memory, according to a sixth embodiment of the present invention;

FIG. 55B is a schematic cross-section of elements in a high-voltage circuit region of the nonvolatile semiconductor memory, according to the sixth embodiment of the present invention;

FIG. 55C is a schematic cross-section of elements in a cell array region of the nonvolatile semiconductor memory cut along a line perpendicular to the word line length, according to the sixth embodiment of the present invention;

FIG. 56A is a process cross-section of elements in the low-voltage circuit region fabricated in a processing step of the nonvolatile semiconductor memory fabrication method, according to the sixth embodiment of the present invention, subsequent to that shown in FIG. 15A;

FIG. 56B is a process cross-section of elements in the high-voltage circuit region fabricated in a processing step of the nonvolatile semiconductor memory fabrication method, according to the sixth embodiment of the present invention, subsequent to that shown in FIG. 15B;

FIG. 56C is a process cross-section of elements in the cell array region fabricated in a processing step of the nonvolatile semiconductor memory fabrication method, according to the sixth embodiment of the present invention, subsequent to that shown in FIG. 15C;

FIG. 57A is a process cross-section of elements in the low-voltage circuit region fabricated in a processing step of the nonvolatile semiconductor memory fabrication method, according to the sixth embodiment of the present invention, subsequent to that shown in FIG. 56A;

FIG. 57B is a process cross-section of elements in the high-voltage circuit region fabricated in a processing step of the nonvolatile semiconductor memory fabrication method, according to the sixth embodiment of the present invention, subsequent to that shown in FIG. 56B;

FIG. 57C is a process cross-section of elements in the cell array region fabricated in a processing step of the nonvolatile semiconductor memory fabrication method, according to the sixth embodiment of the present invention, subsequent to that shown in FIG. 56C;

FIG. 58A is a process cross-section of elements in the low-voltage circuit region fabricated in a processing step of the nonvolatile semiconductor memory fabrication method, according to the sixth embodiment of the present invention, subsequent to that shown in FIG. 57A;

FIG. 58B is a process cross-section of elements in the high-voltage circuit region fabricated in a processing step of the nonvolatile semiconductor memory fabrication method, according to the sixth embodiment of the present invention, subsequent to that shown in FIG. 57B;

FIG. 58C is a process cross-section of elements in the cell array region fabricated in a processing step of the nonvolatile semiconductor memory fabrication method, according to the sixth embodiment of the present invention, subsequent to that shown in FIG. 57C;

FIG. 59A is a process cross-section of elements in the low-voltage circuit region fabricated in a processing step of the nonvolatile semiconductor memory fabrication method, according to the sixth embodiment of the present invention, subsequent to that shown in FIG. 58A;

FIG. 59B is a process cross-section of elements in the high-voltage circuit region fabricated in a processing step of the nonvolatile semiconductor memory fabrication method, according to the sixth embodiment of the present invention, subsequent to that shown in FIG. 58B;

FIG. 59C is a process cross-section of elements in the cell array region fabricated in a processing step of the nonvolatile semiconductor memory fabrication method, according to the sixth embodiment of the present invention, subsequent to that shown in FIG. 58C;

FIG. 60A is a process cross-section of elements in the low-voltage circuit region fabricated in a processing step of the nonvolatile semiconductor memory fabrication method, according to the sixth embodiment of the present invention, subsequent to that shown in FIG. 59A;

FIG. 60B is a process cross-section of elements in the high-voltage circuit region fabricated in a processing step of the nonvolatile semiconductor memory fabrication method, according to the sixth embodiment of the present invention, subsequent to that shown in FIG. 59B;

FIG. 60C is a process cross-section of elements in the cell array region fabricated in a processing step of the nonvolatile semiconductor memory fabrication method, according to the sixth embodiment of the present invention, subsequent to that shown in FIG. 59C;

FIG. 61A is a process cross-section of elements in the low-voltage circuit region fabricated in a processing step of the nonvolatile semiconductor memory fabrication method, according to the sixth embodiment of the present invention, subsequent to that shown in FIG. 60A;

FIG. 61B is a process cross-section of elements in the high-voltage circuit region fabricated in a processing step of the nonvolatile semiconductor memory fabrication method, according to the sixth embodiment of the present invention, subsequent to that shown in FIG. 60B;

FIG. 61C is a process cross-section of elements in the cell array region fabricated in a processing step of the nonvolatile semiconductor memory fabrication method, according to the sixth embodiment of the present invention, subsequent to that shown in FIG. 60C;

FIG. 62A is a process cross-section of elements in the low-voltage circuit region fabricated in a processing step of the nonvolatile semiconductor memory fabrication method, according to the sixth embodiment of the present invention, subsequent to that shown in FIG. 61A;

FIG. 62B is a process cross-section of elements in the high-voltage circuit region fabricated in a processing step of the nonvolatile semiconductor memory fabrication method, according to the sixth embodiment of the present invention, subsequent to that shown in FIG. 61B; and FIG. 62C is a process cross-section of elements in the cell array region fabricated in a processing step of the nonvolatile semiconductor memory fabrication method, according to the sixth embodiment of the present invention, subsequent to that shown in FIG. 61C.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Referring to the drawings, embodiments of the present invention are described below. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

Next, a first to a sixth embodiment of the present invention are described while referencing drawings. The same or similar reference numerals are attached to the same or similar parts in the following drawing description. Note that those drawings are merely schematics and thus relationship between thickness of respective parts and two-dimensional size thereof and ratio of respective parts in thickness may be inconsistent with reality according to the present invention. Moreover, it is natural that there are parts differing in relationship and ratio of dimensions among the drawings.

The technical ideas according to the present invention may be modified into a variety of modifications within the scope of the claimed invention.

Embodiments of the present invention are described forthwith while referencing the drawings. The same or similar symbols are given to the same or similar parts throughout the appended drawings. However, the drawings are merely schematics, and relationship between thickness and planar dimension and ratio of respective layer thicknesses and the like differ from those of the actual invention. Accordingly, specific thicknesses and dimensions should be determined with consideration of the following description. Furthermore, it is needless to say that parts differing in relationship and ratio of dimensions among the drawings are included.

There is a step of forming all gate insulating films before formation of element isolating regions in the formation process of a NAND nonvolatile semiconductor memory.

In this step, since the gate insulating films in low-voltage circuit regions have the same thickness as those in a cell array region, there is merit to a simpler manufacturing process. On the other hand, there is a step of independently forming gate insulating films (tunnel oxide films) in low-voltage circuit regions and high-voltage circuit regions, respectively, which constitutes the periphery of the cell array region. In this step, element isolating regions may be formed while independently adjusting the thicknesses of the gate insulating films of the peripheral low-voltage circuit regions and high-voltage circuit regions. Particularly, the gate insulating films of the transistors in the low-voltage circuit regions may be formed extremely thinner than those of memory cell transistors. Since this allows an increase in mutual conductance $g_m$ for each transistor, there is merit in that transistors with excellent driving capabilities may be formed.

First Embodiment

Figure 1:
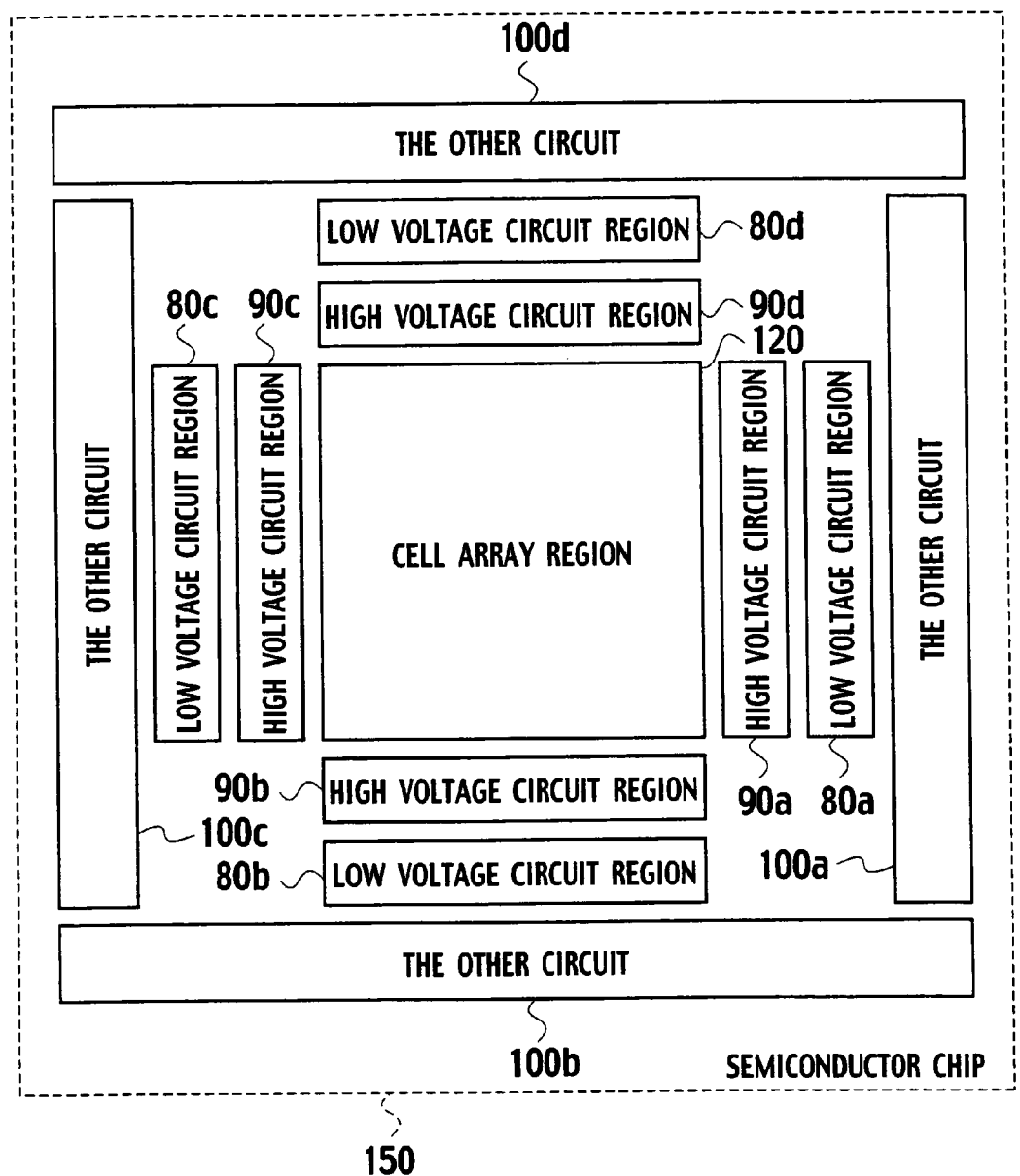
FIG. 1 schematically shows an overall top view of a pattern block structure of a nonvolatile semiconductor memory, according to a first to a sixth embodiment of the present invention.

As shown in FIG. 1, a schematic block structure of a nonvolatile semiconductor memory, according to the first embodiment of the present invention, includes a cell array region 120 deployed on a semiconductor chip 150, high-voltage circuit regions 90a, 90b, 90c, and 90d arranged adjacent to each other on the four sides of the cell array region 120, low-voltage circuit regions 80a, 80b, 80c, and 80d arranged adjacent to the high-voltage circuit regions 90a, 90b, 90c, and 90d, respectively, and other circuit regions 100a, 100b, 100c, and 100d arranged adjacent to the low-voltage circuit regions 80a, 80b, 80c, and 80d, respectively. The circuit regions 100a, 100b, 100c, and 100d are regions in which low-voltage circuits, high voltage circuits, and resistor regions are arranged. The high-voltage circuit regions 90a, 90b, 90c, and 90d apply relatively higher voltage pulses compared to power-supply voltages, such as a write-in voltage $V_{pgm}$ and an erase voltage $V_{erase}$, to the cell array region 120. The low-voltage circuit regions 80a, 80b, 80c, and 80d are logic circuits, such as CMOSFETs, and are required for relatively high-speed, low-power consumption performance. Particularly, low-voltage circuits and high-voltage circuits other than circuits arranged in the low-voltage circuit regions 80a, 80b, 80c, and 80d and the high-voltage circuit regions 90a, 90b, 90c, and 90d and resistor element regions for generating a reference voltage or the like are deployed in the other circuit regions 100a, 100b, 100c, and 100d.

With the nonvolatile semiconductor memory according to the first embodiment, the cell array region 120 particularly relates to the high-voltage circuit regions 90a, 90b, 90c, and 90d and the low-voltage circuit regions 80a, 80b, 80c, and 80d. Furthermore, the cell array region 120 also relates to the low-voltage circuits and high-voltage circuits in the other circuit regions 100a, 100b, 100c, and 100d, and the resistive element region for generating a reference voltage or the like. Moreover, the cell array region 120 further relates to the high-voltage circuit regions 90a, 90b, 90c, and 90d, the low-voltage circuit regions 80a, 80b, 80c, and 80d, and interconnect regions in the other circuit regions 100a, 100b, 100c, and 100d.

Figure 2A:
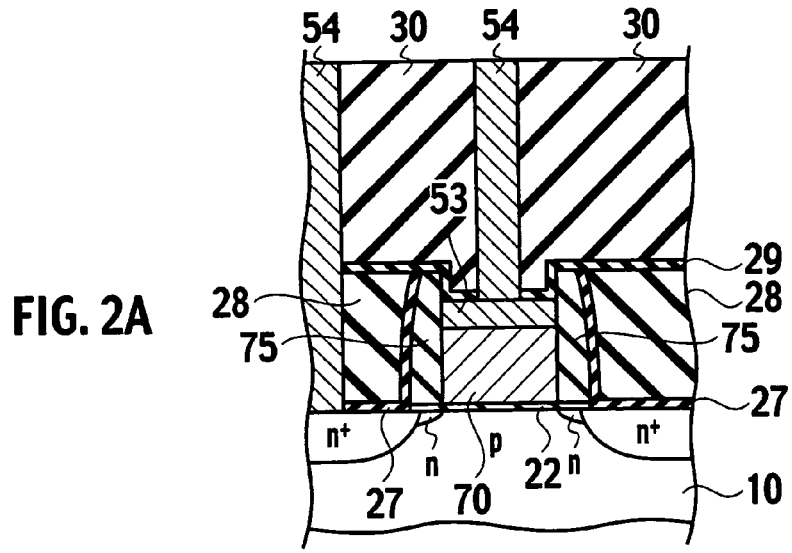
FIG. 2A is a schematic cross-section of elements in a low-voltage circuit region of a nonvolatile semiconductor memory, according to a first embodiment of the present invention.
Figure 2B:
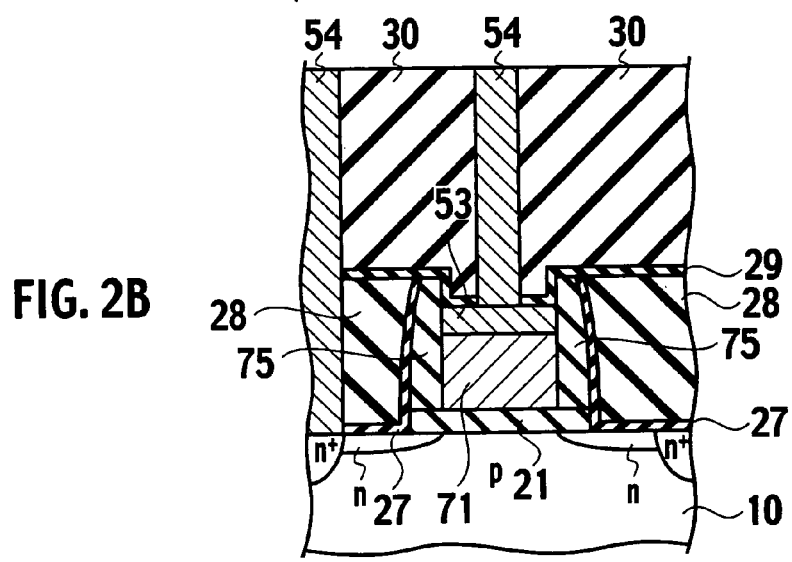
FIG. 2B is a schematic cross-section of elements in a high-voltage circuit region of a nonvolatile semiconductor memory, according to the first embodiment of the present invention.
Figure 2C:
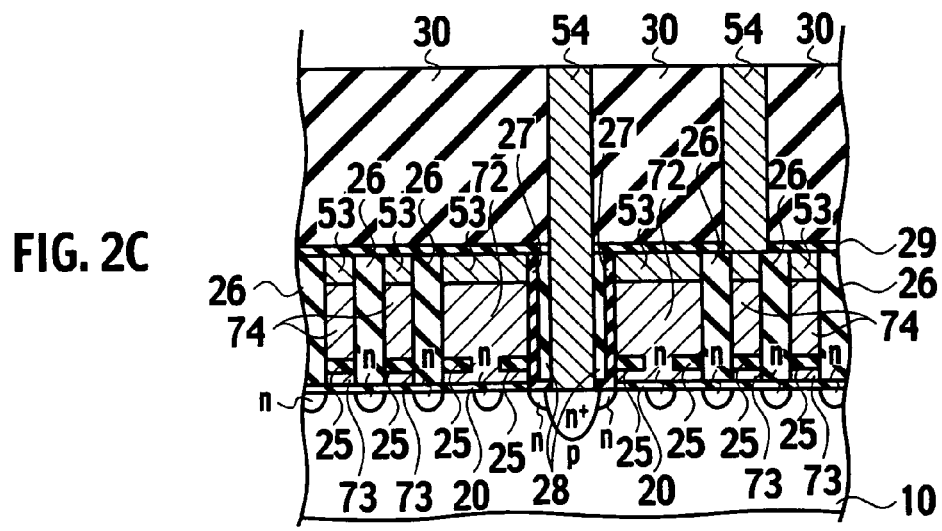
FIG. 2C is a schematic cross-section of elements in a cell array region of the nonvolatile semiconductor memory cut along a line perpendicular to the word line length, according to the first embodiment of the present invention.
Figure 3A:
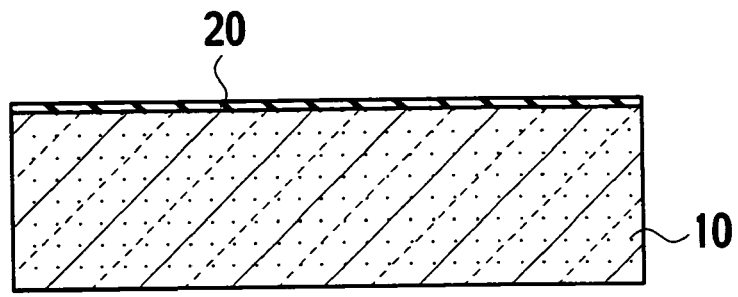
FIG. 3A is a schematic process cross-section of elements in a low-voltage circuit region in a nonvolatile semiconductor memory fabrication method, according to the first embodiment of the present invention.
Figure 3B:
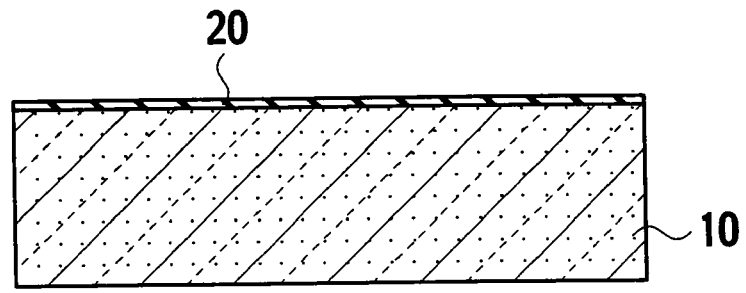
FIG. 3B is a schematic process cross-section of elements in a high-voltage circuit region in the nonvolatile semiconductor memory fabrication method, according to the first embodiment of the present invention.
Figure 3C:
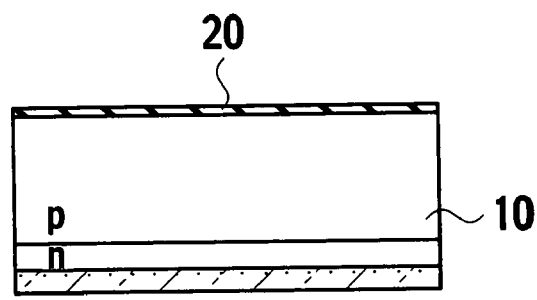
FIG. 3C is a schematic cross-section of elements in a cell array region cut along a line perpendicular to the word line length, according to the nonvolatile semiconductor memory fabrication method of the first embodiment of the present invention.
Figure 3D:
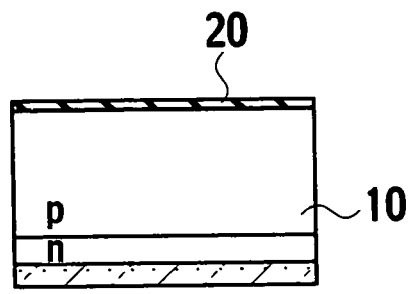
FIG. 3D a schematic cross-section of elements in a cell array region cut along a line perpendicular to the bit line length, according to the nonvolatile semiconductor memory fabrication method of the first embodiment of the present invention.
Figure 4A:
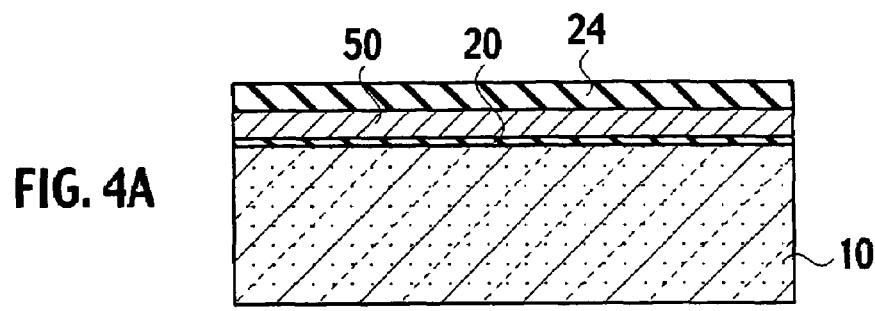
FIG. 4A is a process cross-section of elements in the low-voltage circuit region fabricated in a processing step of the nonvolatile semiconductor memory fabrication method of the first embodiment of the present invention subsequent to that shown in FIG. 3A.
Figure 4B:
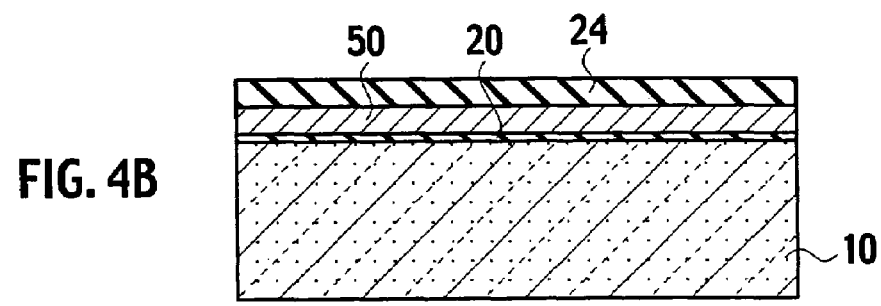
FIG. 4B is a process cross-section of elements in the high-voltage circuit region fabricated in a processing step of the nonvolatile semiconductor memory fabrication method, according to the first embodiment of the present invention, subsequent to that shown in FIG. 3B.
Figure 4C:
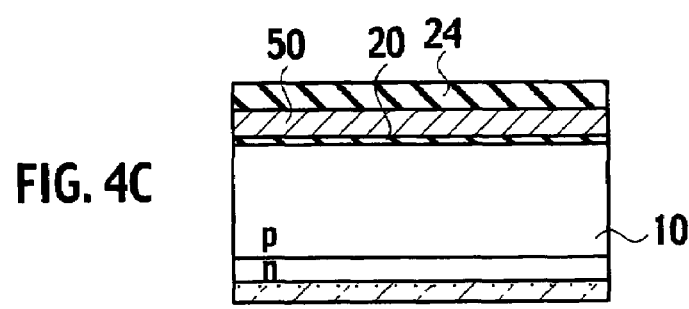
FIG. 4C is a process cross-section of elements in the cell array region fabricated in a processing step of the nonvolatile semiconductor memory fabrication method, according to the first embodiment of the present invention, subsequent to that shown in FIG. 3C.
Figure 4D:
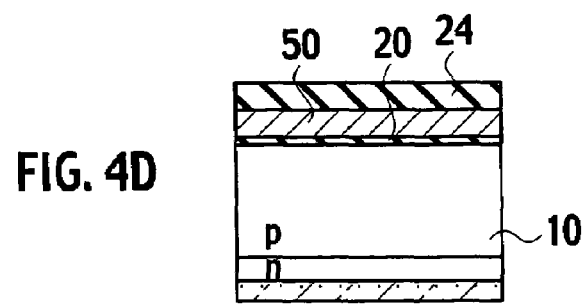
FIG. 4D is a process cross-section of elements in the cell array region fabricated in a processing step of the nonvolatile semiconductor memory fabrication method, according to the first embodiment of the present invention, subsequent to that shown in FIG. 3D.
Figure 5A:
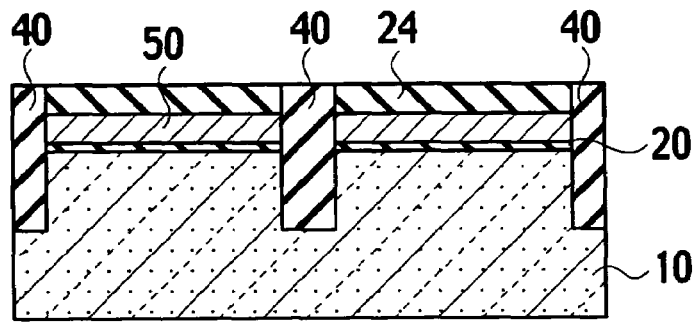
FIG. 5A is a process cross-section of elements in the low-voltage circuit region fabricated in a processing step of the nonvolatile semiconductor memory fabrication method, according to the first embodiment of the present invention, subsequent to that shown in FIG. 4A.
Figure 5B:
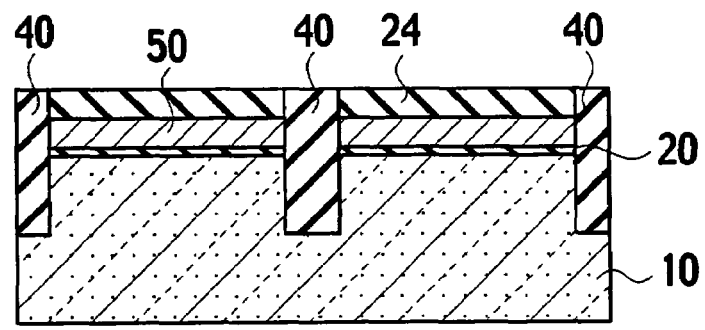
FIG. 5B is a process cross-section of elements in the high-voltage circuit region fabricated in a processing step of the nonvolatile semiconductor memory fabrication method, according to the first embodiment of the present invention, subsequent to that shown in FIG. 4B.
Figure 5C:
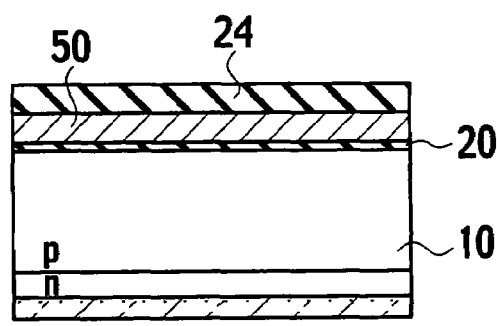
FIG. 5C is a process cross-section of elements in the cell array region fabricated in a processing step of the nonvolatile semiconductor memory fabrication method, according to the first embodiment of the present invention, subsequent to that shown in FIG. 4C.
Figure 5D:
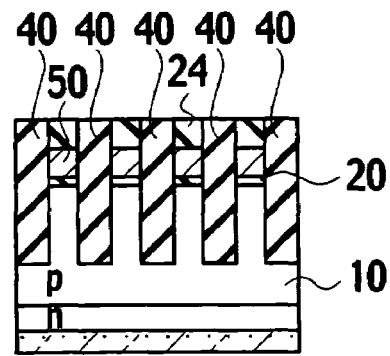
FIG. 5D is a process cross-section of elements in the cell array region fabricated in a processing step of the nonvolatile semiconductor memory fabrication method, according to the first embodiment of the present invention, subsequent to that shown in FIG. 4D.
Figure 6A:
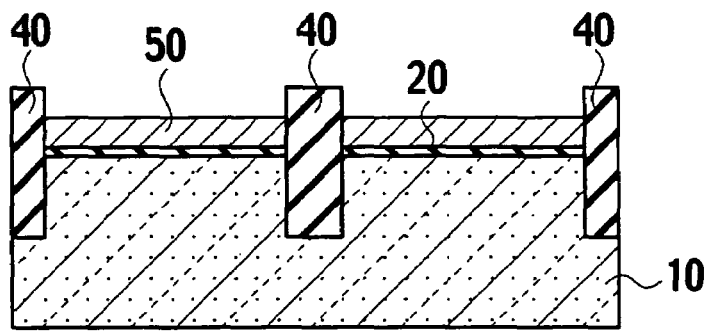
FIG. 6A is a process cross-section of elements in the low-voltage circuit region fabricated in a processing step of the nonvolatile semiconductor memory fabrication method, according to the first embodiment of the present invention, subsequent to that shown in FIG. 5A.
Figure 6B:
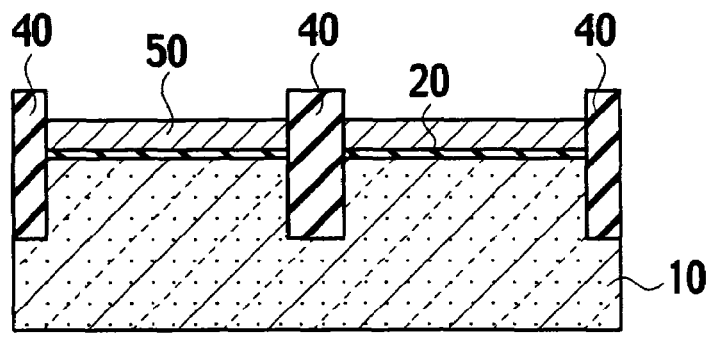
FIG. 6B is a process cross-section of elements in the high-voltage circuit region fabricated in a processing step of the nonvolatile semiconductor memory fabrication method, according to the first embodiment of the present invention, subsequent to that shown in FIG. 5B.
Figure 6C:
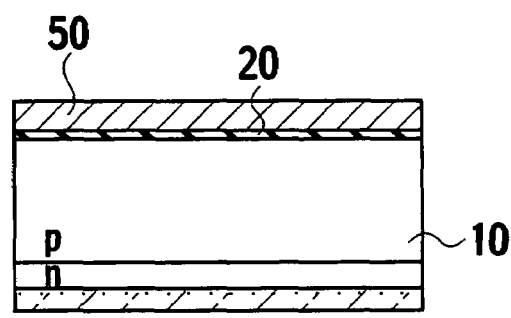
FIG. 6C is a process cross-section of elements in the cell array region fabricated in a processing step of the nonvolatile semiconductor memory fabrication method, according to the first embodiment of the present invention, subsequent to that shown in FIG. 5C.
Figure 6D:
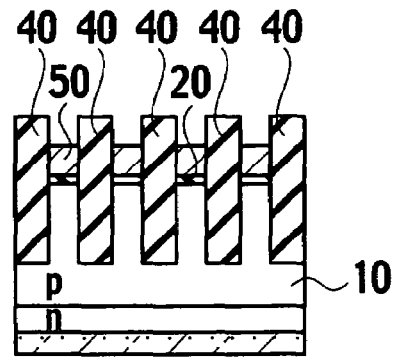
FIG. 6D is a process cross-section of elements in the cell array region fabricated in a processing step of the nonvolatile semiconductor memory fabrication method, according to the first embodiment of the present invention, subsequent to that shown in FIG. 5D.
Figure 7A:
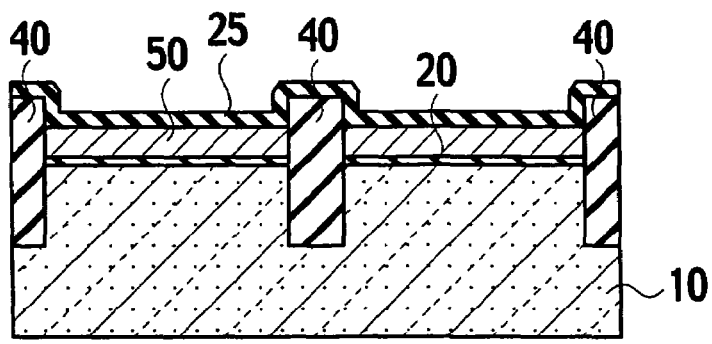
FIG. 7A is a process cross-section of elements in the low-voltage circuit region fabricated in a processing step of the nonvolatile semiconductor memory fabrication method, according to the first embodiment of the present invention, subsequent to that shown in FIG. 6A.
Figure 7B:
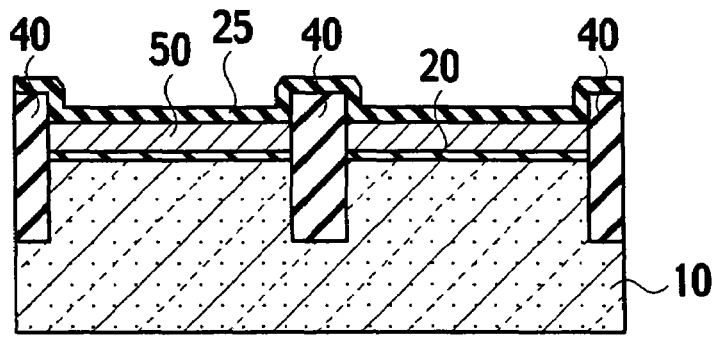
FIG. 7B is a process cross-section of elements in the high-voltage circuit region fabricated in a processing step of the nonvolatile semiconductor memory fabrication method, according to the first embodiment of the present invention, subsequent to that shown in FIG. 6B.
Figure 7C:
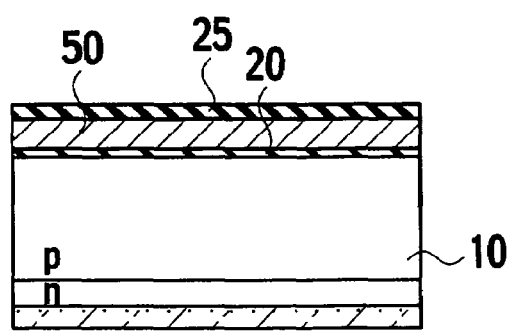
FIG. 7C is a process cross-section of elements in the cell array region fabricated in a processing step of the nonvolatile semiconductor memory fabrication method, according to the first embodiment of the present invention, subsequent to that shown in FIG. 6C.
Figure 7D:
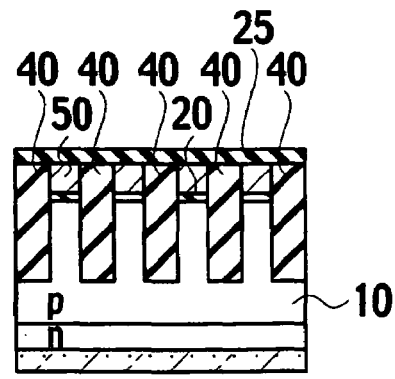
FIG. 7D is a process cross-section of elements in the cell array region fabricated in a processing step of the nonvolatile semiconductor memory fabrication method, according to the first embodiment of the present invention, subsequent to that shown in FIG. 6D.

As shown in FIGS. 2A through 2C, the nonvolatile semiconductor memory according to the first embodiment includes the cell array region 120 in which aligned memory cell transistors made up of control gate electrodes 74 including metal silicide films 53, inter-gate insulating films 25 below the control gate electrodes 74, and floating gate electrodes 73 below the inter-gate insulating films 25. A tunnel insulating film 20 is deployed under the floating gate electrodes 73. The nonvolatile semiconductor memory also includes the high-voltage circuit regions 90a, 90b, 90c, and 90d arranged in the periphery of the cell array region 120 and including a first gate insulating film 21 thicker than the tunnel insulating film 20; and the low-voltage circuit regions 80a, 80b, 80c, and 80d arranged in the periphery of the cell array region 120 in different positions than the high-voltage circuit regions 90a, 90b, 90c, and 90d and including a second gate insulating film 22 thinner than the first gate insulating film 21. Tunnel insulating films or liner insulating films are formed directly on source regions and drain regions of the respective memory cell transistors, high-voltage transistors, and low-voltage transistors. With the nonvolatile semiconductor memory according to the first embodiment, the memory transistors have a stacked gate structure, however the transistors in the peripheral high-voltage circuit regions 90a, 90b, 90c, and 90d and low-voltage circuit regions 80a, 80b, 80c, and 80d all have a single-layer gate structure. Since the transistors in the high-voltage circuit regions 90a, 90b, 90c, and 90d operate at a high voltage, forming silicide on diffusion layers and making low-resistance diffusion layers may be a cause of leakage current, which is not desired. By not forming silicide on the diffusion layers with the nonvolatile semiconductor memory according to the first embodiment, formation of transistors operating at a high voltage without any leakage current is possible.

As shown in FIG. 2C, for example, the cell array region 120 includes memory cell transistors, which include a semiconductor substrate 10, n-well regions and p-well regions formed in the semiconductor substrate 10, the tunnel insulating films 20 arranged on the semiconductor substrate 10, the floating gate electrodes 73 arranged on the tunnel insulating films 20, the inter-gate insulating films 25 working as interlayer insulating films, the control gate electrodes 74 arranged on the inter-gate insulating films 25, and the metal silicide films 53 electrically in contact with the tops of the control gate electrodes 74. Furthermore, the cell array region 120 includes select gate transistors, which include select gate electrodes 72 for selecting respective cells including the floating gate electrodes 73 and the control gate electrodes 74. Since the control gate electrodes 74 correspond to word lines, the metal silicide films 53 constitute the word lines.

As shown in FIG. 2A, the low-voltage circuit regions 80a, 80b, 80c, and 80d respectively have, for example, a p-well region and n-well regions formed in the semiconductor substrate 10, and include an nMOS transistor formed in the p-well region and pMOS transistors formed in the n-well regions. The structure of the nMOS transistors in the low-voltage circuit regions 80a, 80b, 80c, and 80d includes, for example, the semiconductor substrate 10, an element isolating region (STI) 40, the p-well region formed in the semiconductor substrate 10, the second gate insulating film 22, the gate electrode 70 arranged on the second gate insulating film 22, $n^+$ source/drain regions that are to be either a source region or a drain region, n regions that serve as electric field relaxation layers deployed adjacent to the $n^+$ source/drain regions, and the metal silicide films 53 arranged on the $n^+$ source/drain regions and the gate electrode 70 in electrical contact therewith. Similarly, the structure of the pMOS transistor of the low-voltage circuit regions 80a, 80b, 80c, and 80d includes, for example, the semiconductor substrate 10, the STI 40, n-well regions formed in the semiconductor substrate 10, the second gate insulating film 22, the gate electrode 70 arranged on the second gate insulating film 22, $p^+$ source/drain regions that are to be either a second source region or a drain region, a p region that serves as an electric field relaxation layer deployed adjacent to the $p^+$ source/drain regions, and the metal silicide films 53 arranged on the $p^+$ source/drain regions and the gate electrode 70 in electrical contact therewith.

As shown in FIG. 2B, the high-voltage circuit regions 90a, 90b, 90c, and 90d each have, for example, a p-well region and n-well regions formed in the semiconductor substrate 10, and include an nMOS transistor formed in the p-well region and pMOS transistors formed in the n-well regions. The structure of the nMOS transistors in the high-voltage circuit regions 90a, 90b, 90c, and 90d includes, for example, the STI 40, the p-well region formed in the semiconductor substrate 10, the first gate insulating film 21, the gate electrode 71 arranged on the first gate insulating film 21, $n^+$ source/drain regions that are to be either a source region or a drain region, n regions that serve as electric field relaxation layers deployed adjacent to the $n^+$ source/drain regions, and the metal silicide films 53 arranged on the $n^+$ source/drain regions and the gate electrode 71 in electrical contact therewith. Similarly, the structure of the pMOS transistors in the high-voltage circuit regions 90a, 90b, 90c, and 90d includes, for example, the semiconductor substrate 10, the STI 40, n-well regions formed in the semiconductor substrate 10, the first gate insulating film 21, the gate electrode 71 arranged on the first gate insulating film 21, $p^+$ source/drain regions that are to be either a second source region or a drain region, a p region that serves as an electric field relaxation layer deployed adjacent to the $p^+$ source/drain regions, and the metal silicide films 53 arranged on the $p^+$ source/drain regions and the gate electrode 71 in electrical contact therewith.

A nonvolatile semiconductor memory fabricating process according to the first embodiment is described while referencing FIGS. 2 through 22. FIGS. 2A through 22A show schematic cross sections of a transistor in the low-voltage circuit regions 80a, 80b, 80c, and 80d. FIGS. 2B through 22B show schematic cross sections of a transistor in the high-voltage circuit regions 90a, 90b, 90c, and 90d. FIGS. 2C through 22C are cross-sections cut along a line perpendicular to the word line length of a memory cell transistor. FIGS. 3D through 11D are cross sections cut along a line perpendicular to the bit line length of the memory cell transistor.

(a) First, ions are implanted in the cell array region 120, preparing the semiconductor substrate 10 in which wells are formed. As shown in FIGS. 3A through 3D, the semiconductor substrate 10 is exposed to a high-temperature oxidized atmosphere, growing the tunnel insulating film 20 on the semiconductor substrate 10. As shown in FIGS. 4A through 4D, a floating gate electrode layer 50, which is to be floating gate electrode material for the memory cell transistor, is deposited on the tunnel insulating film 20, and a stopper film 24 is then deposited on the floating gate electrode layer 50. The stopper film 24 acts as a stopper for polishing and planarizing the surface by chemical and mechanical polishing (CMP).

(b) Next, as shown in FIGS. 5A through 5D, the element isolating regions (STI) 40 for the transistors are formed in the low-voltage circuit regions 80a, 80b, 80c, and 80d, the high-voltage circuit regions 90a, 90b, 90c, and 90d, and the cell array region 120 by lithography and etching. Once the STIs 40 are formed, the stopper film 24 is removed, as shown in FIGS. 6A through 6D.

Figure 8A:
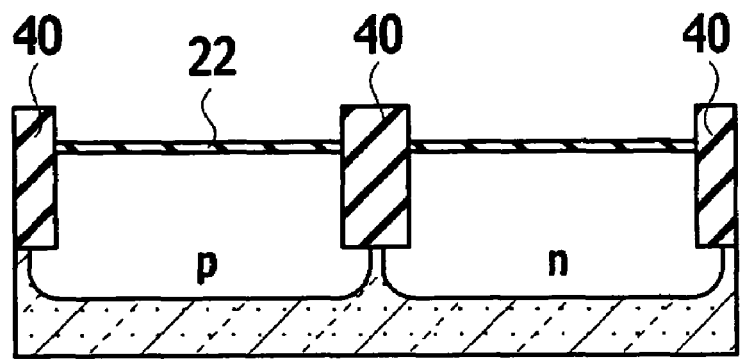
FIG. 8A is a process cross-section of elements in the low-voltage circuit region fabricated in a processing step of the nonvolatile semiconductor memory fabrication method, according to the first embodiment of the present invention, subsequent to that shown in FIG. 7A.
Figure 8B:
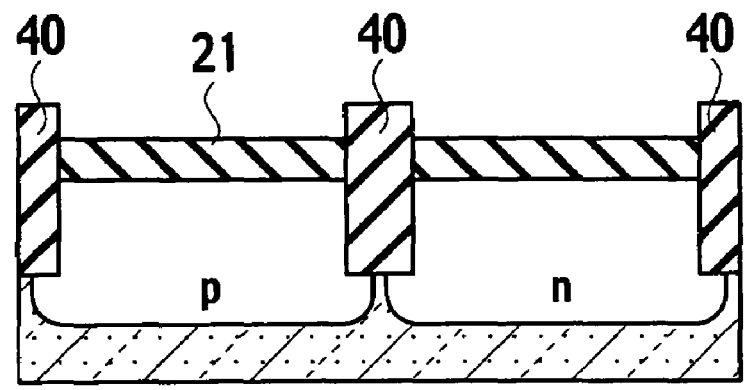
FIG. 8B is a process cross-section of elements in the high-voltage circuit region fabricated in a processing step of the nonvolatile semiconductor memory fabrication method, according to the first embodiment of the present invention, subsequent to that shown in FIG. 7B.
Figure 8C:
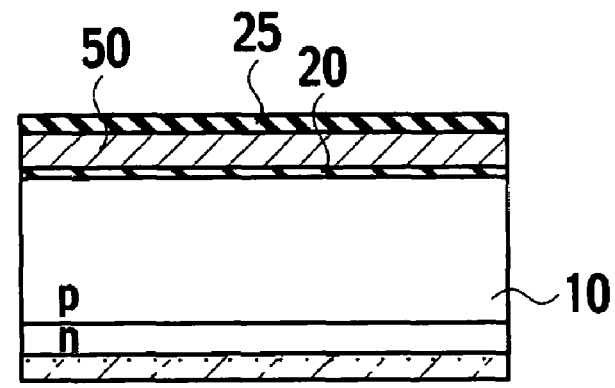
FIG. 8C is a process cross-section of elements in the cell array region fabricated in a processing step of the nonvolatile semiconductor memory fabrication method, according to the first embodiment of the present invention, subsequent to that shown in FIG. 7C.
Figure 9A:
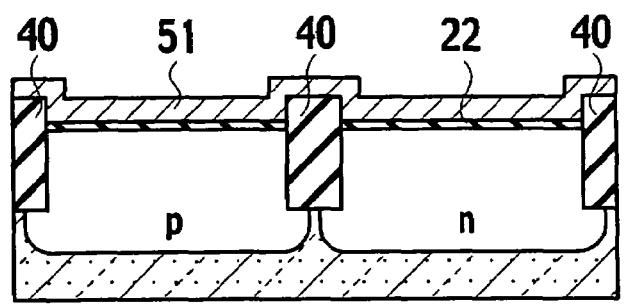
FIG. 9A is a process cross-section of elements in the low-voltage circuit region fabricated in a processing step of the nonvolatile semiconductor memory fabrication method, according to the first embodiment of the present invention, subsequent to that shown in FIG. 8A.
Figure 9B:
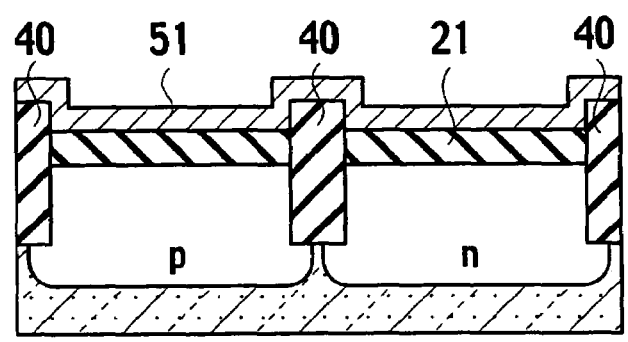
FIG. 9B is a process cross-section of elements in the high-voltage circuit region fabricated in a processing step of the nonvolatile semiconductor memory fabrication method, according to the first embodiment of the present invention, subsequent to that shown in FIG. 8B.
Figure 9C:
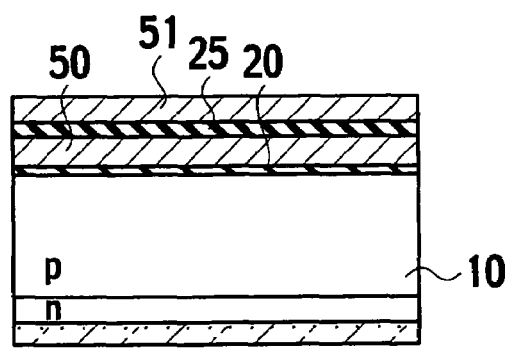
FIG. 9C is a process cross-section of elements in the cell array region fabricated in a processing step of the nonvolatile semiconductor memory fabrication method, according to the first embodiment of the present invention, subsequent to that shown in FIG. 8C.
Figure 9D:
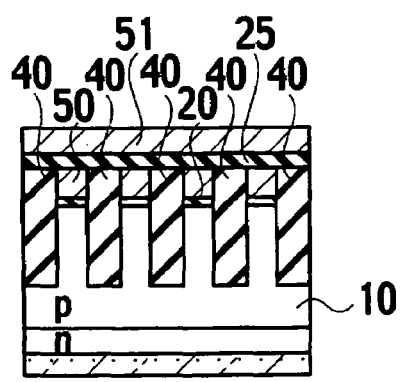
FIG. 9D is a process cross-section of elements in the cell array region fabricated in a processing step of the nonvolatile semiconductor memory fabrication method, according to the first embodiment of the present invention, subsequent to that shown in FIG. 8D.

(c) Next, as shown in FIGS. 7A through 7D, the inter-gate insulating film 25, which is to be interlayer insulating films of the memory cell transistors, is deposited across the entirety of the low-voltage circuit regions 80a, 80b, 80c, and 80d, the high-voltage circuit regions 90a, 90b, 90c, and 90d, and the cell array region 120. As shown in FIGS. 8A and 8B, the floating gate electrode layer 50, the inter-gate insulating film 25, and the tunnel insulating film 20 on the low-voltage circuit regions 80a, 80b, 80c, and 80d and the high-voltage circuit regions 90a, 90b, 90c, and 90d are removed. Once the floating gate electrode layer 50, the inter-gate insulating film 25, and the tunnel insulating film 20 are removed, the first gate insulating film 21 is grown only on the high-voltage circuit regions 90a, 90b, 90c, and 90d by lithography, as shown in FIG. 8B. Once the first gate insulating film 21 is formed, a mask on the low-voltage circuit regions 80a, 80b, 80c, and 80d and the cell array region 120 is removed by etching. On the other hand, the second gate insulating film 22, which is thinner than the first gate insulating film 21, is grown only on the low-voltage circuit regions 80a, 80b, 80c, and 80d by lithography, as shown in FIG. 8A. Once the second gate insulating film 22 is formed, a mask on the high-voltage circuit regions 90a, 90b, 90c, and 90d and the cell array region 120 is removed by etching. Although forming the second gate insulating film 22 after formation of the first gate insulating film 21 is described here as an example, the formation order may be reversed. Atoms are then implanted in the semiconductor substrate 10, forming an n-well region and a p-well region as shown in FIGS. 8A and 8B.

Figure 10A:
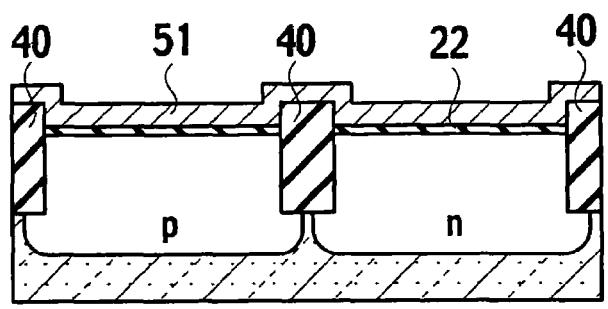
FIG. 10A is a process cross-section of elements in the low-voltage circuit region fabricated in a processing step of the nonvolatile semiconductor memory fabrication method, according to the first embodiment of the present invention, subsequent to that shown in FIG. 9A.
Figure 10B:
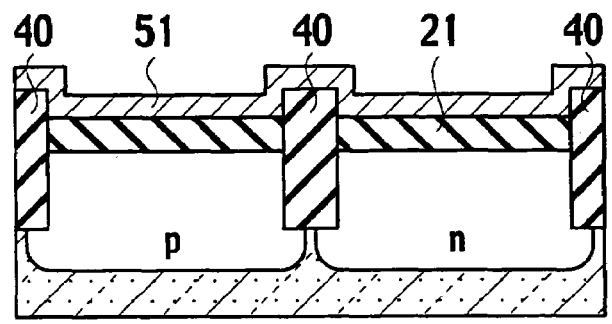
FIG. 10B is a process cross-section of elements in the high-voltage circuit region fabricated in a processing step of the nonvolatile semiconductor memory fabrication method, according to the first embodiment of the present invention, subsequent to that shown in FIG. 9B.
Figure 10C:
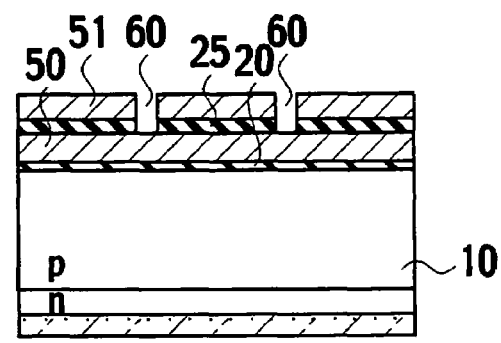
FIG. 10C is a process cross-section of elements in the cell array region fabricated in a processing step of the nonvolatile semiconductor memory fabrication method, according to the first embodiment of the present invention, subsequent to that shown in FIG. 9C.
Figure 10D:
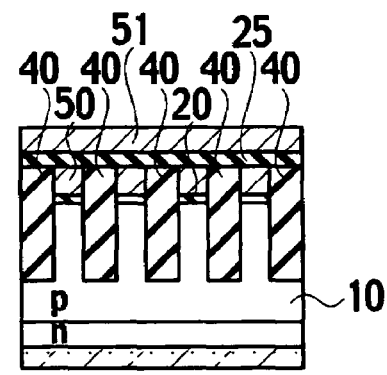
FIG. 10D is a process cross-section of elements in the cell array region fabricated in a processing step of the nonvolatile semiconductor memory fabrication method, according to the first embodiment of the present invention, subsequent to that shown in FIG. 9D.
Figure 11A:
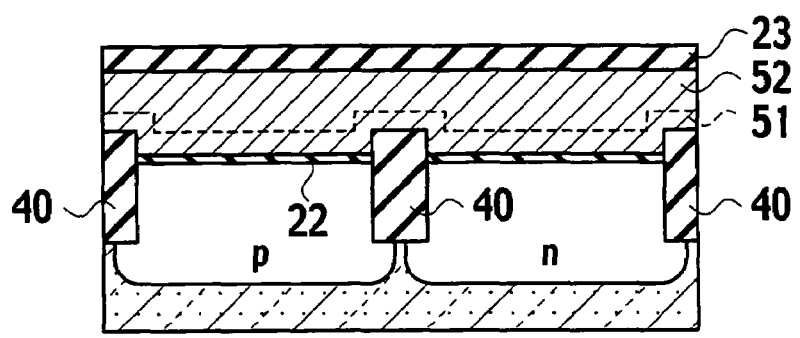
FIG. 11A is a process cross-section of elements in the low-voltage circuit region fabricated in a processing step of the nonvolatile semiconductor memory fabrication method, according to the first embodiment of the present invention, subsequent to that shown in FIG. 10A.
Figure 11B:
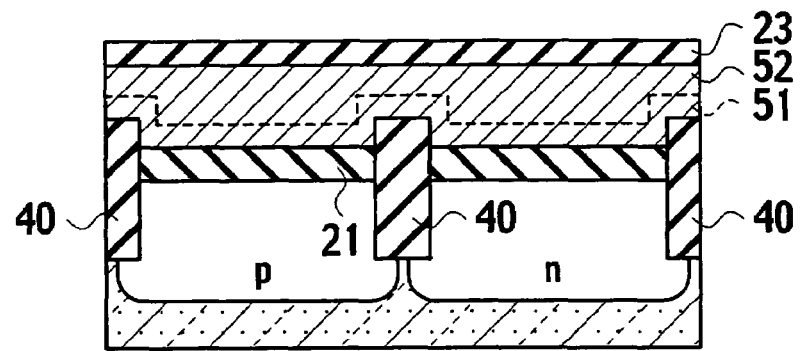
FIG. 11B is a process cross-section of elements in the high-voltage circuit region fabricated in a processing step of the nonvolatile semiconductor memory fabrication method, according to the first embodiment of the present invention, subsequent to that shown in FIG. 10B.
Figure 11C:
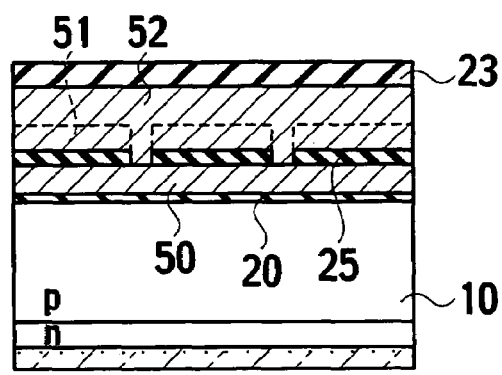
FIG. 11C is a process cross-section of elements in the cell array region fabricated in a processing step of the nonvolatile semiconductor memory fabrication method, according to the first embodiment of the present invention, subsequent to that shown in FIG. 10C.
Figure 11D:
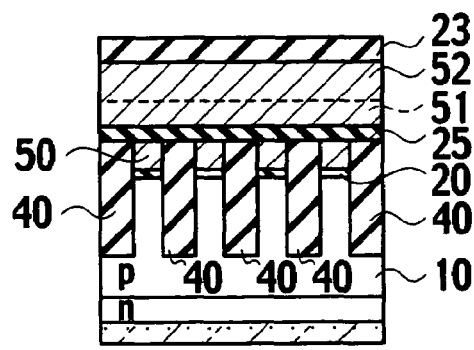
FIG. 11D is a process cross-section of elements in the cell array region fabricated in a processing step of the nonvolatile semiconductor memory fabrication method, according to the first embodiment of the present invention, subsequent to that shown in FIG. 10D.

(d) Next, as shown in FIGS. 9A through 9D, a first gate electrode layer 51, which is to be the gate electrodes of transistors in the peripheral low-voltage circuit regions 80a, 80b, 80c, and 80d and high-voltage circuit regions 90a, 90b, 90c, and 90d and the control gate electrodes of memory cell transistors and select gate electrodes of select gate transistors in the cell array region 120, is deposited. Openings 60 for electrically connecting the floating gate electrode and the control gate electrode are formed in parts of the cell array region 120 where the select gate transistors of the memory cells are to be deployed, by lithography and etching, as shown in FIG. 10C. Furthermore, as shown in FIGS. 11A through 11D, a second gate electrode layer 52, which is the same material as that of the first gate electrode layer 51, is deposited on the first gate electrode layer 51 so as to fill in the openings 60. A masking material 23, used for forming a gate electrode, is then deposited on the second gate electrode layer 52. The first gate electrode layer 51 and the second gate electrode layer 52, both made of the same material, are deposited in two separate steps due to concern of contamination of the inter-gate insulating film 25 when depositing a resist on the inter-gate insulating film 25 for lithography. Contamination of the inter-gate insulating film 25 is prevented by depositing a resist on the first gate electrode layer 51 and forming the openings 60 in the inter-gate insulating film 25.

Figure 12A:
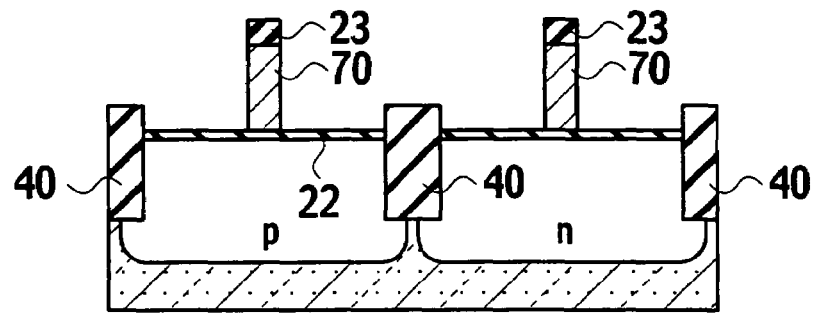
FIG. 12A is a process cross-section of elements in the low-voltage circuit region fabricated in a processing step of the nonvolatile semiconductor memory fabrication method, according to the first embodiment of the present invention, subsequent to that shown in FIG. 11A.
Figure 12B:
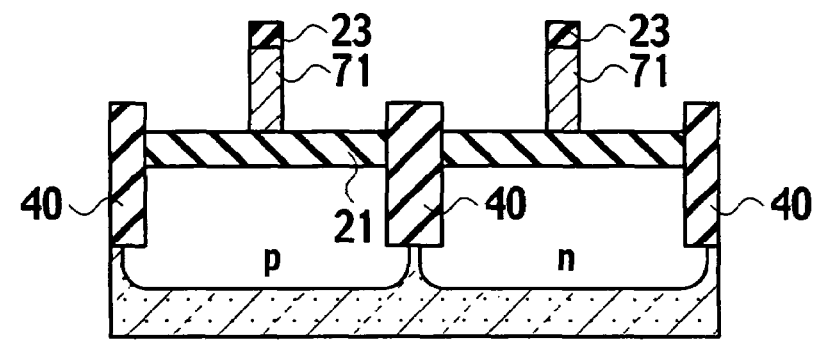
FIG. 12B is a process cross-section of elements in the high-voltage circuit region fabricated in a processing step of the nonvolatile semiconductor memory fabrication method, according to the first embodiment of the present invention, subsequent to that shown in FIG. 11B.
Figure 12C:
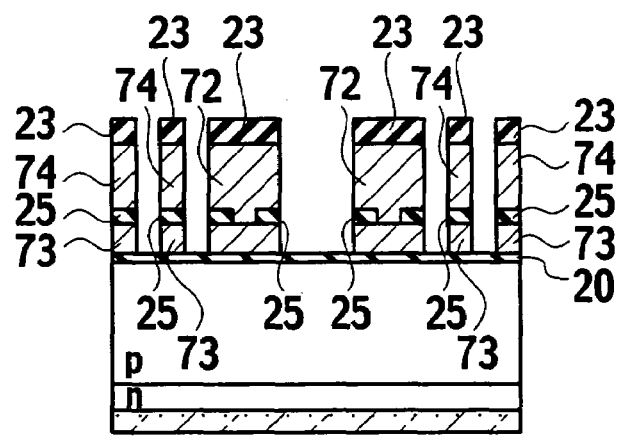
FIG. 12C is a process cross-section of elements in the cell array region fabricated in a processing step of the nonvolatile semiconductor memory fabrication method, according to the first embodiment of the present invention, subsequent to that shown in FIG. 11C.
Figure 12D:
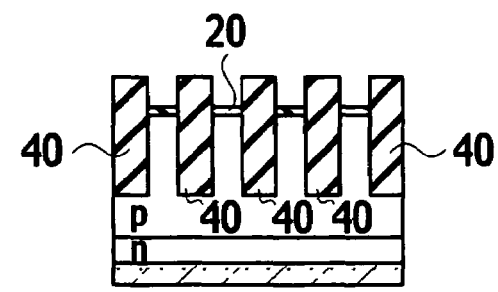
FIG. 12D is a process cross-section of elements in the cell array region fabricated in a processing step of the nonvolatile semiconductor memory fabrication method, according to the first embodiment of the present invention, subsequent to that shown in FIG. 11D.

(e) Next, as shown in FIGS. 12A and 12B, the gate electrodes 70 and 71 of the respective transistors in the respective peripheral low-voltage circuit regions 80a, 80b, 80c, and 80d and high-voltage circuit regions 90a, 90b, 90c, and 90d are formed by lithography and etching. Furthermore, as shown in FIGS. 12C and 12D, memory cells, which are made up of thick select gate electrodes 72, floating gate electrodes 73, and control gate electrodes 74 in the cell array region 120, being adjacent to one another via the inter-gate insulating films 25, and extending along a line perpendicular to the word line length, are formed and the floating gate electrodes 73 and the corresponding control gate electrodes 74 are electrically connected. The low-voltage circuit regions 80a, 80b, 80c, and 80d and high-voltage circuit regions 90a, 90b, 90c, and 90d in the following processing steps show only the p-well region as the n-well region and the p-well region are similar. In addition, since there is little change in cross-sections cut along a line perpendicular to the bit line length of the memory cell transistors and little change in the semiconductor substrate 10, such descriptions are thus omitted from the drawings.

Figure 13A:
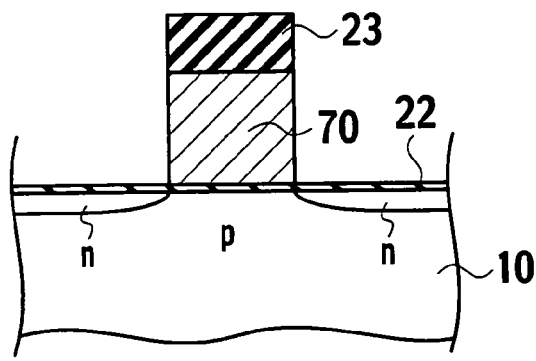
FIG. 13A is a process cross-section of elements in the low-voltage circuit region fabricated in a processing step of the nonvolatile semiconductor memory fabrication method, according to the first embodiment of the present invention, subsequent to that shown in FIG. 12A.
Figure 13B:
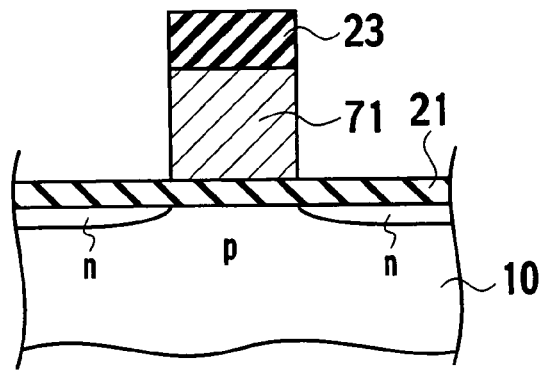
FIG. 13B is a process cross-section of elements in the high-voltage circuit region fabricated in a processing step of the nonvolatile semiconductor memory fabrication method, according to the first embodiment of the present invention, subsequent to that shown in FIG. 12B.
Figure 13C:
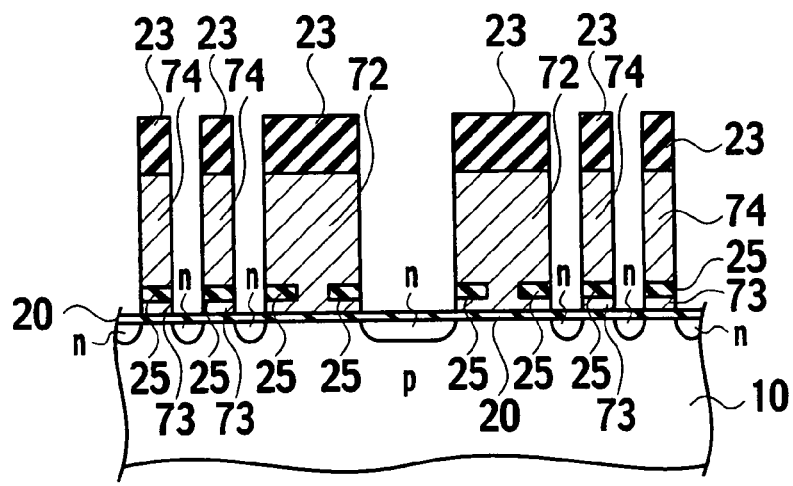
FIG. 13C is a process cross-section of elements in the cell array region fabricated in a processing step of the nonvolatile semiconductor memory fabrication method, according to the first embodiment of the present invention, subsequent to that shown in FIG. 12C.
Figure 14A:
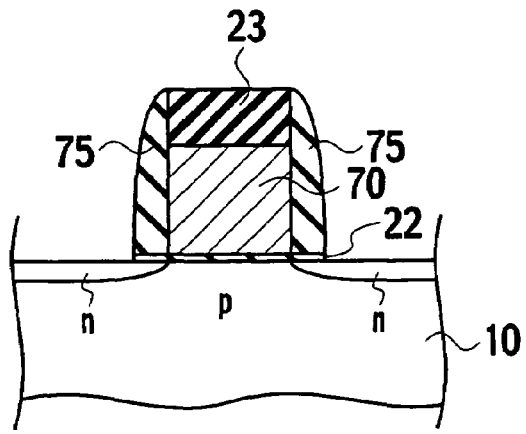
FIG. 14A is a process cross-section of elements in the low-voltage circuit region fabricated in a processing step of the nonvolatile semiconductor memory fabrication method, according to the first embodiment of the present invention, subsequent to that shown in FIG. 13A.
Figure 14B:
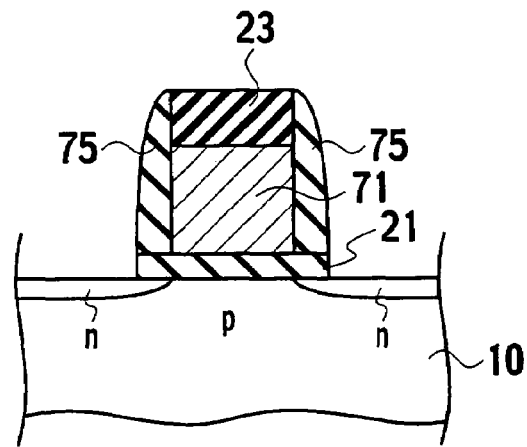
FIG. 14B is a process cross-section of elements in the high-voltage circuit region fabricated in a processing step of the nonvolatile semiconductor memory fabrication method, according to the first embodiment of the present invention, subsequent to that shown in FIG. 13B.
Figure 14C:
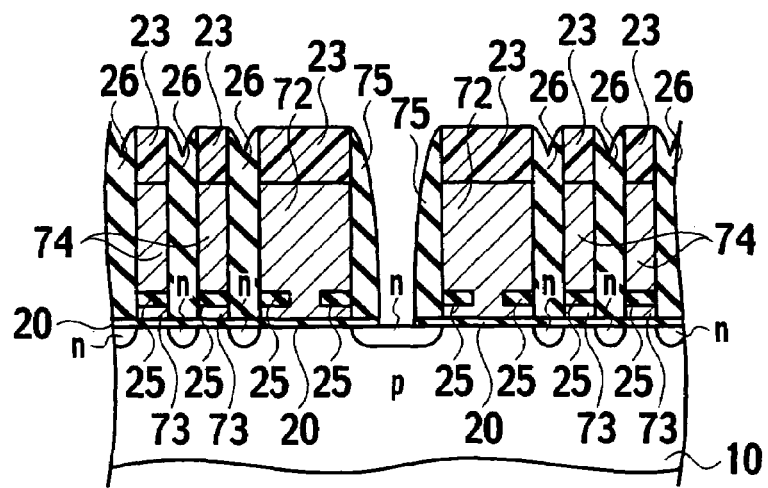
FIG. 14C is a process cross-section of elements in the cell array region fabricated in a processing step of the nonvolatile semiconductor memory fabrication method, according to the first embodiment of the present invention, subsequent to that shown in FIG. 13C.

(f) Next, group V atoms, such as phosphorous (P) arsenic (As), or antimony (Sb), are implanted in the semiconductor substrate 10 to form an n diffusion layer, as shown in FIGS. 13A through 13C. As shown in FIGS. 14A through 14C, inter-gate embedding insulator films 26 are then deposited. At this time, as shown in FIG. 14C, the inter-gate embedding insulator films 26 are embedded in between the control gate electrodes 74 of the memory cell transistors. Etched-back gate sidewall insulating films 75 are formed on sidewalls of the gate electrodes 70 of the low-voltage transistors in the peripheral low-voltage circuit regions 80a, 80b, 80c, and 80d, sidewalls of the gate electrodes 71 of the high-voltage transistors in the high-voltage circuit regions 90a, 90b, 90c, and 90d, and sidewalls of the select gate electrodes 72 of the select gate transistors. At this time, generation of a void between the control gate electrodes 74 of the memory cell transistor is prevented.

(g) Next, the same impurity as the diffusion layer between the select gate electrodes 72 is implanted using the gate sidewall insulating films 75 of the select gate electrodes 72, shown in FIG. 14C, to form an $n^+$ diffusion layer, as shown in FIG. 15C. Similarly, the same impurity as the diffusion layer is implanted near the gate electrodes 70 and 71 of the transistors in the low-voltage circuit regions 80a, 80b, 80c, and 80d and high-voltage circuit regions 90a, 90b, 90c, and 90d, to form $n^+$ diffusion layers, as shown in FIGS. 15A and 15B.

Figure 16A:
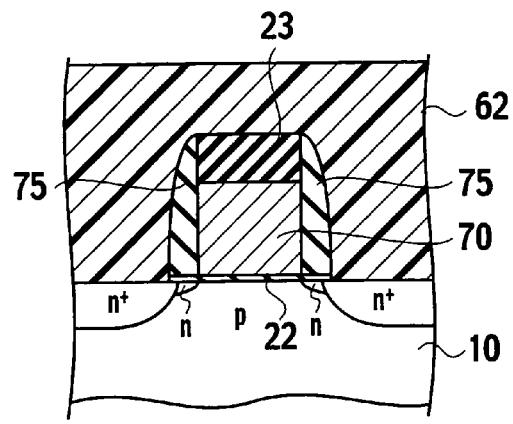
FIG. 16A is a process cross-section of elements in the low-voltage circuit region fabricated in a processing step of the nonvolatile semiconductor memory fabrication method, according to the first embodiment of the present invention, subsequent to that shown in FIG. 15A.
Figure 16B:
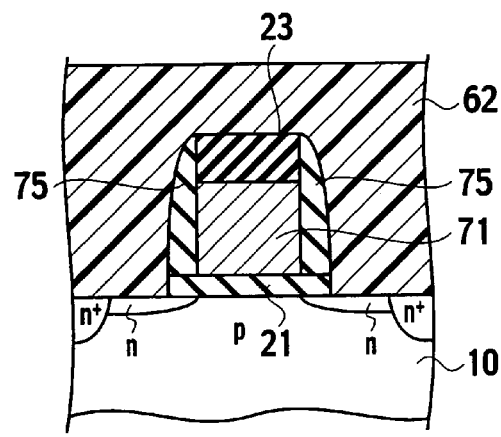
FIG. 16B is a process cross-section of elements in the high-voltage circuit region fabricated in a processing step of the nonvolatile semiconductor memory fabrication method, according to the first embodiment of the present invention, subsequent to that shown in FIG. 15B.
Figure 16C:
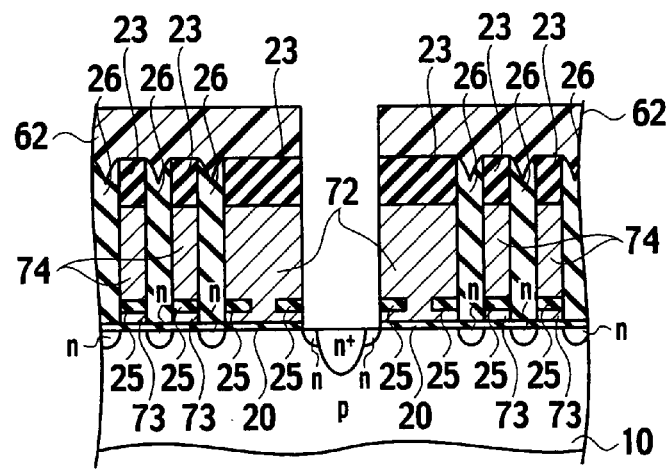
FIG. 16C is a process cross-section of elements in the cell array region fabricated in a processing step of the nonvolatile semiconductor memory fabrication method, according to the first embodiment of the present invention, subsequent to that shown in FIG. 15C.

(h) Next, as shown in FIGS. 16A through 16C, a resist 62 is deposited, and the part thereof between the select gate electrodes 72 is then removed by lithography. Gate sidewall insulating films 75 and tunnel insulating films 20 between the select gate electrodes 72 are then removed by etching using the resist 62 as a mask. Afterwards, the resist 62 is removed using a resist remover.

Figure 17A:
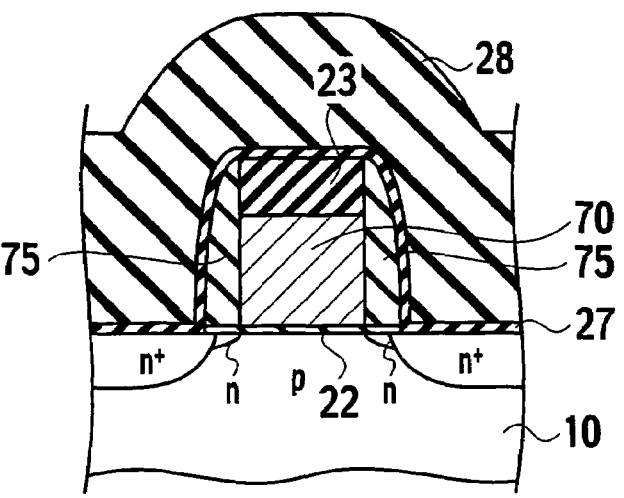
FIG. 17A is a process cross-section of elements in the low-voltage circuit region fabricated in a processing step of the nonvolatile semiconductor memory fabrication method, according to the first embodiment of the present invention, subsequent to that shown in FIG. 16A.
Figure 17B:
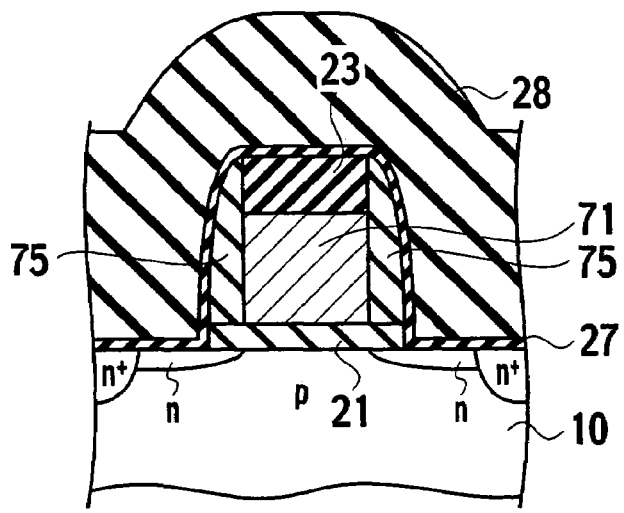
FIG. 17B is a process cross-section of elements in the high-voltage circuit region fabricated in a processing step of the nonvolatile semiconductor memory fabrication method, according to the first embodiment of the present invention, subsequent to that shown in FIG. 16B.
Figure 17C:
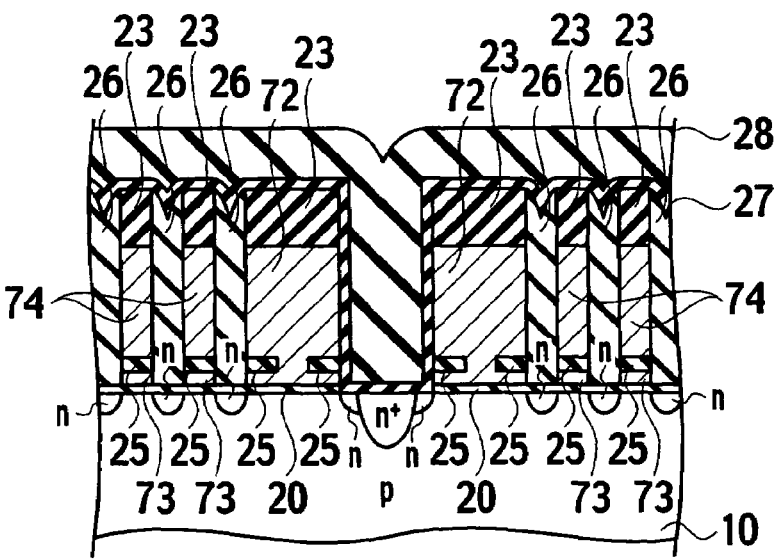
FIG. 17C is a process cross-section of elements in the cell array region fabricated in a processing step of the nonvolatile semiconductor memory fabrication method, according to the first embodiment of the present invention, subsequent to that shown in FIG. 16C.
Figure 18A:
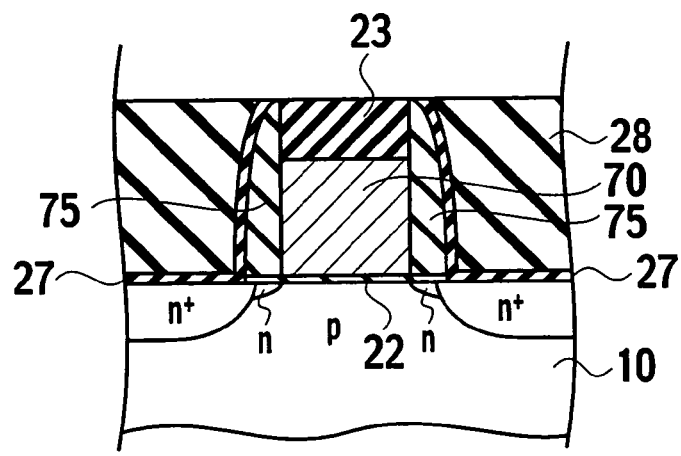
FIG. 18A is a process cross-section of elements in the low-voltage circuit region fabricated in a processing step of the nonvolatile semiconductor memory fabrication method, according to the first embodiment of the present invention, subsequent to that shown in FIG. 17B.
Figure 18B:
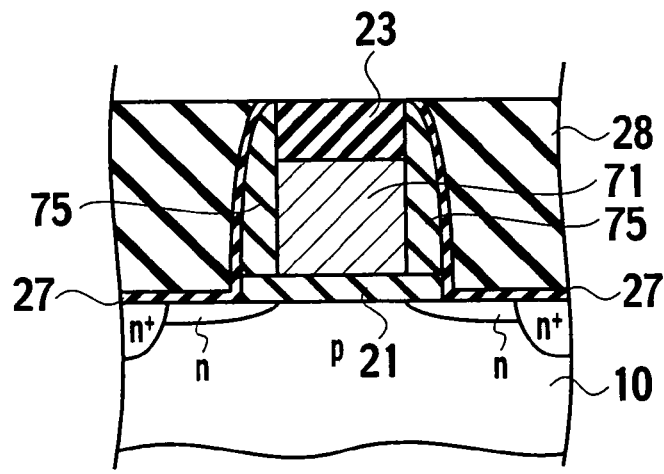
FIG. 18B is a process cross-section of elements in the high-voltage circuit region fabricated in a processing step of the nonvolatile semiconductor memory fabrication method, according to the first embodiment of the present invention, subsequent to that shown in FIG. 17B.
Figure 18C:
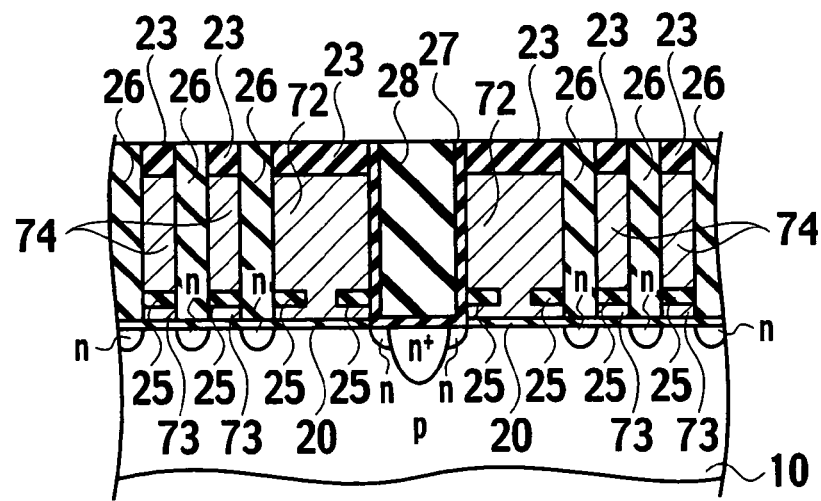
FIG. 18C is a process cross-section of elements in the cell array region fabricated in a processing step of the nonvolatile semiconductor memory fabrication method, according to the first embodiment of the present invention, subsequent to that shown in FIG. 17C.

(i) As shown in FIGS. 17A through 17C, a liner insulating film 27 of a silicon nitride film (SiN) or the like is deposited across the entirety of the device. The liner insulating film 27 stops etching for making contact. A first interlayer insulating film 28 is then deposited on the liner insulating film 27. Once the first interlayer insulating film 28 is deposited, CMP and then dry etching is carried out so as to planarize the first interlayer insulating film 28, as shown in FIGS. 18A through 18C.

Figure 19A:
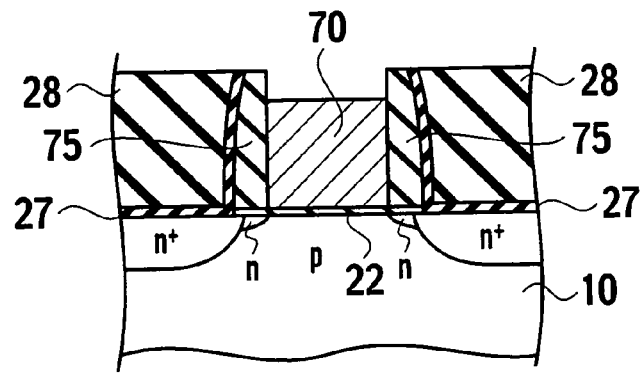
FIG. 19A is a process cross-section of elements in the low-voltage circuit region fabricated in a processing step of the nonvolatile semiconductor memory fabrication method, according to the first embodiment of the present invention, subsequent to that shown in FIG. 18A.
Figure 19B:
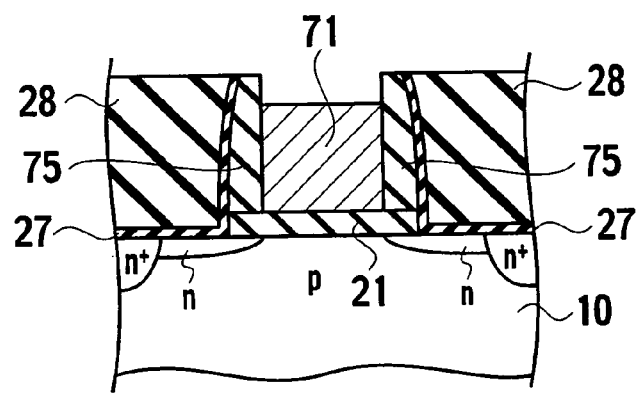
FIG. 19B is a process cross-section of elements in the high-voltage circuit region fabricated in a processing step of the nonvolatile semiconductor memory fabrication method, according to the first embodiment of the present invention, subsequent to that shown in FIG. 18B.
Figure 19C:
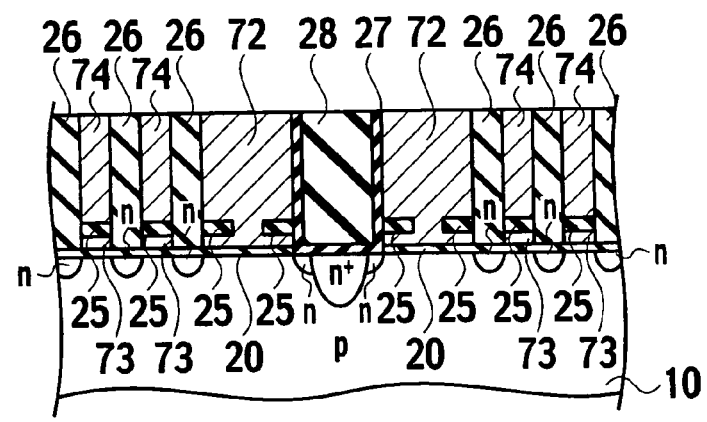
FIG. 19C is a process cross-section of elements in the cell array region fabricated in a processing step of the nonvolatile semiconductor memory fabrication method, according to the first embodiment of the present invention, subsequent to that shown in FIG. 18C.
Figure 20A:
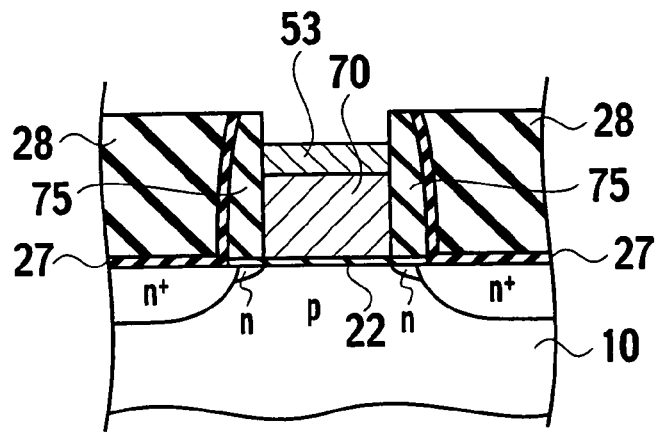
FIG. 20A is a process cross-section of elements in the low-voltage circuit region fabricated in a processing step of the nonvolatile semiconductor memory fabrication method, according to the first embodiment of the present invention, subsequent to that shown in FIG. 19A.
Figure 20B:
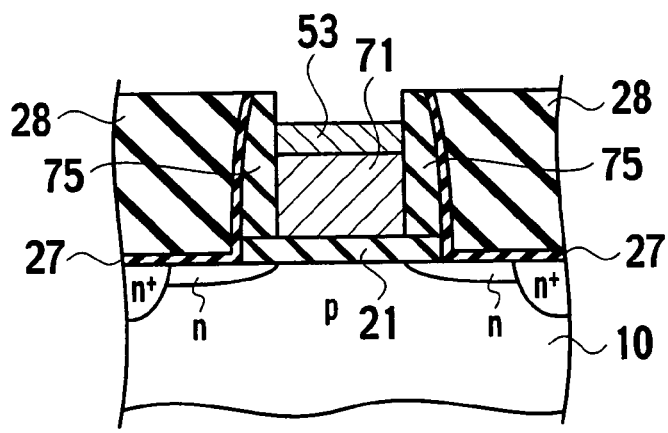
FIG. 20B is a process cross-section of elements in the high-voltage circuit region fabricated in a processing step of the nonvolatile semiconductor memory fabrication method, according to the first embodiment of the present invention, subsequent to that shown in FIG. 19B.
Figure 20C:
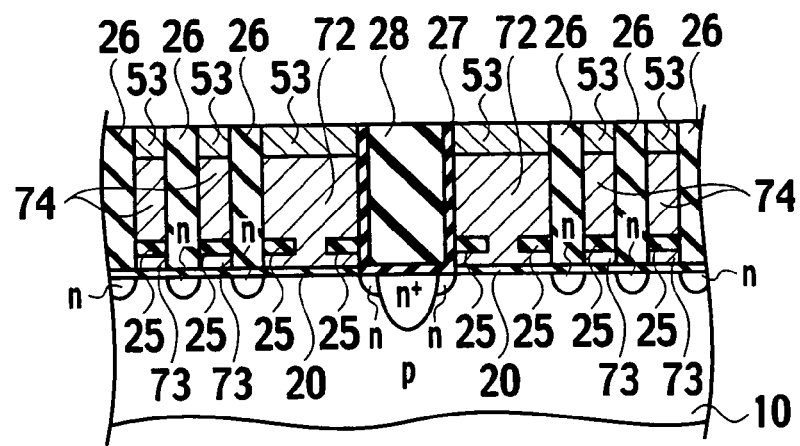
FIG. 20C is a process cross-section of elements in the cell array region fabricated in a processing step of the nonvolatile semiconductor memory fabrication method, according to the first embodiment of the present invention, subsequent to that shown in FIG. 19C.

(j) The masking material 23 is then removed by lithography, to form silicide forming regions, as shown in FIGS. 19A through 19C. Regions that are to be interconnects and resistors are masked with SiN or the like so that a silicide is not formed therein. As shown in FIGS. 20A through 20C, metal silicide films 53 are then formed only in the silicide forming regions in the gate electrodes. The metal silicide films 53 are formed across the entire surfaces of the respective gate electrodes or part thereof. The metal silicide films may be made of one of various silicides, such as cobalt silicide ($CoSi_2$) and nickel silicide ($NiSi_2$).

Figure 21A:
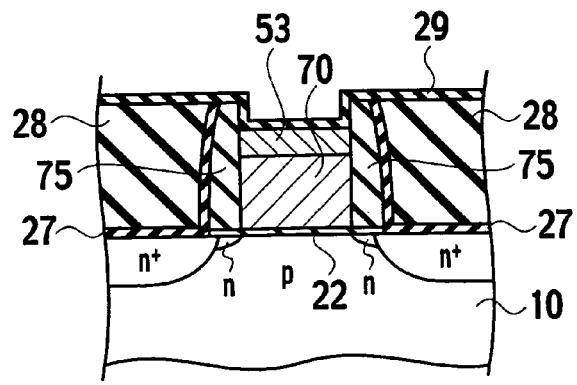
FIG. 21A is a process cross-section of elements in the low-voltage circuit region fabricated in a processing step of the nonvolatile semiconductor memory fabrication method, according to the first embodiment of the present invention, subsequent to that shown in FIG. 20A.
Figure 21B:
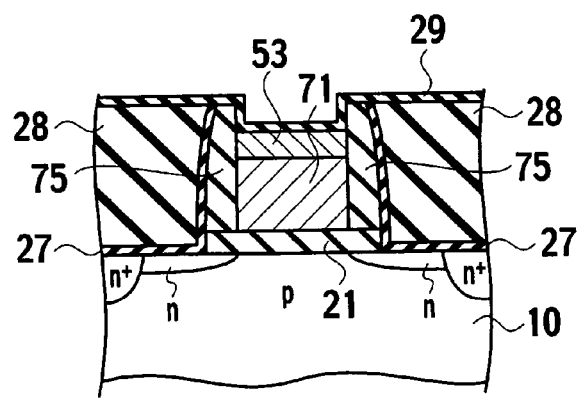
FIG. 21B is a process cross-section of elements in the high-voltage circuit region fabricated in a processing step of the nonvolatile semiconductor memory fabrication method, according to the first embodiment of the present invention, subsequent to that shown in FIG. 20B.
Figure 21C:
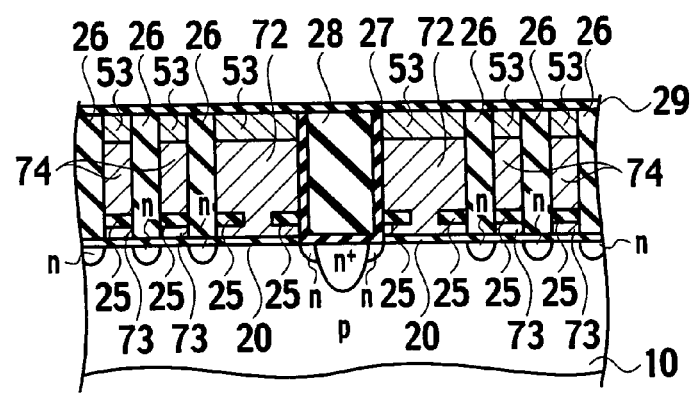
FIG. 21C is a process cross-section of elements in the cell array region fabricated in a subsequent processing step of the nonvolatile semiconductor memory fabrication method, according to the first embodiment of the present invention, to that shown in FIG. 20C.
Figure 22A:
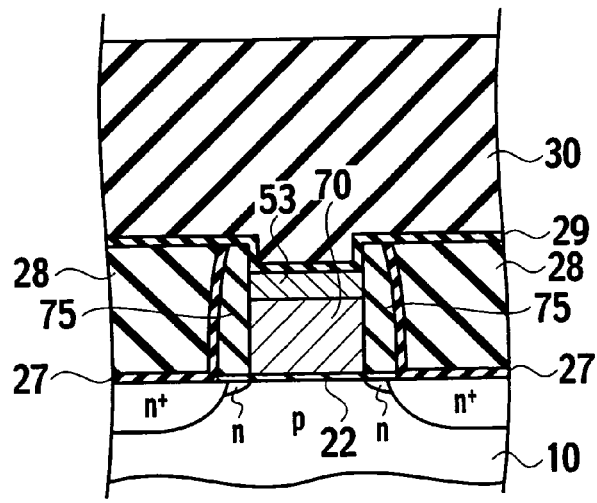
FIG. 22A is a process cross-section of elements in the low-voltage circuit region fabricated in a processing step of the nonvolatile semiconductor memory fabrication method, according to the first embodiment of the present invention, subsequent to that shown in FIG. 21A.
Figure 22B:
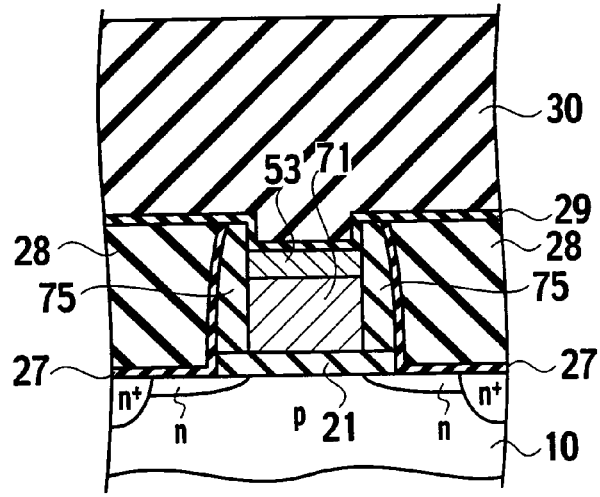
FIG. 22B is a process cross-section of elements in the high-voltage circuit region fabricated in a processing step of the nonvolatile semiconductor memory fabrication method, according to the first embodiment of the present invention, subsequent to that shown in FIG. 21B.
Figure 22C:
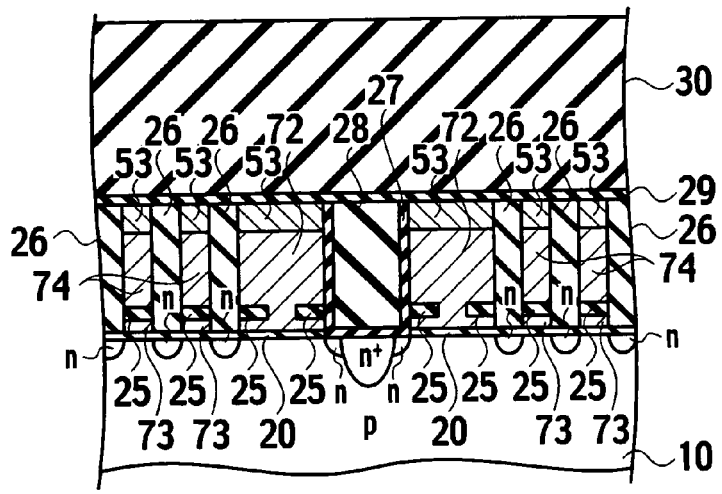
FIG. 22C is a process cross-section of elements in the cell array region fabricated in a processing step of the nonvolatile semiconductor memory fabrication method, according to the first embodiment of the present invention, subsequent to that shown in FIG. 21C.

(k) As shown in FIGS. 21A through 21C, a barrier insulating film 29 made of SiN or the like is then deposited across the entirety of the device. As shown in FIGS. 22A through 22C, a second interlayer insulating film 30 is deposited on the barrier insulating film 29. Contacts 54 for making electrical contact with the gate electrodes and the semiconductor substrate 10, as shown in FIGS. 2A through 2C, are formed by lithography and etching.

According to the nonvolatile semiconductor memory and the fabrication method thereof of the first embodiment, in order to form gate electrodes after formation of the element isolating regions (STI), the second gate insulating film 22 in the low-voltage circuit regions 80a, 80b, 80c, and 80d may be formed so as to be thinner than the tunnel insulating film 20. Making the second gate insulating film 22 thinner than the tunnel insulating film 20 is advantageous in terms of element performance, such as driving capability, thereby contributing to fabrication of higher performance transistors. Furthermore, since a first gate insulating film 21 of the transistors in the high-voltage circuit regions 90a, 90b, 90c, and 90d can be thicker than the tunnel insulating film 20, formation of high withstand voltage transistors is possible at the same time. Moreover, in order to form gate electrodes after formation of the element isolating regions (STI), dual gate peripheral elements can be easily formed through self alignment, even though there is a floating gate in the cell array region.

Furthermore, according to the nonvolatile semiconductor memory and the fabrication method thereof of the first embodiment, the metal silicide films 53 included in the gate electrodes 71 of the high-voltage transistors, the gate electrodes 70 of the low-voltage transistors, and the control gate electrodes 74 and the select gate electrodes 72 in the memory cell region allows high-speed performance with improved drive capability of the respective transistors, and implementation of a nonvolatile semiconductor memory capable of operating at a low power supply voltage.

Second Embodiment

Figure 23A:
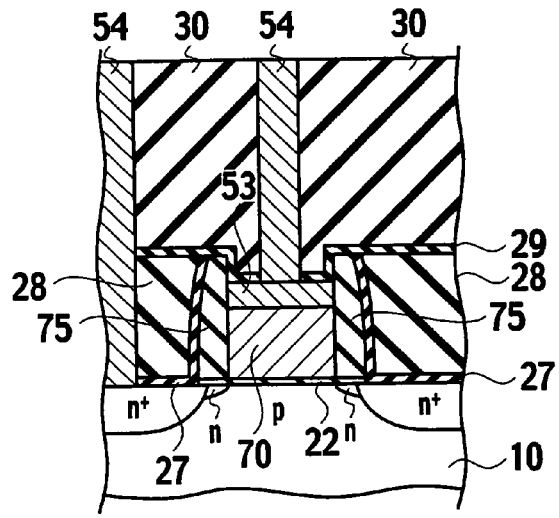
FIG. 23A is a schematic cross-section of elements in a low-voltage circuit region of a nonvolatile semiconductor memory, according to a second embodiment of the present invention.
Figure 23B:
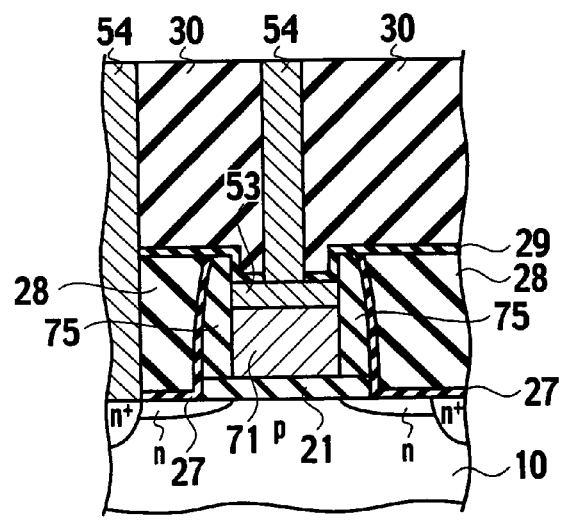
FIG. 23B is a schematic cross-section of elements in a high-voltage circuit region of the nonvolatile semiconductor memory, according to the second embodiment of the present invention.
Figure 23C:
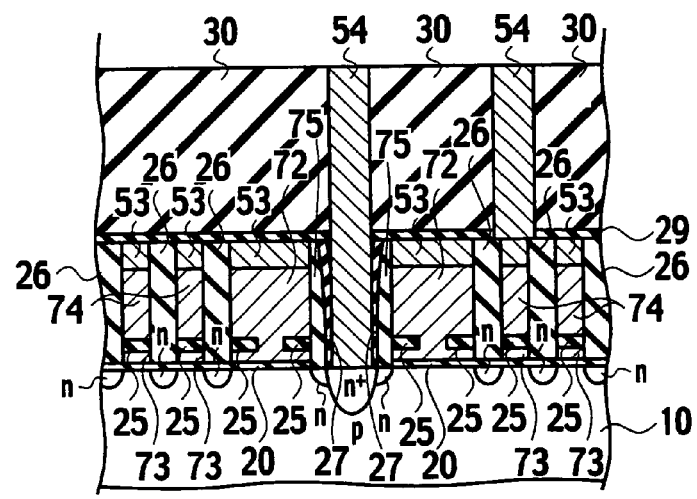
FIG. 23C is a schematic cross-section of elements in a cell array region of the nonvolatile semiconductor memory cut along a line perpendicular to the word line length, according to the second embodiment of the present invention.

A nonvolatile semiconductor memory according to the second embodiment of the present invention, as shown in FIG. 23C, differs from the nonvolatile semiconductor memory according to the first embodiment, shown in FIG. 2C in that the gate sidewall insulating films 75, as made to be thinner, remain at the gate sidewall region in addition to the liner insulating film 27. During contact formation of contacts 54, the first interlayer insulating film 28 on contact openings of contacts 54 may be completely removed or part thereof may be left at the gate sidewall region of contact openings of contacts 54, using the liner insulating film 27 as a stopper film. Contacts 54 are formed in a self-aligned manner in select transistors covered by the liner insulating films 27. The remainder of the structure is substantially the same as the nonvolatile semiconductor memory shown in FIGS. 2A through 2C, and thus repetitive description is omitted.

A nonvolatile semiconductor memory fabricating process according to the second embodiment is described while referencing FIGS. 23 through 33. FIGS. 23A through 33A are schematic cross sections of a transistor in the low-voltage circuit regions 80a, 80b, 80c, and 80d. FIGS. 23B through 33B are schematic cross sections of a transistor in the high-voltage circuit regions 90a, 90b, 90c, and 90d. FIGS. 23C through 33C are cross sections cut along a line perpendicular to the word line length of memory cell transistors.

(a) The processing steps according to the first embodiment shown in FIGS. 3 through 15 are first carried out. The processing steps according to the first embodiment shown in FIGS. 3 through 15 are the same as those according to this embodiment and description thereof is thus omitted.

Figure 24A:
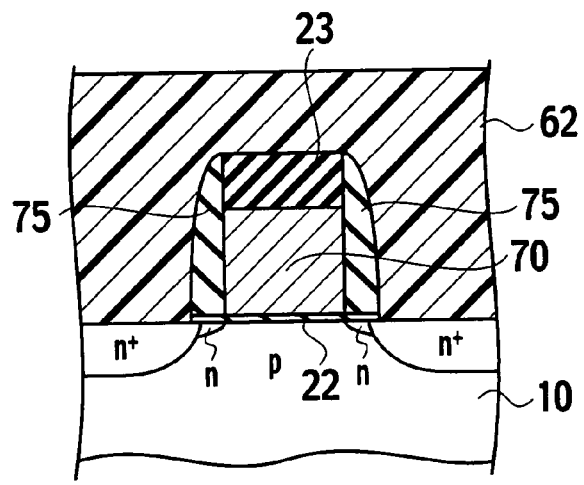
FIG. 24A is a process cross-section of elements in the low-voltage circuit region, according to a processing step of the nonvolatile semiconductor memory fabrication method of the second embodiment of the present invention, subsequent to that shown in FIG. 15A.
Figure 24B:
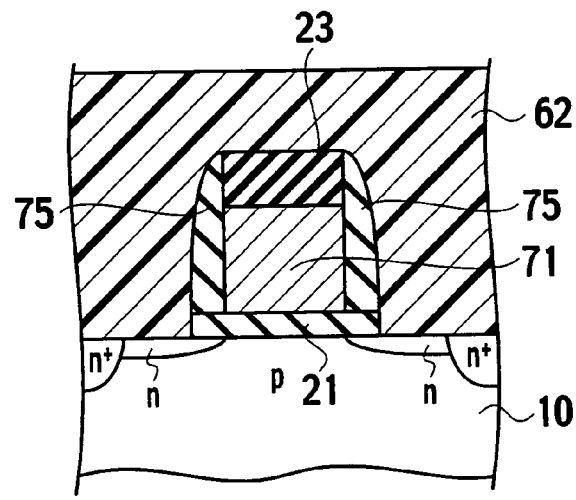
FIG. 24B is a process cross-section of elements in the high-voltage circuit region fabricated in a processing step of the nonvolatile semiconductor memory fabrication method, according to the second embodiment of the present invention, subsequent to that shown in FIG. 15B.
Figure 24C:
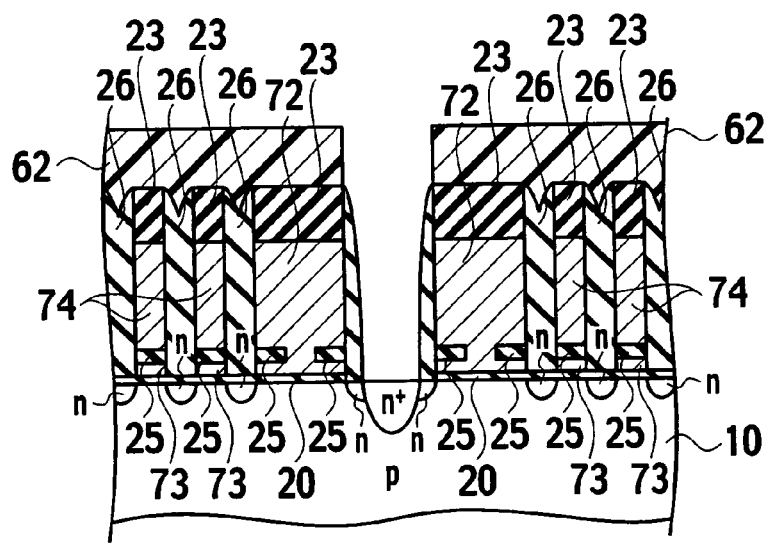
FIG. 24C is a process cross-section of elements in the cell array region fabricated in a processing step of the nonvolatile semiconductor memory fabrication method, according to the second embodiment of the present invention, subsequent to that shown in FIG. 15C.

(b) Next, as shown in FIGS. 24A through 24C, a resist 62 is deposited, and the part thereof between the select gate electrodes 72 is then removed by lithography. A part of a tunnel insulating film 20 between the select gate electrodes 72 is then removed by etching using the resist 62 as a mask, making thin gate sidewall insulating films 75. Afterwards, the resist 62 is removed using a resist remover.

Figure 25A:
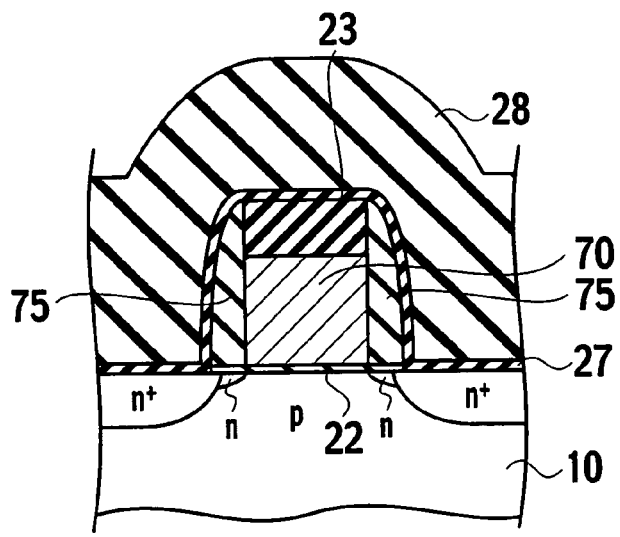
FIG. 25A is a process cross-section of elements in the low-voltage circuit region fabricated in a processing step of the nonvolatile semiconductor memory fabrication method, according to the second embodiment of the present invention, subsequent to that shown in FIG. 24A.
Figure 25B:
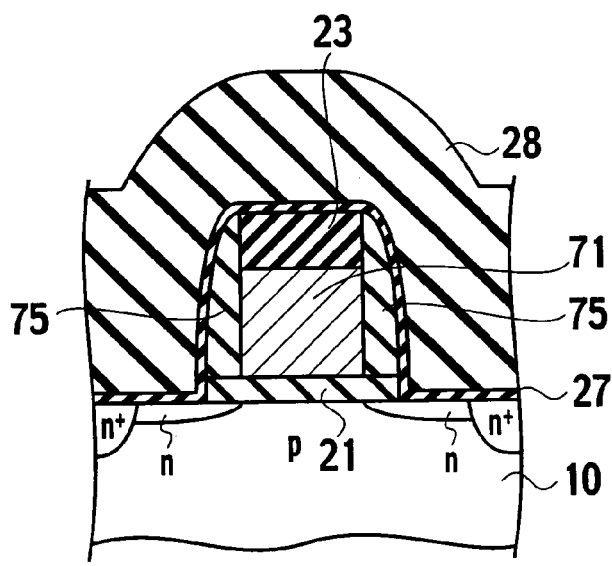
FIG. 25B is a process cross-section of elements in the high-voltage circuit region fabricated in a processing step of the nonvolatile semiconductor memory fabrication method, according to the second embodiment of the present invention, subsequent to that shown in FIG. 24B.
Figure 25C:
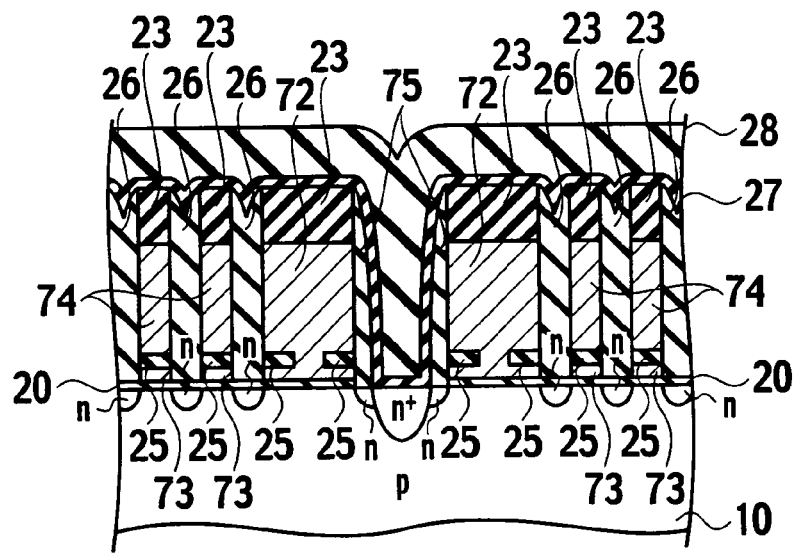
FIG. 25C is a process cross-section of elements in the cell array region fabricated in a processing step of the nonvolatile semiconductor memory fabrication method, according to the second embodiment of the present invention, subsequent to that shown in FIG. 24C.
Figure 26A:
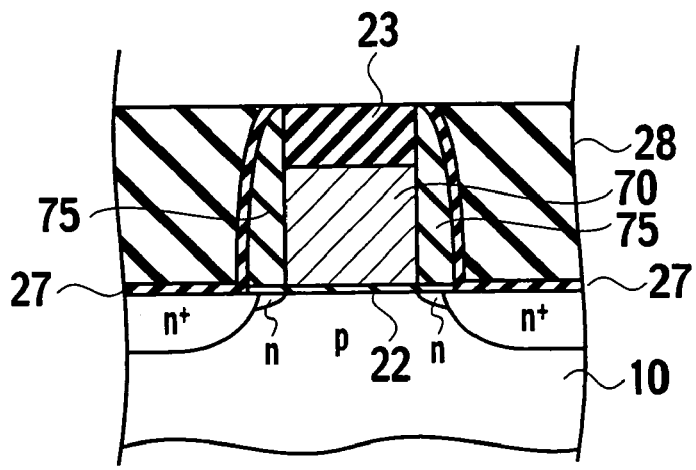
FIG. 26A is a process cross-section of elements in the low-voltage circuit region fabricated in a processing step of the nonvolatile semiconductor memory fabrication method, according to the second embodiment of the present invention, subsequent to that shown in FIG. 25A.
Figure 26B:
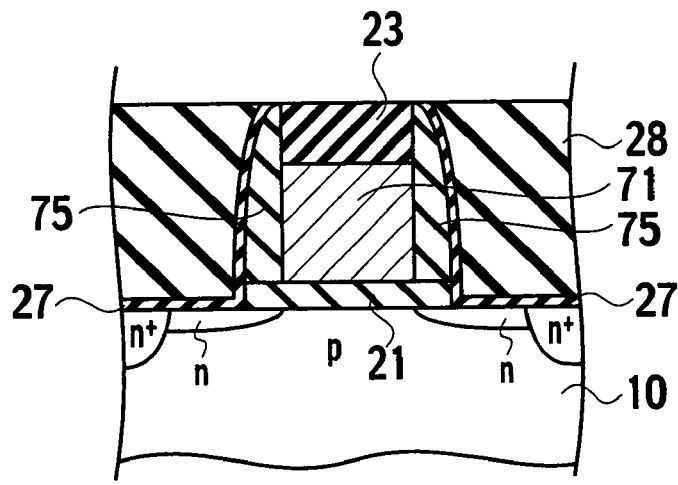
FIG. 26B is a process cross-section of elements in the high-voltage circuit region fabricated in a processing step of the nonvolatile semiconductor memory fabrication method, according to the second embodiment of the present invention, subsequent to that shown in FIG. 25B.
Figure 26C:
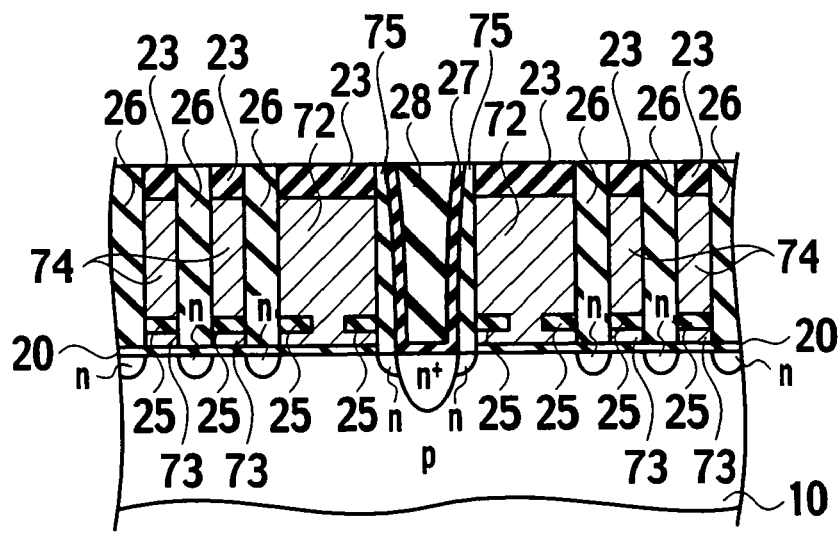
FIG. 26C is a process cross-section of elements in the cell array region fabricated in a processing step of the nonvolatile semiconductor memory fabrication method, according to the second embodiment of the present invention, subsequent to that shown in FIG. 25C.

(c) As shown in FIGS. 25A through 25C, a liner insulating film 27, made of SiN or the like is then deposited across the entirety of the device. The liner insulating film 27 is a film that stops etching for making contact openings of contacts 54. A first interlayer insulating film 28 is then deposited on the liner insulating film 27. Once the first interlayer insulating film 28 is deposited, CMP and then dry etching are carried out so as to planarize the first interlayer insulating film 28, as shown in FIGS. 26A through 26C.

Figure 27A:
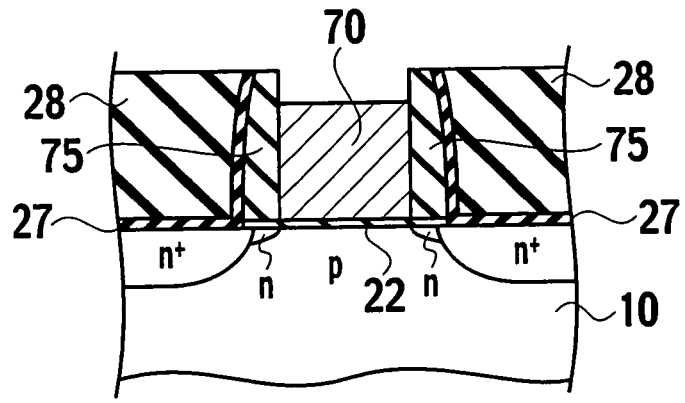
FIG. 27A is a process cross-section of elements in the low-voltage circuit region fabricated in a processing step of the nonvolatile semiconductor memory fabrication method, according to the second embodiment of the present invention, subsequent to that shown in FIG. 26A.
Figure 27B:
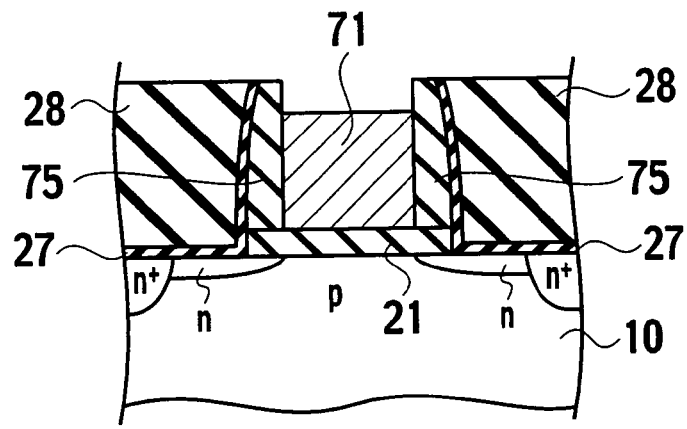
FIG. 27B is a process cross-section of elements in the high-voltage circuit region fabricated in a processing step of the nonvolatile semiconductor memory fabrication method, according to the second embodiment of the present invention, subsequent to that shown in FIG. 26B.
Figure 27C:
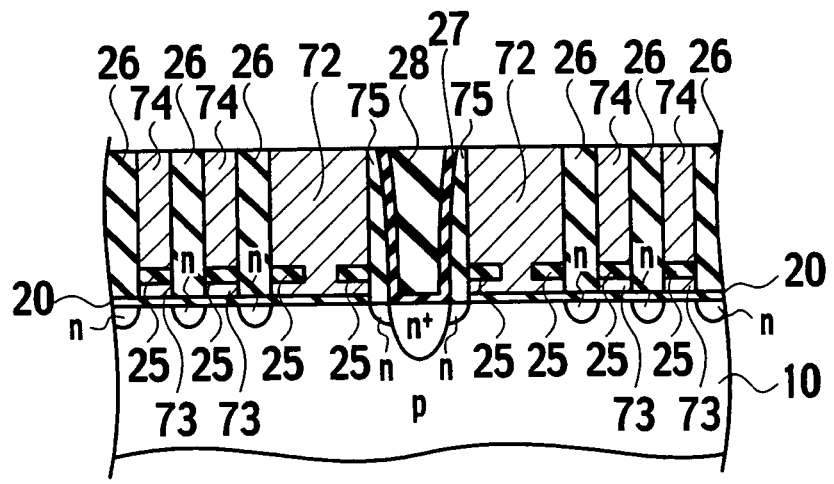
FIG. 27C is a process cross-section of elements in the cell array region fabricated in a processing step of the nonvolatile semiconductor memory fabrication method, according to the second embodiment of the present invention, subsequent to that shown in FIG. 26C.
Figure 28A:
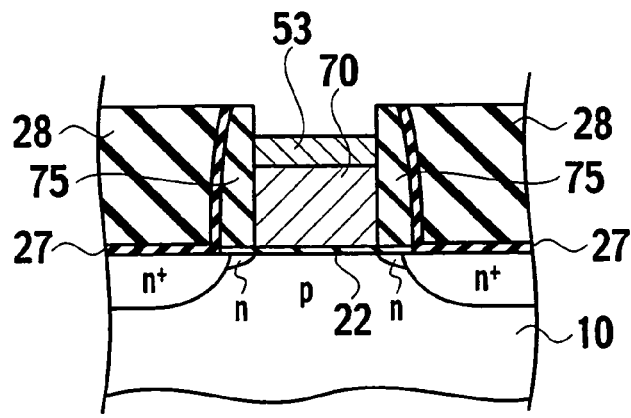
FIG. 28A is a process cross-section of elements in the low-voltage circuit region fabricated in a processing step of the nonvolatile semiconductor memory fabrication method, according to the second embodiment of the present invention, subsequent to that shown in FIG. 27A.
Figure 28B:
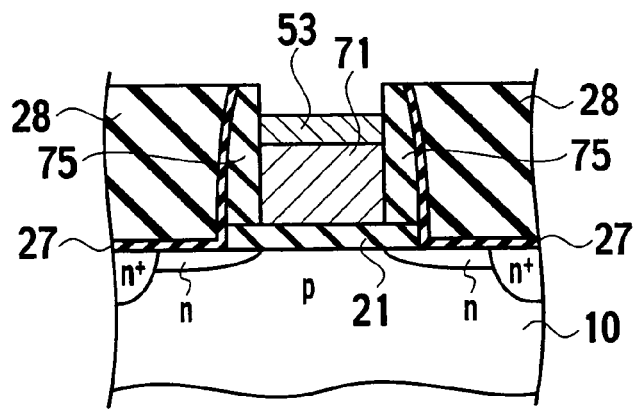
FIG. 28B is a process cross-section of elements in the high-voltage circuit region fabricated in a processing step of the nonvolatile semiconductor memory fabrication method, according to the second embodiment of the present invention, subsequent to that shown in FIG. 27B.
Figure 28C:
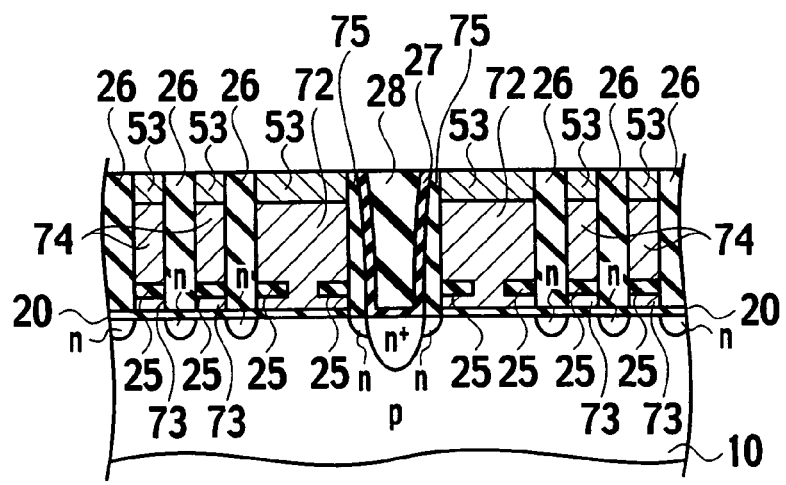
FIG. 28C is a process cross-section of elements in the cell array region fabricated in a processing step of the nonvolatile semiconductor memory fabrication method, according to the second embodiment of the present invention, subsequent to that shown in FIG. 27C.

(d) A masking material 23 is then removed by lithography, to form silicide forming regions as shown in FIGS. 27A through 27C. Regions that are to be interconnects and resistors are masked with SiN or the like so that a silicide is not formed therein. As shown in FIGS. 28A through 28C, metal silicide films 53 are then formed only in the silicide forming regions formed in the gate electrodes. The metal silicide films 53 are formed across the entire surfaces of the respective gate electrodes or part thereof. The metal silicide films may be made of one of various silicides, such as cobalt silicide ($CoSi_2$) and nickel silicide ($NiSi_2$).

Figure 29A:
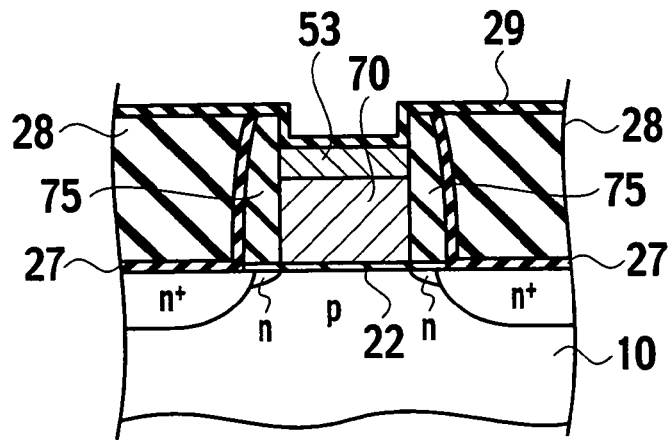
FIG. 29A is a process cross-section of elements in the low-voltage circuit region fabricated in a processing step of the nonvolatile semiconductor memory fabrication method, according to the second embodiment of the present invention, subsequent to that shown in FIG. 28A.
Figure 29B:
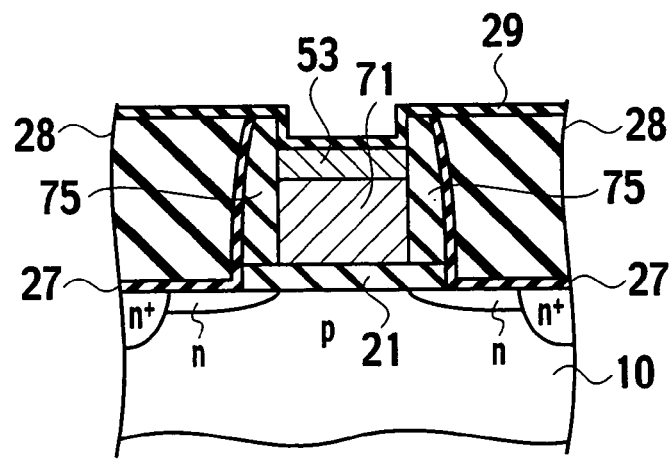
FIG. 29B is a process cross-section of elements in the high-voltage circuit region fabricated in a processing step of the nonvolatile semiconductor memory fabrication method, according to the second embodiment of the present invention, subsequent to that shown in FIG. 28B.
Figure 29C:
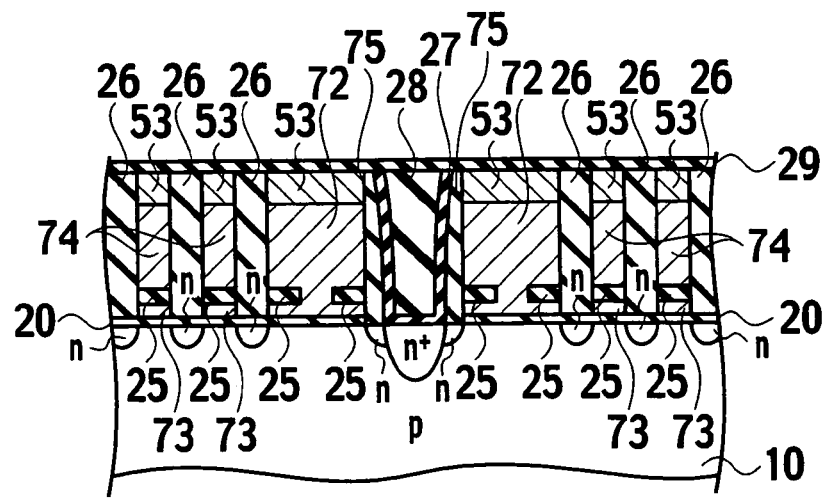
FIG. 29C is a process cross-section of elements in the cell array region fabricated in a processing step of the nonvolatile semiconductor memory fabrication method, according to the second embodiment of the present invention, subsequent to that shown in FIG. 28C.
Figure 30A:
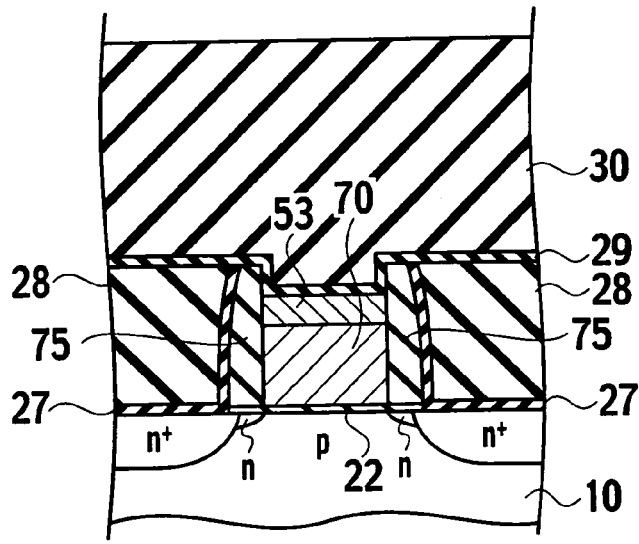
FIG. 30A is a process cross-section of elements in the low-voltage circuit region fabricated in a processing step of the nonvolatile semiconductor memory fabrication method, according to the second embodiment of the present invention, subsequent to that shown in FIG. 29A.
Figure 30B:
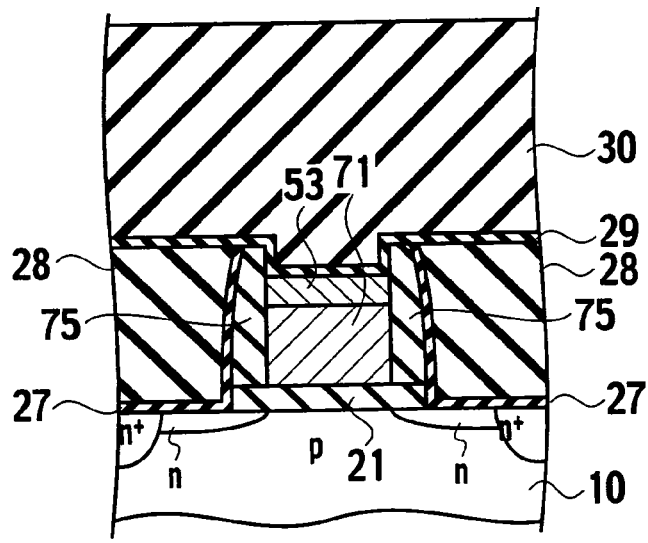
FIG. 30B is a process cross-section of elements in the high-voltage circuit region fabricated in a processing step of the nonvolatile semiconductor memory fabrication method, according to the second embodiment of the present invention, subsequent to that shown in FIG. 29B.
Figure 30C:
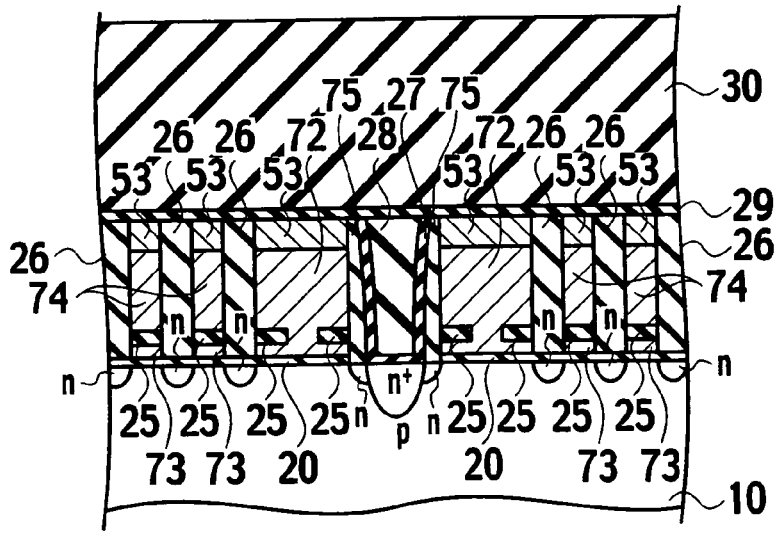
FIG. 30C is a process cross-section of elements in the cell array region fabricated in a processing step of the nonvolatile semiconductor memory fabrication method, according to the second embodiment of the present invention, subsequent to that shown in FIG. 29C.

(e) As shown in FIGS. 29A through 29C, a barrier insulating film 29, made of SiN or the like, is then deposited across the entirety of the device. As shown in FIGS. 30A through 30C, a second interlayer insulating film 30 is deposited on the barrier insulating film 29. Contacts 54 for making electrical contact with the gate electrodes and the semiconductor substrate 10, as shown in FIGS. 23A through 23C, are formed by lithography and etching.

According to the nonvolatile semiconductor memory and the fabrication method thereof of the second embodiment, in order to form gate electrodes after formation of the element isolating regions (STI), the second gate insulating film 22 in the low-voltage circuit regions 80a, 80b, 80c, and 80d maybe formed to be thinner than the tunnel insulating film 20. Making the second gate insulating film 22 thinner than the tunnel insulating film 20 is advantageous in terms of element performance, such as driving capability, thereby contributing to fabrication of higher performance transistors. Furthermore, since a first gate insulating film 21 of the transistors in the high-voltage circuit regions 90a, 90b, 90c, and 90d can be thicker than the tunnel insulating film 20, formation of high breakdown voltage transistors is possible. Moreover, in order to form gate electrodes after formation of the element isolating regions (STI), dual gate peripheral elements can be easily formed through self-alignment, even though there is a floating gate in the cell array region.

Furthermore, according to the nonvolatile semiconductor memory and the fabrication method thereof of the second embodiment, the metal silicide films 53 included in the gate electrodes 71 of the high-voltage transistors, the gate electrodes 70 of the low-voltage transistors, and the control gate electrodes 74 and the select gate electrodes 72 in the memory cell region allows high-speed performance with improved drive capability of the respective transistors, and provides a nonvolatile semiconductor memory capable of operating with a low power supply voltage.

Third Embodiment

Figure 31A:
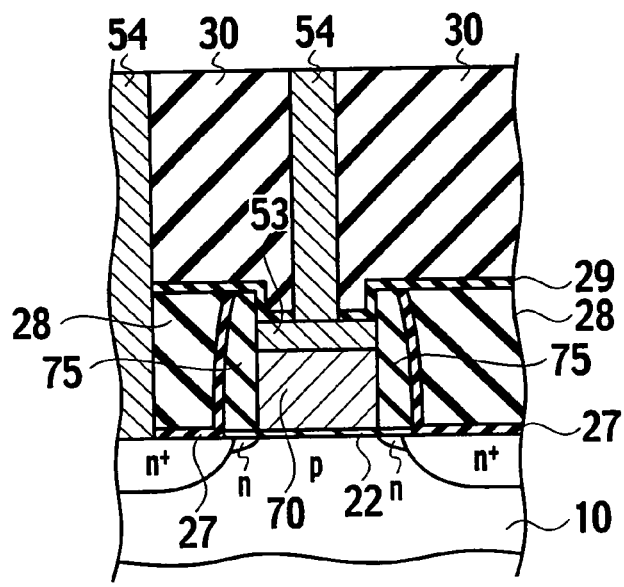
FIG. 31A is a schematic cross-section of elements in a low-voltage circuit region of a nonvolatile semiconductor memory, according to a third embodiment of the present invention.
Figure 31B:
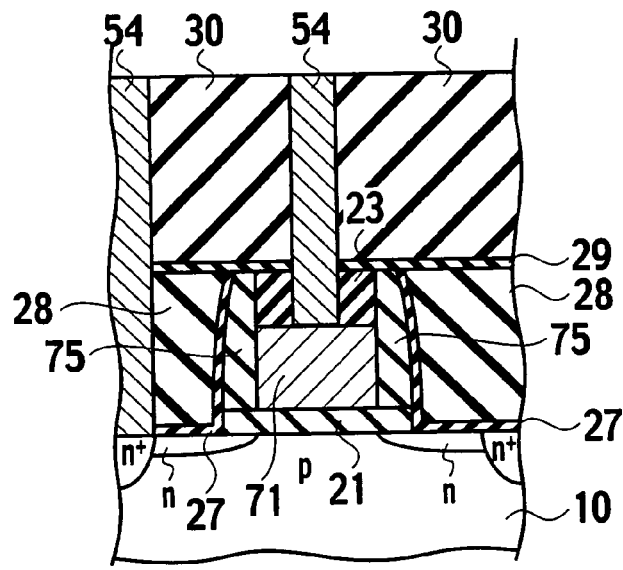
FIG. 31B is a schematic cross-section of elements in a high-voltage circuit region of the nonvolatile semiconductor memory, according to the third embodiment of the present invention.

A nonvolatile semiconductor memory according to the third embodiment of the present invention, as shown in FIG. 31B, differs from the nonvolatile semiconductor memory shown in FIG. 2B in that masking material 23 is deployed, instead of the metal silicide films 53, on the gate electrodes 71 of the transistors in the high-voltage circuit regions 90a, 90b, 90c, and 90d. The remainder of the description is substantially the same as the nonvolatile semiconductor memory shown in FIGS. 2A through 2C, and thus repetitive description is omitted.

A nonvolatile semiconductor memory fabricating process according to the third embodiment is described while referencing FIGS. 31 through 38. FIGS. 31A through 38A are schematic cross sections of a transistor in the low-voltage circuit regions 80*a*, 80*b*, 80*c*, and 80*d*. FIGS. 31B through 38B are schematic cross sections of a transistor in the high-voltage circuit regions 90*a*, 90*b*, 90*c*, and 90*d*. FIGS. 31C through 38C are cross sections cut along a line perpendicular to the word line length of memory cell transistors.

(a) The processing steps according to the first embodiment shown in FIGS. 3 through 15 are first carried out. The processing steps according to the first embodiment shown in FIGS. 3 through 15 are the same as those according to this embodiment and description thereof is thus omitted.

Figure 32A:
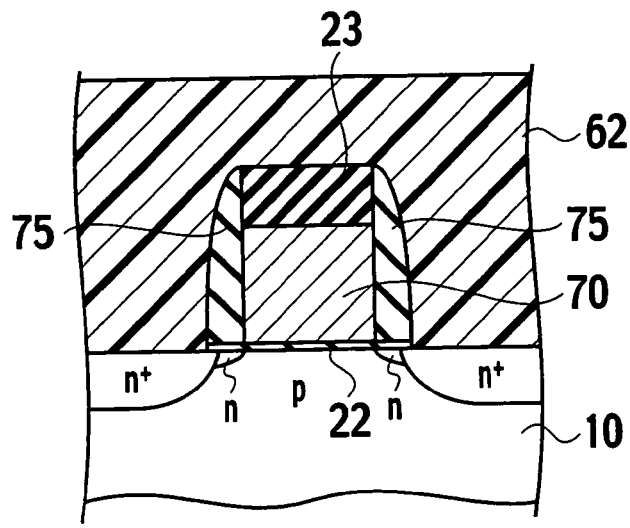
FIG. 32A is a process cross-section of elements in the low-voltage circuit region fabricated in a processing step of the nonvolatile semiconductor memory fabrication method according to the third embodiment of the present invention, subsequent to that shown in FIG. 15A.
Figure 32B:
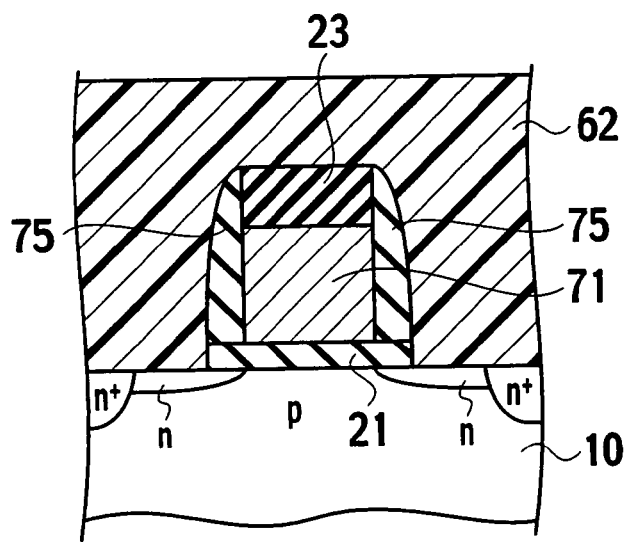
FIG. 32B is a process cross-section of elements in the high-voltage circuit region fabricated in a processing step of the nonvolatile semiconductor memory fabrication method, according to the third embodiment of the present invention, subsequent to that shown in FIG. 15B.
Figure 32C:
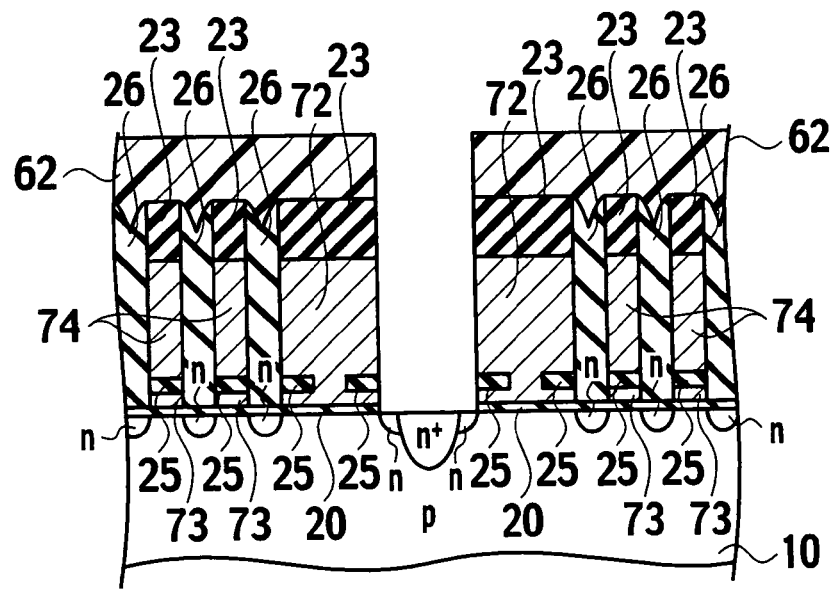
FIG. 32C is a process cross-section of elements in the cell array region fabricated in a processing step of the nonvolatile semiconductor memory fabrication method, according to the third embodiment of the present invention, subsequent to that shown in FIG. 15C.

(b) Next, as shown in FIGS. 32A through 32C, a resist 62 is deposited, and the part thereof between the select gate electrodes 72 is then removed by lithography. Gate sidewall insulating films 75 and tunnel insulating films 20 between the select gate electrodes 72 are then removed by etching using the resist 62 as a mask. Afterwards, the resist 62 is removed using a resist remover.

Figure 33A:
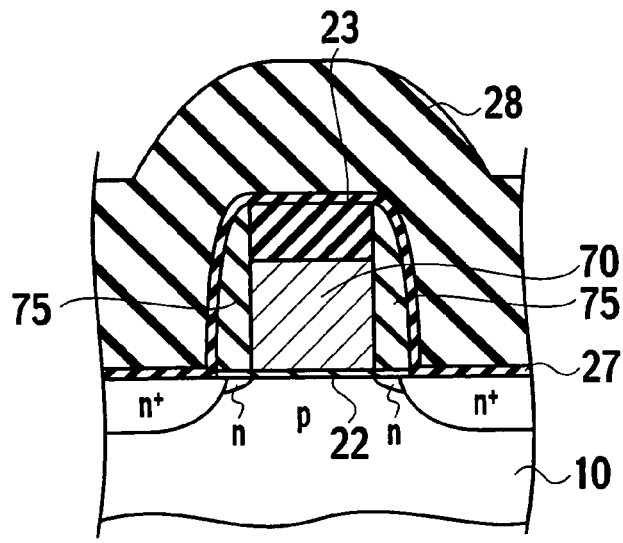
FIG. 33A is a process cross-section of elements in the low-voltage circuit region fabricated in a processing step of the nonvolatile semiconductor memory fabrication method, according to the third embodiment of the present invention, subsequent to that shown in FIG. 32A.
Figure 33B:
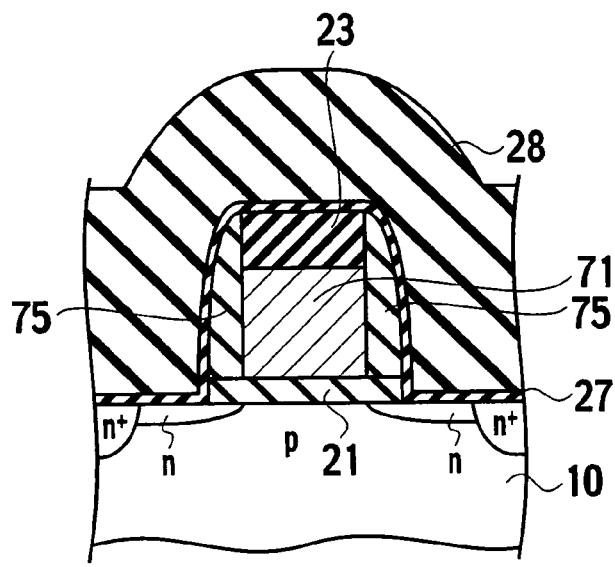
FIG. 33B is a process cross-section of elements in the high-voltage circuit region fabricated in a processing step of the nonvolatile semiconductor memory fabrication method, according to the third embodiment of the present invention, subsequent to that shown in FIG. 32B.
Figure 33C:
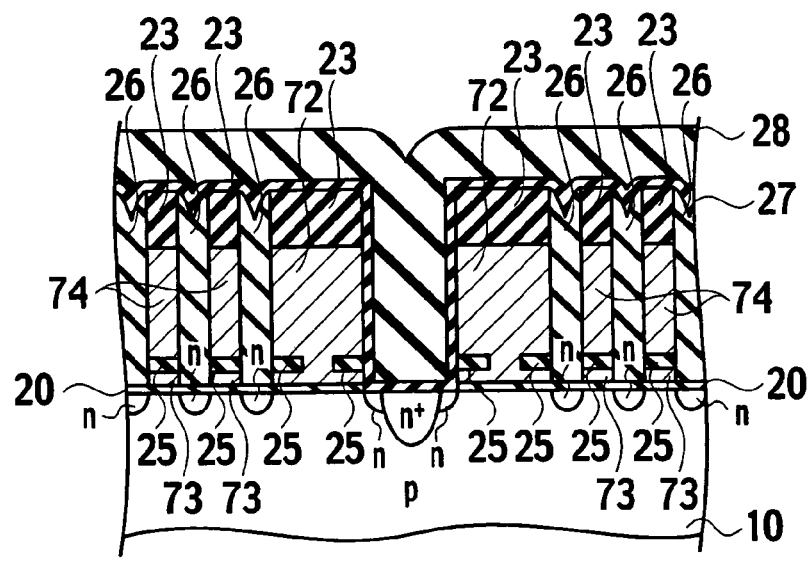
FIG. 33C is a process cross-section of elements in the cell array region fabricated in a processing step of the nonvolatile semiconductor memory fabrication method, according to the third embodiment of the present invention, subsequent to that shown in FIG. 32C.
Figure 34A:
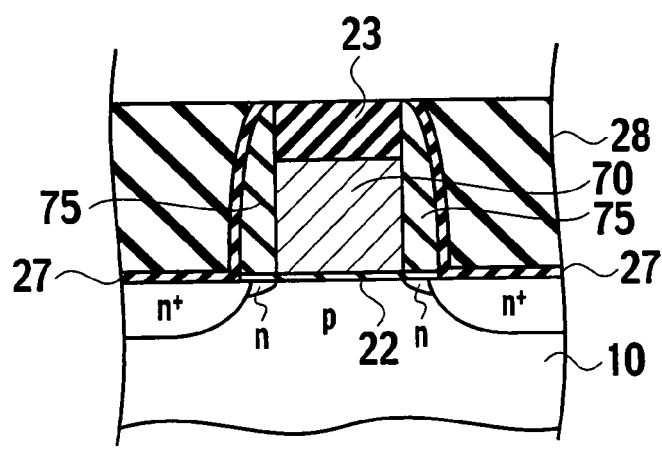
FIG. 34A is a process cross-section of elements in the low-voltage circuit region fabricated in a processing step of the nonvolatile semiconductor memory fabrication method, according to the third embodiment of the present invention, subsequent to that shown in FIG. 33A.
Figure 34B:
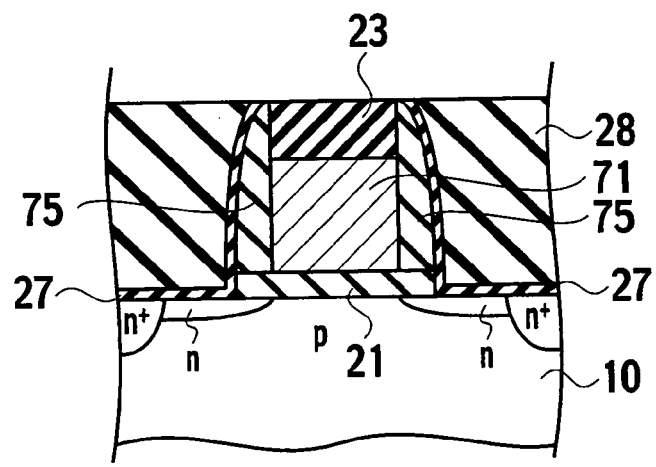
FIG. 34B is a process cross-section of elements in the high-voltage circuit region fabricated in a processing step of the nonvolatile semiconductor memory fabrication method, according to the third embodiment of the present invention, subsequent to that shown in FIG. 33B.
Figure 34C:
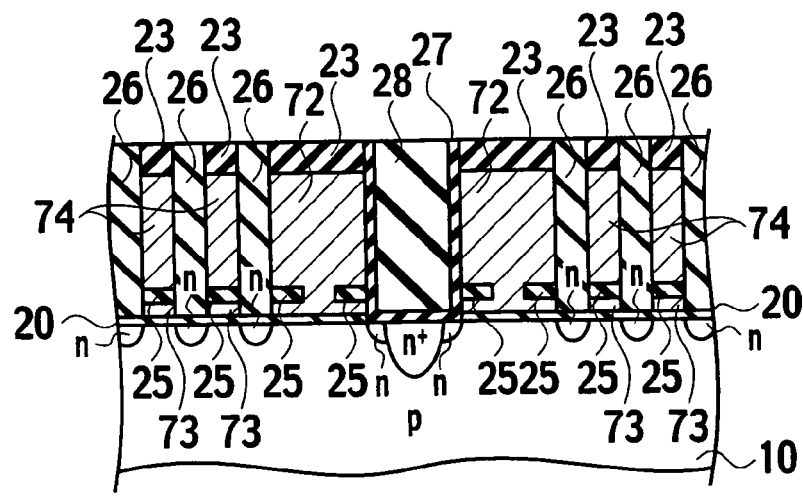
FIG. 34C is a process cross-section of elements in the cell array region fabricated in a processing step of the nonvolatile semiconductor memory fabrication method, according to the third embodiment of the present invention, subsequent to that shown in FIG. 33C.

(c) As shown in FIGS. 33A through 33C, a liner insulating film 27 made of SiN or the like is then deposited across the entirety of the device. The liner insulating film 27 stops etching for making contact openings of contacts 54. A first interlayer insulating film 28 is then deposited on the liner insulating film 27. Once the first interlayer insulating film 28 is deposited, CMP and then dry etching are carried out so as to planarize the first interlayer insulating film 28, as shown in FIGS. 34A through 34C.

Figure 35A:
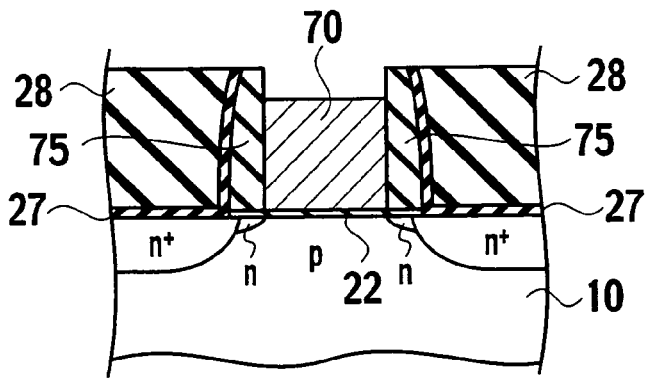
FIG. 35A is a process cross-section of elements in the low-voltage circuit region fabricated in a processing step of the nonvolatile semiconductor memory fabrication method, according to the third embodiment of the present invention, subsequent to that shown in FIG. 34A.
Figure 35B:
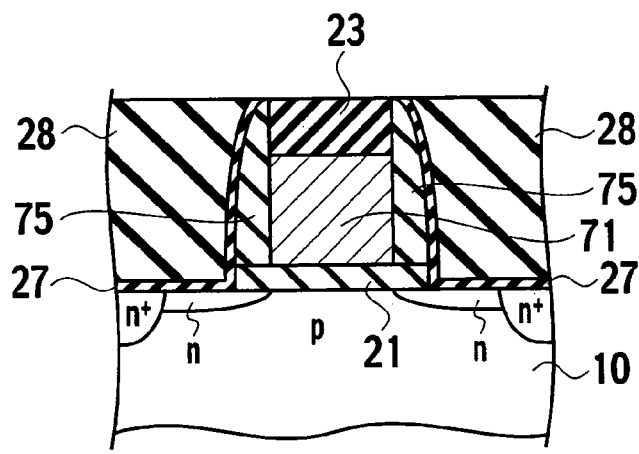
FIG. 35B is a process cross-section of elements in the high-voltage circuit region fabricated in a processing step of the nonvolatile semiconductor memory fabrication method, according to the third embodiment of the present invention, subsequent to that shown in FIG. 34B.
Figure 35C:
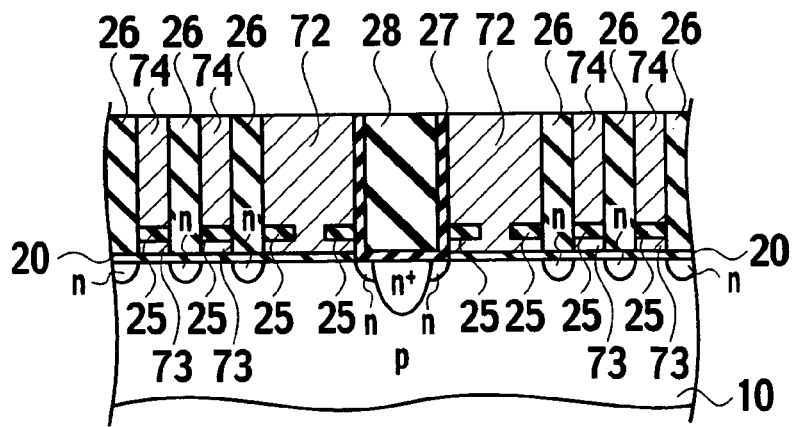
FIG. 35C is a process cross-section of elements in the cell array region fabricated in a processing step of the nonvolatile semiconductor memory fabrication method, according to the third embodiment of the present invention, subsequent to that shown in FIG. 34C.
Figure 36A:
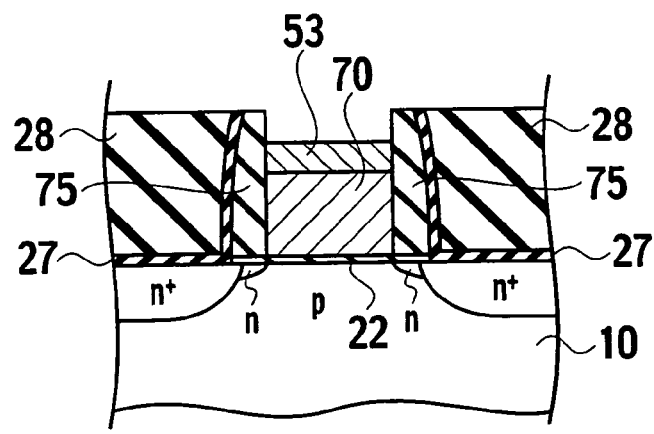
FIG. 36A is a process cross-section of elements in the low-voltage circuit region fabricated in a processing step of the nonvolatile semiconductor memory fabrication method, according to the third embodiment of the present invention, subsequent to that shown in FIG. 35A.
Figure 36B:
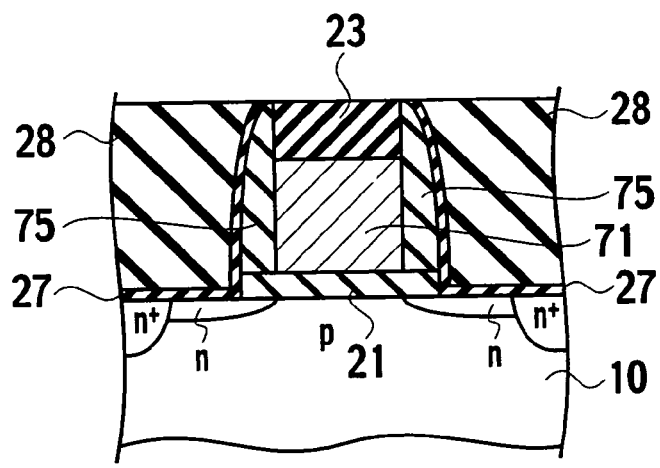
FIG. 36B is a process cross-section of elements in the high-voltage circuit region fabricated in a processing step of the nonvolatile semiconductor memory fabrication method, according to the third embodiment of the present invention, subsequent to that shown in FIG. 35B.
Figure 36C:
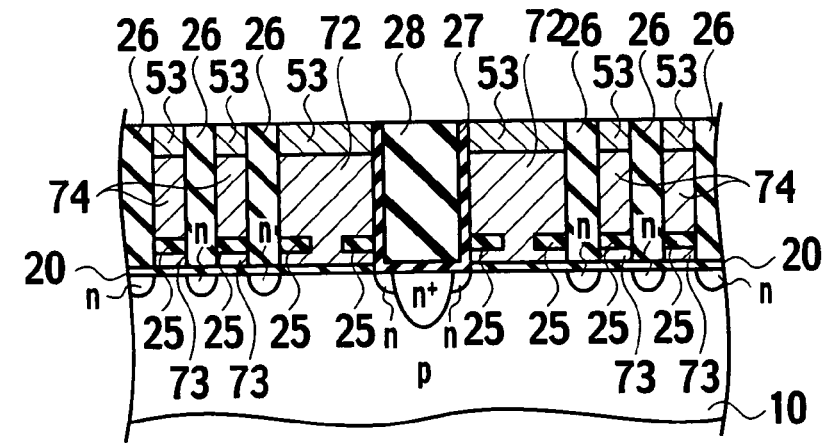
FIG. 36C is a process cross-section of elements in the cell array region fabricated in a processing step of the nonvolatile semiconductor memory fabrication method, according to the third embodiment of the present invention, subsequent to that shown in FIG. 35C.

(d) The masking material 23 is then removed by lithography, to form silicide forming regions as shown in FIGS. 35A through 35C. As shown in FIG. 35B, the masking material 23 on gate electrodes 71 of the transistors in the high-voltage circuit regions 90*a*, 90*b*, 90*c*, and 90*d* is not removed. Regions that are to be interconnects and resistors are masked with SiN or the like so that a silicide is not formed therein. As shown in FIGS. 36A through 36C, metal silicide films 53 are then formed only in the silicide forming regions formed in the gate electrodes. The metal silicide films 53 are formed across the entire surfaces of the respective gate electrodes or part thereof. The metal silicide films may be made of one of various silicides, such as cobalt silicide ($CoSi_2$) and nickel silicide ($NiSi_2$).

Figure 31C:
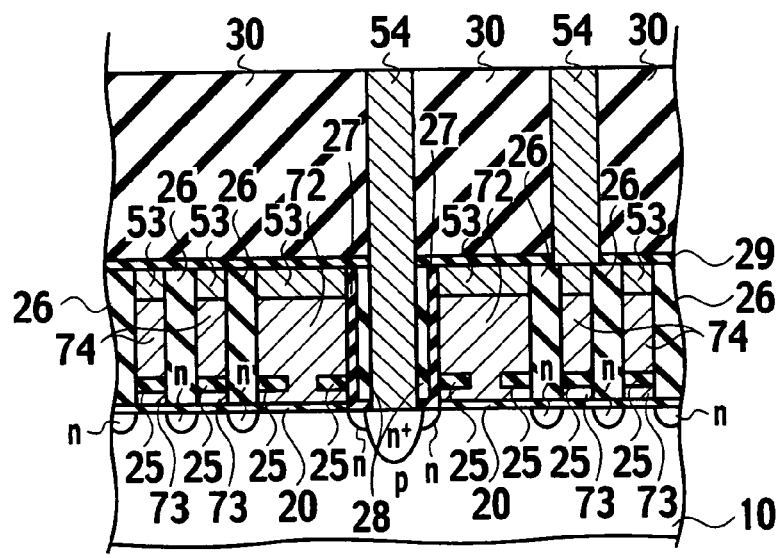
FIG. 31C is a schematic cross-section of elements in a cell array region of the nonvolatile semiconductor memory cut along a line perpendicular to the word line length, according to the third embodiment of the present invention.
Figure 37A:
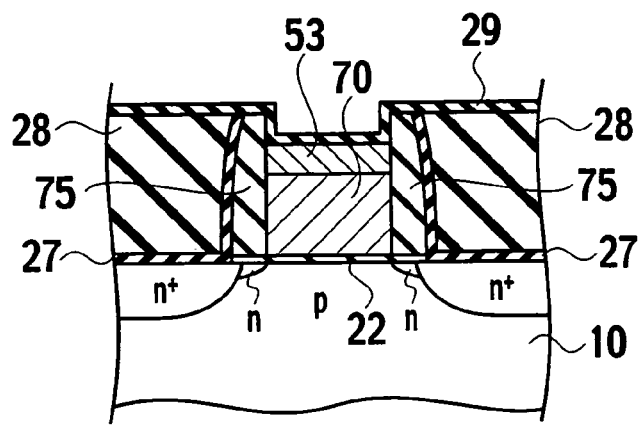
FIG. 37A is a process cross-section of elements in the low-voltage circuit region fabricated in a processing step of the nonvolatile semiconductor memory fabrication method, according to the third embodiment of the present invention, subsequent to that shown in FIG. 36A.
Figure 37B:
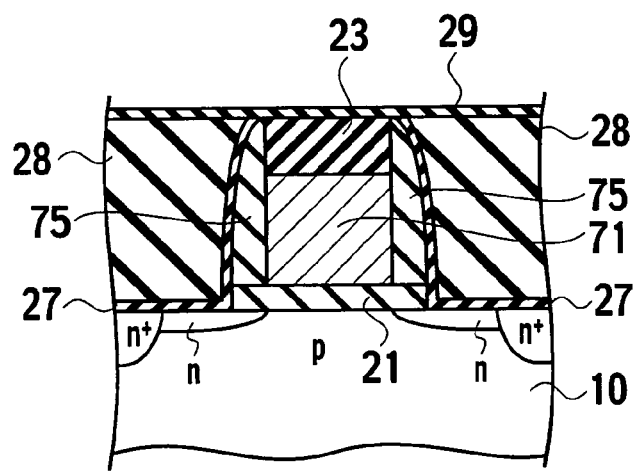
FIG. 37B is a process cross-section of elements in the high-voltage circuit region fabricated in a processing step of the nonvolatile semiconductor memory fabrication method, according to the third embodiment of the present invention, subsequent to that shown in FIG. 36B.
Figure 37C:
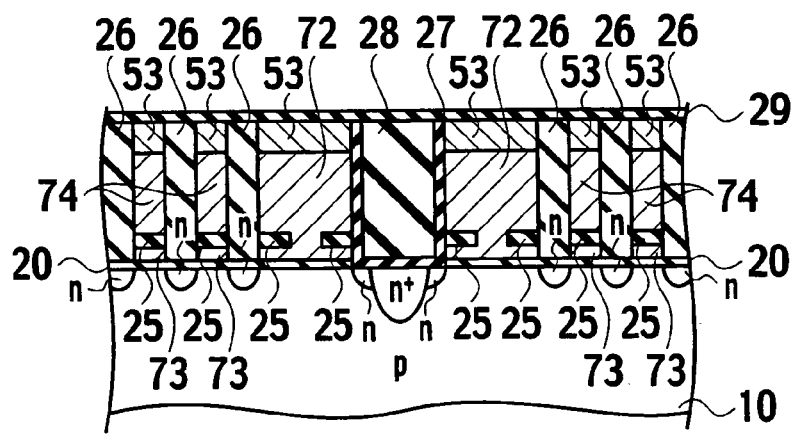
FIG. 37C is a process cross-section of elements in the cell array region fabricated in a processing step of the nonvolatile semiconductor memory fabrication method, according to the third embodiment of the present invention, subsequent to that shown in FIG. 36C.
Figure 38A:
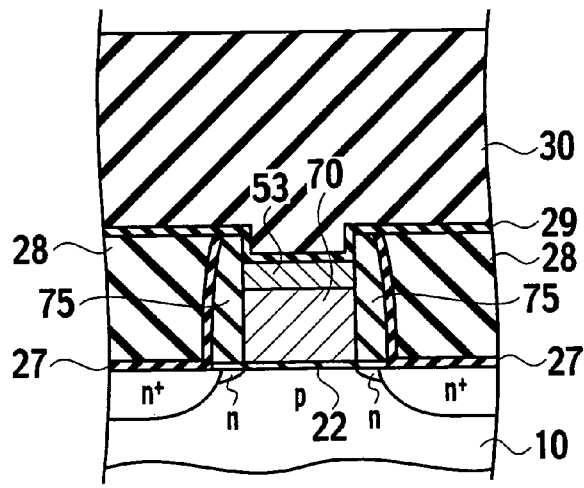
Figure 38B:
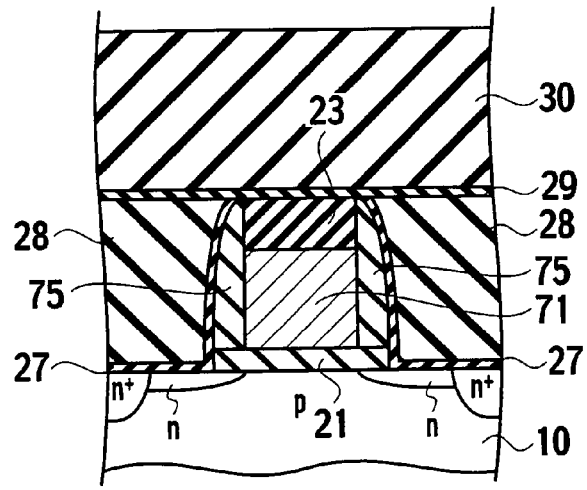
Figure 38C:
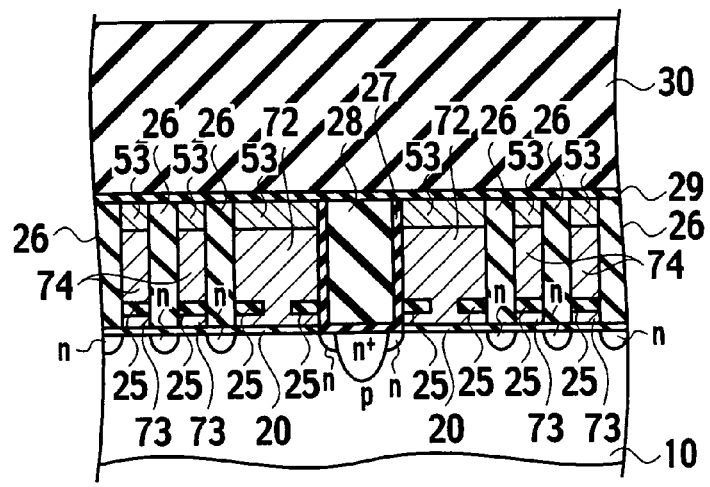

(e) As shown in FIGS. 37A through 37C, a barrier insulating film 29 of SiN or the like is then deposited across the entirety of the device. As shown in FIGS. 38A through 38C, a second interlayer insulating film 30 is deposited on the barrier insulating film 29. Contacts 54 for making electrical contact with the gate electrodes and the semiconductor substrate 10, as shown in FIGS. 31A through 31C, are formed by lithography and etching.

According to the nonvolatile semiconductor memory and the fabrication method for the same of the third embodiment, in order to form gate electrodes after formation of the element isolating regions (STI), a second gate insulating film 22 in the low-voltage circuit regions 80*a*, 80*b*, 80*c*, and 80*d* may be formed so as to be thinner than the tunnel insulating film 20. Making the second gate insulating film 22 thinner than the tunnel insulating film 20 is advantageous in terms of element performance, such as driving capability, thereby contributing to fabrication of higher performance transistors. Furthermore, since a first gate insulating film 21 of the transistors in the high-voltage circuit regions 90*a*, 90*b*, 90*c*, and 90*d* can be thicker than the tunnel insulating film 20, formation of high withstand voltage transistors is possible at the same time. Moreover, in order to form gate electrodes after formation of the element isolating regions (STI), dual gate peripheral elements can be easily formed through self alignment, even though there is a floating gate in the cell array region.

Furthermore, according to the nonvolatile semiconductor memory and the fabrication method thereof of the third embodiment, the metal silicide films 53 included in the gate electrodes 70 of the low-voltage transistors, and the control gate electrodes 74 and the select gate electrodes 72 in the memory cell region allows high-speed performance with improved drive capability of the respective transistors, and provides a nonvolatile semiconductor memory capable of low power supply voltage operation. Moreover, formation of high withstand voltage transistors is possible.

Fourth Embodiment

A nonvolatile semiconductor memory according to the fourth embodiment of the present invention, as shown in FIG. 39C, differs from the nonvolatile semiconductor memory according to the third embodiment, shown in FIG. 31C, in that the thin gate sidewall insulating films 75 remain at the gate sidewall region in addition to the liner insulating film 27. During contact formation, the first interlayer insulating film 28 on the contact openings may be completely removed or part thereof may be left on the contact openings, using the liner insulating film 27 as a stopper film. Contacts 54 are formed in a self-aligned manner in select transistors covered by the liner insulating films 27. Furthermore, the nonvolatile semiconductor memory according to the fourth embodiment of the present invention, as shown in FIG. 39B, differs from the nonvolatile semiconductor memory shown in FIG. 2B in that masking material 23 is deployed, instead of the metal silicide films 53, on the gate electrodes 71 of the transistors in the high-voltage circuit regions 90*a*, 90*b*, 90*c*, and 90*d*. The remainder of the process is substantially the same as the nonvolatile semiconductor memory shown in FIGS. 2A through 2C, and thus repetitive description is omitted.

A nonvolatile semiconductor memory fabricating process according to the fourth embodiment is described while referencing FIGS. 39 through 46. FIGS. 39A through 46A are schematic cross sections of a transistor in the low-voltage circuit regions 80*a*, 80*b*, 80*c*, and 80*d*. FIGS. 39B through 46B are schematic cross sections of a transistor in the high-voltage circuit regions 90*a*, 90*b*, 90*c*, and 90*d*. FIGS. 39C through 46C are cross sections cut along a line perpendicular to the word line length of memory cell transistors.

(a) The processing steps according to the first embodiment shown in FIGS. 3 through 15 are first carried out. The processing steps according to the first embodiment shown in FIGS. 3 through 15 are the same as those according to this embodiment and description thereof is thus omitted.

(b) Next, as shown in FIGS. 40A through 40C, a resist 62 is deposited and the part thereof between the select gate electrodes 72 is then removed by lithography. A part of a tunnel insulating film 20 between the select gate electrodes 72 is then removed by etching using the resist 62 as a mask, so as to provide thin gate sidewall insulating films 75. Afterwards, the resist 62 is removed using a resist remover.

(c) As shown in FIGS. 41A through 41C, a liner insulating film 27 of SiN or the like is then deposited across the entirety of the device. The liner insulating film 27 stops etching for making contact openings of contacts 54. A first interlayer insulating film 28 is then deposited on the liner insulating film 27. Once the first interlayer insulating film 28 is deposited, CMP and then dry etching are carried out so as to planarize the first interlayer insulating film 28, as shown in FIGS. 42A through 42C.

(d) The masking material 23 is then removed by lithography, to form silicide forming regions as shown in FIGS. 43A through 43C. As shown in FIG. 43B, the masking material 23 on gate electrodes 71 of the transistors in the high-voltage circuit regions 90a, 90b, 90c, and 90d is not removed. Regions that are to be interconnects and resistors are masked with SiN or the like so that a silicide is not formed therein. As shown in FIGS. 44A through 44C, metal silicide films 53 are then formed only in the silicide forming regions formed in the gate electrodes. The metal silicide films 53 are formed across the entire surfaces of the respective gate electrodes or part thereof. The metal silicide films may be made of one of various silicides, such as cobalt silicide ($CoSi_2$) and nickel silicide ($NiSi_2$).

(e) As shown in FIGS. 45A through 45C, a barrier insulating film 29 of SiN or the like is then deposited across the entirety of the device. As shown in FIGS. 46A through 46C, a second interlayer insulating film 30 is deposited on the barrier insulating film 29. Contacts 54 for making electrical contact with the gate electrodes and the semiconductor substrate 10, as shown in FIGS. 39A through 39C, are formed by lithography and etching.

According to the nonvolatile semiconductor memory and the fabrication method for the same of the fourth embodiment, in order to form gate electrodes after formation of the element isolating regions (STI), a second gate insulating film 22 in the low-voltage circuit regions 80a, 80b, 80c, and 80d may be formed so as to be thinner than the tunnel insulating film 20. Making the second gate insulating film 22 thinner than the tunnel insulating film 20 is advantageous in terms of element performance, such as driving capability, thereby contributing to fabrication of higher performance transistors. Furthermore, since a first gate insulating film 21 of the transistors in the high-voltage circuit regions 90a, 90b, 90c, and 90d can be thicker than the tunnel insulating film 20, formation of high withstand voltage transistors is possible at the same time. Moreover, in order to form gate electrodes after formation of the element isolating regions (STI), dual gate peripheral elements can be easily formed by self alignment, even though there is a floating gate in the cell array region.

Furthermore, according to the nonvolatile semiconductor memory and the fabrication method thereof of the fourth embodiment, the metal silicide films 53 included in the gate electrodes 70 of the low-voltage transistors, and the control gate electrodes 74 and the select gate electrodes 72 in the memory cell region allows high-speed performance with improved drive capability of the respective transistors, and provides a nonvolatile semiconductor memory capable of low power supply voltage operation. Moreover, formation of high withstand voltage transistors is possible.

Fifth Embodiment

A nonvolatile semiconductor memory according to a fifth embodiment of the present invention, as shown in FIGS. 47A and 47B, differs from the nonvolatile semiconductor memory shown in FIGS. 31A and 31B in that masking material 23 is deployed on the gate electrodes 70 of the transistors in the low-voltage circuit regions 80a, 80b, 80c, and 80d, instead of the metal silicide films 53. The remainder of the description is substantially the same as the nonvolatile semiconductor memory shown in FIGS. 31A through 31C, and thus repetitive description is omitted.

A nonvolatile semiconductor memory fabricating process according to the fifth embodiment is described while referencing FIGS. 47 through 54. FIGS. 47A through 54A are schematic cross sections of a transistor in the low-voltage circuit regions 80a, 80b, 80c, and 80d. FIGS. 47B through 54B are schematic cross sections of a transistor in high-voltage circuit regions 90a, 90b, 90c, and 90d. FIGS. 47C through 54C are cross sections cut along a line perpendicular to the word line length of memory cell transistors.

(a) The processing steps according to the first embodiment shown in FIGS. 3 through 15 are first carried out. The processing steps according to the first embodiment shown in FIGS. 3 through 15 are the same as those according to this embodiment and description thereof is thus omitted.

(b) Next, as shown in FIGS. 48A through 48C, a resist 62 is deposited and the part thereof between the select gate electrodes 72 is then removed by lithography. Gate sidewall insulating films 75 and tunnel insulating films 20 between the select gate electrodes 72 are then removed by etching using the resist 62 as a mask. Afterwards, the resist 62 is removed using a resist remover.

(c) As shown in FIGS. 49A through 49C, a liner insulating film 27 of SiN or the like is then deposited across the entirety of the device. The liner insulating film 27 stops etching for making contact openings of contacts 54. A first interlayer insulating film 28 is then deposited on the liner insulating film 27. Once the first interlayer insulating film 28 is deposited, CMP and then dry etching are carried out so as to planarize the first interlayer insulating film 28, as shown in FIGS. 50A through 50C.

(d) The masking material 23 is then removed by lithography, to form silicide forming regions as shown in FIG. 51C. As shown in FIGS. 51A and 51B, the masking material 23 on the gate electrodes 70 and 71 of the transistors in the respective low-voltage circuit regions 80a, 80b, 80c, and 80d and the high-voltage circuit regions 90a, 90b, 90c, and 90d is not removed. Regions that are to be interconnects and resistors are masked with SiN or the like so that a silicide is not formed therein. As shown in FIG. 52C, metal silicide films 53 are then formed only in the silicide forming regions formed in the gate electrodes. The metal silicide films 53 are formed across the entire surfaces of the respective gate electrodes or part thereof. The metal silicide films may be made of one of various suicides, such as cobalt silicide ($CoSi_2$) and nickel silicide ($NiSi_2$).

(e) As shown in FIGS. 53A through 53C, a barrier insulating film 29 of SiN or the like is then deposited across the entirety of the device. As shown in FIGS. 54A through 54C, a second interlayer insulating film 30 is deposited on the barrier insulating film 29. Contacts 54 for making electrical contact with the gate electrodes and the semiconductor substrate 10, as shown in FIGS. 47A through 47C, are formed by lithography and etching.

According to the nonvolatile semiconductor memory and the fabrication method for the same of the fifth embodiment, in order to form gate electrodes after formation of the element isolating regions (STI), a second gate insulating film 22 in the low-voltage circuit regions 80a, 80b, 80c, and 80d is formed so as to be thinner than the tunnel insulating film 20. Making the second gate insulating film 22 thinner than the tunnel insulating film 20 is advantageous in terms of element performance, such as driving capability, thereby contributing to fabrication of higher performance transistors. Furthermore, since a first gate insulating film 21 of the transistors in the high-voltage circuit regions 90a, 90b, 90c, and 90d can be thicker than the tunnel insulating film 20, formation of high withstand voltage transistors is possible at the same time. Moreover, in order to form gate electrodes after formation of the element isolating regions (STI), dual gate peripheral elements can be easily formed by self alignment, even though there is a floating gate in the cell array region.

Furthermore, according to the nonvolatile semiconductor memory and the fabrication method thereof of the fifth embodiment, the metal silicide films 53 included in the control gate electrodes 74 and the select gate electrodes 72 in the memory cell region allows high-speed performance with improved drive capability of the respective transistors, and provides a nonvolatile semiconductor memory capable of low power supply voltage operation. Moreover, formation of low withstand voltage transistors and high withstand voltage transistors is possible.

Sixth Embodiment

A nonvolatile semiconductor memory according to the sixth embodiment of the present invention, as shown in FIGS. 55A and 55B, differs from the nonvolatile semiconductor memory shown in FIGS. 39A and 39B in that masking material 23 is deployed on the gate electrodes 70 of the transistors in the low-voltage circuit regions 80a, 80b, 80c, and 80d, instead of the metal silicide films 53. The remainder of the description is substantially the same as the nonvolatile semiconductor memory shown in FIGS. 39A through 39C, and thus repetitive description is omitted.

A nonvolatile semiconductor memory fabricating process according to the sixth embodiment is described while referencing FIGS. 55 through 62. FIGS. 55A through 62A are schematic cross sections of a transistor in the low-voltage circuit regions 80a, 80b, 80c, and 80d. FIGS. 55B through 62B are schematic cross sections of a transistor in high-voltage circuit regions 90a, 90b, 90c, and 90d. FIGS. 55C through 62C are cross sections cut along a line perpendicular to the word line length of memory cell transistors.

(a) The processing steps according to the first embodiment shown in FIGS. 3 through 15 are first carried out. The processing steps according to the first embodiment shown in FIGS. 3 through 15 are the same as those according to this embodiment and description thereof is thus omitted.

(b) Next, as shown in FIGS. 56A through 56C, a resist 62 is deposited, and the part thereof between the select gate electrodes 72 is then removed by lithography. A part of a tunnel insulating film 20 between the select gate electrodes 72 is then removed by etching using the resist 62 as a mask, so as to make thin gate sidewall insulating films 75. Afterwards, the resist 62 is removed using a resist remover.

(c) As shown in FIGS. 57A through 57C, a liner insulating film 27 of SiN or the like is then deposited across the entirety of the device. The liner insulating film 27 stops etching for making contact openings of contacts 54. A first interlayer insulating film 28 is then deposited on the liner insulating film 27. Once the first interlayer insulating film 28 is deposited, CMP and then dry etching are carried out so as to planarize the first interlayer insulating film 28, as shown in FIGS. 58A through 58C.

(d) The masking material 23 is then removed by lithography, to form silicide forming regions as shown in FIG. 59C. As shown in FIGS. 59A and 59B, the masking material 23 on the gate electrodes 70 and 71 of the transistors in the respective low-voltage circuit regions 80a, 80b, 80c, and 80d and the high-voltage circuit regions 90a, 90b, 90c, and 90d is not removed. Regions that are to be interconnects and resistors are masked with SiN or the like so that a silicide is not formed therein. As shown in FIG. 60C, metal silicide films 53 are then formed only in the silicide forming regions formed in the gate electrodes. The metal silicide films 53 are formed across the entire surfaces of the respective gate electrodes or part thereof. The metal silicide films may be made of one of various silicides, such as cobalt silicide ($CoSi_2$) and nickel silicide ($NiSi_2$).

(e) As shown in FIGS. 61A through 61C, a barrier insulating film 29 of SiN or the like is then deposited across the entirety of the device. As shown in FIGS. 62A through 62C, a second interlayer insulating film 30 is deposited on the barrier insulating film 29. Contacts 54 for making electrical contact with the gate electrodes and the semiconductor substrate 10, as shown in FIGS. 55A through 55C, are formed by lithography and etching.

According to the nonvolatile semiconductor memory and the fabrication method for the same according to the sixth embodiment, in order to form gate electrodes after formation of the element isolating regions (STI), a second gate insulating film 22 in the low-voltage circuit regions 80a, 80b, 80c, and 80d is formed to be thinner than the tunnel insulating film 20. Making the second gate insulating film 22 thinner than the tunnel insulating film 20 is advantageous in terms of element performance, such as driving capability, thereby contributing to fabrication of higher performance transistors. Furthermore, since a first gate insulating film 21 of the transistors in the high-voltage circuit regions 90a, 90b, 90c, and 90d can be thicker than the tunnel insulating film 20, formation of high withstand voltage transistors is possible at the same time. Moreover, in order to form gate electrodes after formation of the element isolating regions (STI), dual gate peripheral elements can be easily formed by self alignment, even though there is a floating gate in the cell array region.

Furthermore, according to the nonvolatile semiconductor memory and the fabrication method thereof of the sixth embodiment, the metal silicide films 53 included in the control gate electrodes 74 and the select gate electrodes 72 in the memory cell region allows high-speed performance with improved drive capability of the respective transistors, and provides a nonvolatile semiconductor memory capable of low power supply voltage operation. Moreover, formation of low withstand voltage transistors and high withstand voltage transistors is possible.

Other Embodiments

The present invention is described according to the aforementioned embodiments; however, it should not be perceived that descriptions forming part of this disclosure and the drawings are intended to limit the spirit and scope of the present invention. Various alternative embodiments, working examples, and operational techniques will become apparent from this disclosure for those skilled in the art.

Although the gate sidewall insulating films 75 described by FIG. 24C given in the second embodiment, FIG. 40C given in the fourth embodiment, and FIG. 56C given in the sixth embodiment are made to have thin walls, making such thin wall films is not always necessary.

Furthermore, NAND, AND, or NOR type circuit structure may be provided in the nonvolatile semiconductor memory according to the first through the sixth embodiment. Other various modifications are also naturally possible in the fabrication process as well.

The present invention naturally includes various embodiments not described herein. Accordingly, the technical scope of the present invention should be determined only by specified features of the invention according to appended claims that can be regarded as appropriate to this disclosure.

While the present invention has been described according to the first through the sixth embodiment, these embodiments and drawings constituting a part of this disclosure do not limit the scope of the present invention. This disclosure shows those skilled in the art of the present invention a variety of embodiments, alternative embodiments, and operational technologies.

Although the basic element structure of the memory cell transistors of the nonvolatile semiconductor memory according to the first through the sixth embodiment is disclosed as a stacked gate structure, the present invention is not limited thereto, and may naturally adopt a sidewall control gate structure or a MONOS structure. Various modified examples are also naturally possible in the fabrication process as well.

Furthermore, the memory cell transistors of the nonvolatile semiconductor memory according to the first through the sixth embodiment of the present invention is not limited to a two-valued memory. For example, the present invention is applicable to a multi-valued logic memory of three values or more. For example, a four-valued nonvolatile memory can have a memory capacity twice that of the two-valued nonvolatile memory. The present invention is applicable to a multi-valued nonvolatile semiconductor memory of m values (m>3) or more.

In this manner, the present invention naturally includes various embodiments not described herein. Accordingly, the technical scope of the present invention is determined only by specified features of the invention according to appended claims that can be regarded as appropriate to the above-given description.

Needless to say, the present invention includes a variety of embodiments or the like not disclosed herein. Therefore, the technical scope of the present invention should be defined by only inventive descriptions according to the claimed invention, which is appropriate according to the aforementioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear as appropriate to the above explanation. Various modifications will become possible for those skilled in the art after receiving the teachings of the present disclosure without departing from the scope thereof.

What is claimed is:

1. A nonvolatile semiconductor memory comprising:
    a cell array region comprising aligned memory cell transistors, each of the memory cell transistors including a control gate electrode, which includes a first metal silicide film, an inter-gate insulating film under the control gate electrode, a floating gate electrode under the inter-gate insulating film, and a tunnel insulating film under the floating gate electrode;
    a high-voltage circuit region arranged in a periphery of the cell array region that includes a high voltage transistor, the high voltage transistor includes a first gate electrode and a first gate insulating film below the first gate electrode and thicker than the tunnel insulating film;
    a low-voltage circuit region arranged in a different position than the high-voltage circuit region arranged in the periphery of the cell array region and that includes a low-voltage transistor, the low voltage transistor includes a second gate electrode and a second gate insulating film below the second gate electrode and thinner than the first gate insulating film;
    the tunnel insulating film being directly provided on source regions and drain regions of respective memory cell transistors;
    a first interlayer insulating film deployed on the tunnel insulating film and buried between the memory cell transistors;
    a liner insulating film directly provided on sequential source regions and drain regions and over the gate electrodes of the high-voltage transistor and the low-voltage transistor;
    a second interlayer insulating film deployed on the liner insulating film;
    an inter-gate embedding insulator film embedded in between the control gate electrodes of the memory cell transistors; and
    a barrier insulating film formed over the gate electrodes in contact with tops of the memory cell transistors, the high-voltage transistor, the low-voltage transistor, an upper surface of the first interlayer insulating film and an upper surface of the inter-gate embedding insulator film.

2. The nonvolatile semiconductor memory of claim 1, wherein each gate electrode of the respective high-voltage transistors includes a second metal silicide film, and each gate electrode of the respective low-voltage transistors includes a third metal silicide film.

3. The nonvolatile semiconductor memory of claim 1, wherein each gate electrode of the respective high-voltage transistors includes a masking material, and each gate electrode of the respective low-voltage transistors includes a third metal silicide film.

4. The nonvolatile semiconductor memory of claim 1, wherein each gate electrode of the respective high-voltage transistors and the respective low-voltage transistors includes a masking material.

5. The nonvolatile semiconductor memory of claim 1, wherein the second gate insulating film is thinner than the tunnel insulating film.

6. The nonvolatile semiconductor memory of claim 1, wherein the liner insulating film is a nitride film.

7. The nonvolatile semiconductor memory of claim 1, wherein the first metal silicide film is one of cobalt silicide and nickel silicide.

8. The nonvolatile semiconductor memory of claim 2, wherein the second and the third metal silicide film are one of cobalt silicide arid nickel silicide.

9. The nonvolatile semiconductor memory of claim 3, wherein the third metal silicide film is one of cobalt silicide and nickel silicide.

10. The nonvolatile semiconductor memory of claim 1, wherein the barrier insulating film is a nitride film.

11. A nonvolatile semiconductor memory comprising:
    a cell array region comprising aligned memory cell transistors, each of the memory cell transistors including a control gate electrode, which includes a first metal silicide film, an inter-gate insulating film under the control gate electrode, a floating gate electrode under the inter-gate insulating film, and a tunnel insulating film under the floating gate electrode;
    a high-voltage circuit region arranged in a periphery of the cell array region that includes a high voltage transistor, the high voltage transistor includes a first gate electrode having the same material as the control gate electrode and a first gate insulating film below the first gate electrode and thicker than the tunnel insulating film;
    a low-voltage circuit region arranged in a different position than the high-voltage circuit region arranged in the periphery of the cell array region and that includes a low-voltage transistor, the low voltage transistor includes a second gate electrode having the same material as the control gate electrode and having a metal silicide film on top of the second gate electrode and a second gate insulating film below the second gate electrode and thinner than the first gate insulating film;

the tunnel insulating film being directly provided on source regions and drain regions of respective memory cell transistors;

a first interlayer insulating film deployed on the tunnel insulating film and buried between the memory cell transistors;

a liner insulating film directly provided on sequential source regions and drain regions and the gate electrodes of the high-voltage transistor and the low-voltage transistor;

a second interlayer insulating film deployed on the liner insulating film;

an inter-gate embedding insulator film deposited and embedded in between the control gate electrodes of the memory cell transistors; and a barrier insulating film formed on source and drain regions in contact with tops of the memory cell transistors, the high-voltage transistor, the low-voltage transistor, an upper surface of the first interlayer insulating film and an upper surface of the inter-gate embedding insulator film.

12. The nonvolatile semiconductor memory of claim 11, wherein the first gate electrode comprises a metal silicide film facing to the barrier insulating film on top of the first gate electrode.

13. The nonvolatile semiconductor memory of claim 1, wherein the first interlayer insulating film is deployed on a side surface of the first and second gate electrodes; and the liner insulating film is contacted with the first interlayer insulating film in the high-voltage circuit region and the low-voltage circuit region.

* * * * *